(12) United States Patent
Misaki

(10) Patent No.: US 10,819,006 B2
(45) Date of Patent: Oct. 27, 2020

(54) TFT SUBSTRATE, SCANNED ANTENNA HAVING TFT SUBSTRATE, AND METHOD FOR MANUFACTURING TFT SUBSTRATE

(71) Applicant: SHARP KABUSHIKI KAISHA, Sakai, Osaka (JP)

(72) Inventor: Katsunori Misaki, Yonago (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/259,803

(22) Filed: Jan. 28, 2019

(65) Prior Publication Data

US 2019/0237849 A1 Aug. 1, 2019

(30) Foreign Application Priority Data

Jan. 30, 2018 (JP) .................................. 2018-013951

(51) Int. Cl.
*H01Q 1/22* (2006.01)
*H01L 27/12* (2006.01)
*H01L 23/66* (2006.01)

(52) U.S. Cl.
CPC ........... *H01Q 1/2283* (2013.01); *H01L 23/66* (2013.01); *H01L 27/124* (2013.01);
(Continued)

(58) Field of Classification Search
CPC ... H01Q 1/2283; H01L 23/66; H01L 27/1218; H01L 27/124; H01L 27/127; H01L 27/1288
See application file for complete search history.

(56) References Cited

U.S. PATENT DOCUMENTS 7,466,269 B2 12/2008 Haziza
7,847,894 B2 12/2010 Rho
(Continued)

FOREIGN PATENT DOCUMENTS

JP 2002-217640 A 8/2002
JP 2007-116573 A 5/2007
(Continued)

OTHER PUBLICATIONS

R. A. Stevenson et al., "Rethinking Wireless Communications: Advanced Antenna Design using LCD Technology", SID 2015 Digest, pp. 827-830.
(Continued)

*Primary Examiner* — Dale E Page
*Assistant Examiner* — Quovaunda Jefferson
(74) *Attorney, Agent, or Firm* — ScienBiziP, P.C.

(57) ABSTRACT

A TFT substrate has a semiconductor layer, a gate metal layer including a gate electrode, a gate insulating layer, a source metal layer including a source electrode and a drain electrode, and a contact layer including a source contact portion and a drain contact portion. The source metal layer has a laminated structure including a lower source metal layer and an upper source metal layer, and an edge of the lower source metal layer is positioned inside an edge of the upper source metal layer. At least a portion, which does not overlap the source contact portion or the drain contact portion in the edge of the lower source metal layer and the edge of the upper source metal layer in the plurality of antenna unit regions when viewed in a direction normal to the dielectric substrate, is covered with at least two inorganic layers.

19 Claims, 33 Drawing Sheets

(52) U.S. Cl.
CPC ........ *H01L 27/127* (2013.01); *H01L 27/1218* (2013.01); *H01L 27/1288* (2013.01); *H01L 2223/6677* (2013.01)

(56) References Cited

U.S. PATENT DOCUMENTS

| | | |
|---|---|---|
| 2012/0092577 A1 | 4/2012 | Shi et al. |
| 2012/0138922 A1 | 6/2012 | Yamazaki et al. |
| 2012/0194399 A1 | 8/2012 | Bily et al. |
| 2013/0320334 A1 | 12/2013 | Yamazaki et al. |
| 2014/0021475 A1* | 1/2014 | Moon .................. H01L 29/786 257/59 |
| 2014/0286076 A1 | 9/2014 | Aoki et al. |

FOREIGN PATENT DOCUMENTS

| | | |
|---|---|---|
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |

OTHER PUBLICATIONS

M. Ando et al., "A Radial Line Slot Antenna for 12GHz Satellite TV Reception", IEEE Transactions on Antennas and Propagation, vol. AP-33, No. 12, pp. 1347-1353 (1985).

M. Wittek et al., "Liquid Crystals for Smart Antennas and Other Microwave Applications", SID 2015 Digestpp. 824-826.

Kuki, "New Functional Element Using Liquid Crystal" Polymer, vol. 55, August issue, pp. 599-602 (2006) (A concise explanation of the relevance can be found in paragraph [0027] of the specification of the subject application).

Co-pending letter regarding a related co-pending U.S. Appl. No. 15/542,488, filed Jul. 10, 2017.

* cited by examiner

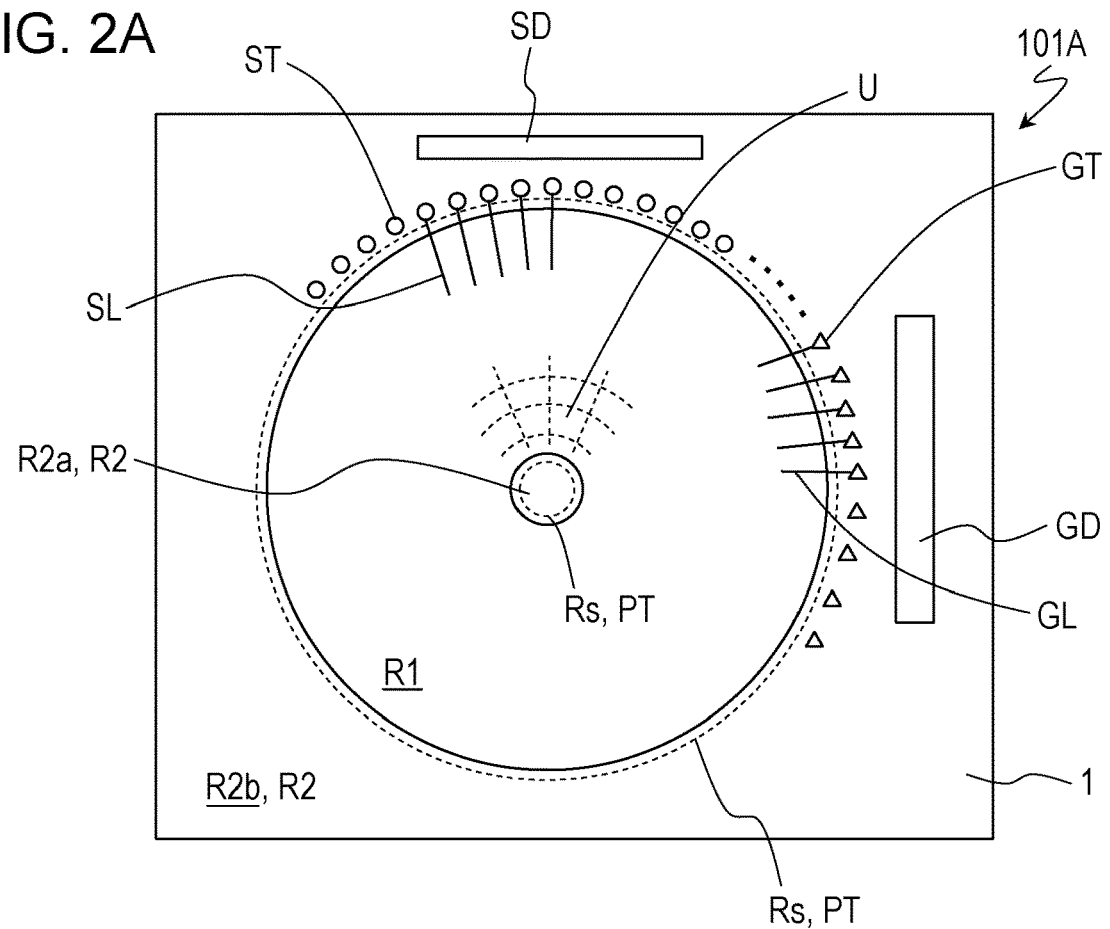
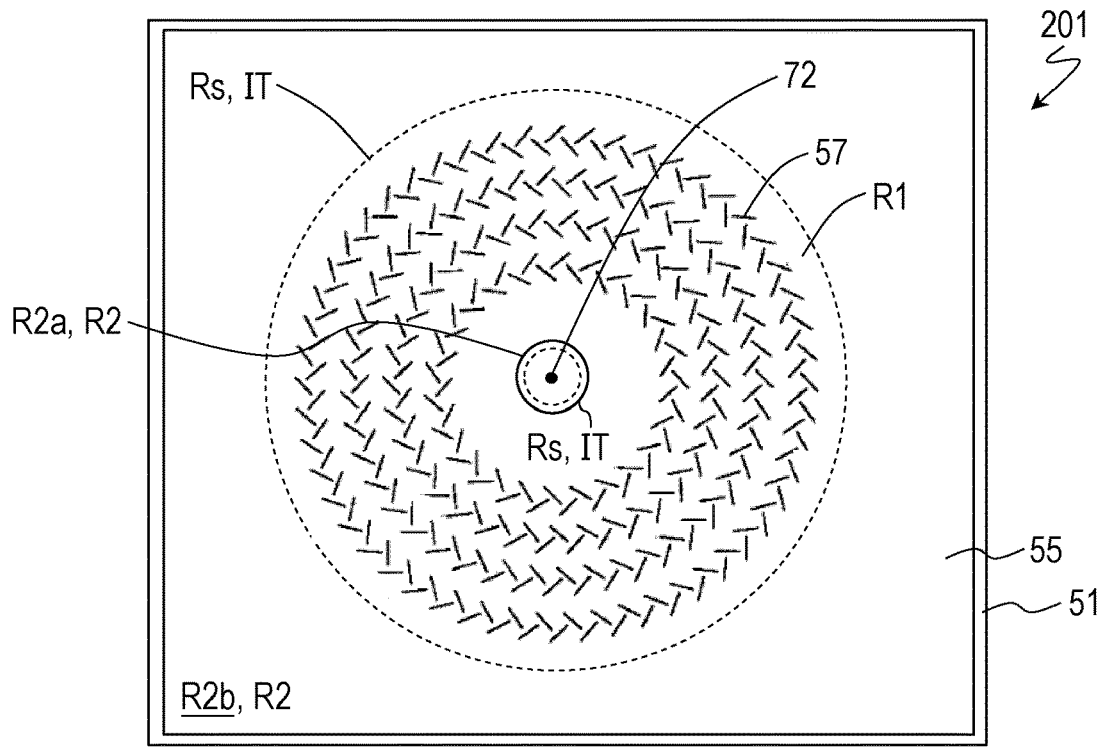

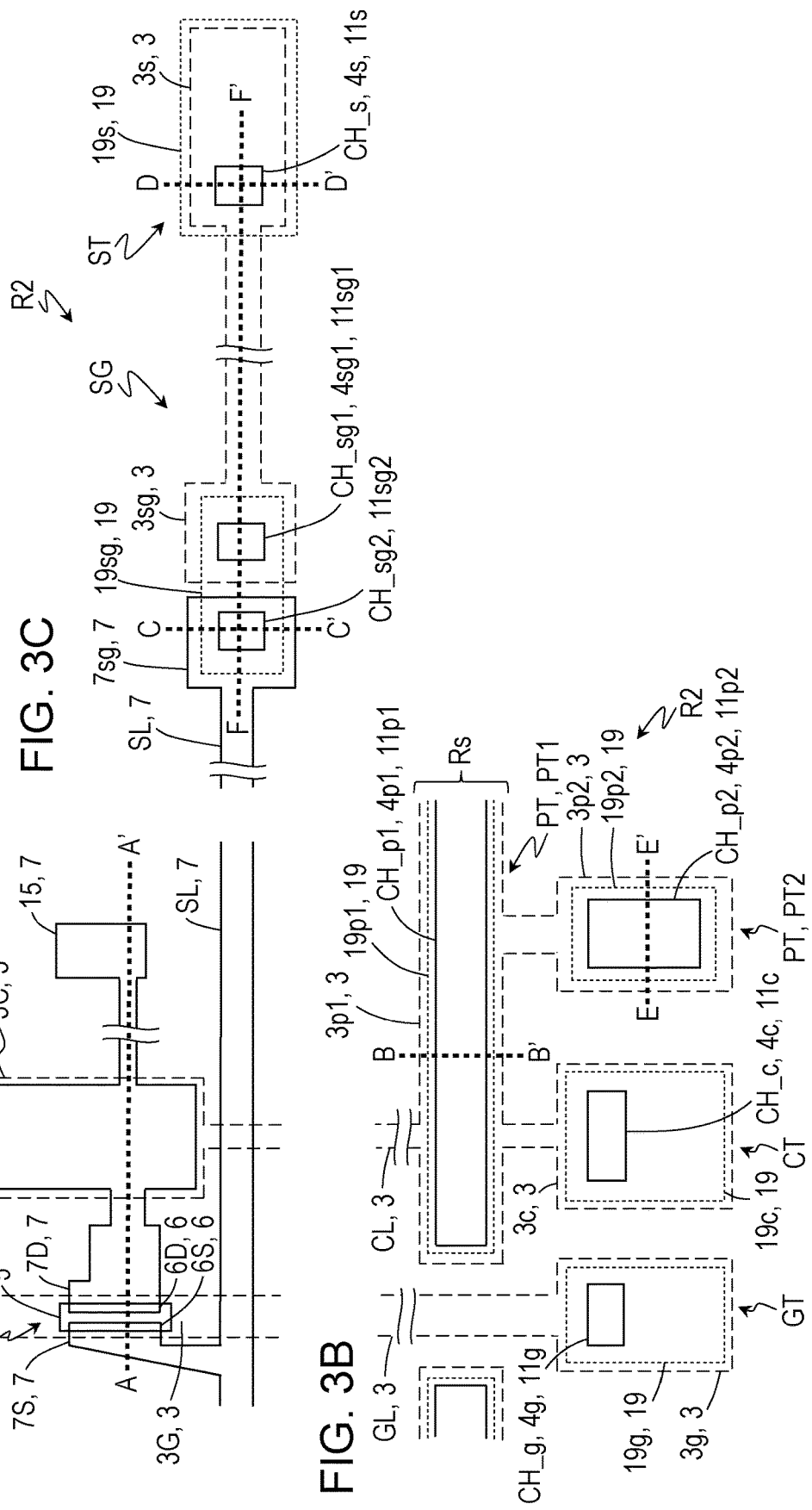

A-A' CROSS-SECTION

B-B' CROSS-SECTION

C-C' CROSS-SECTION

D-D' CROSS-SECTION

E-E' CROSS-SECTION

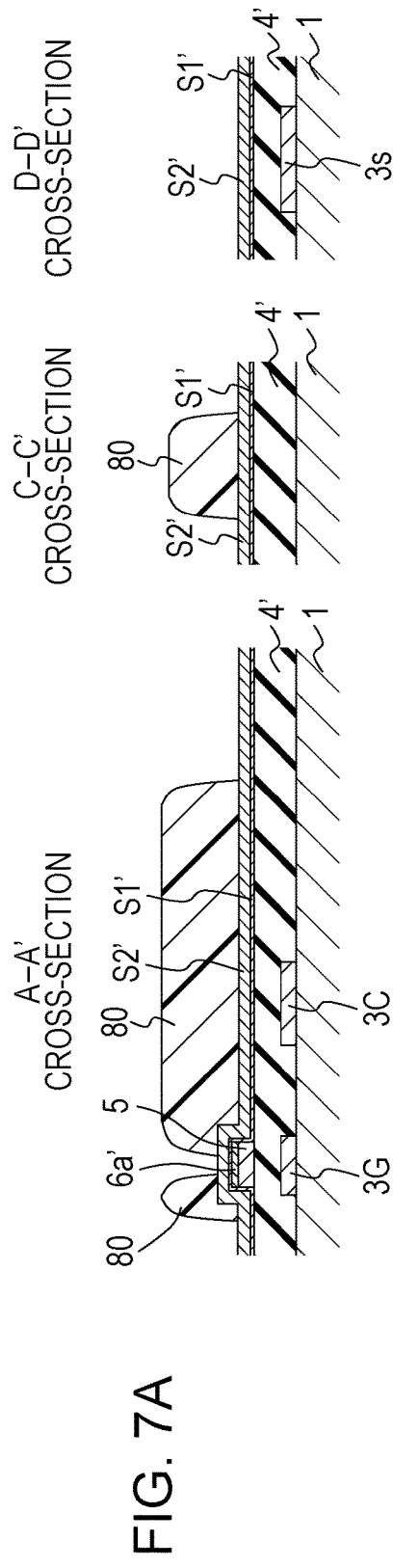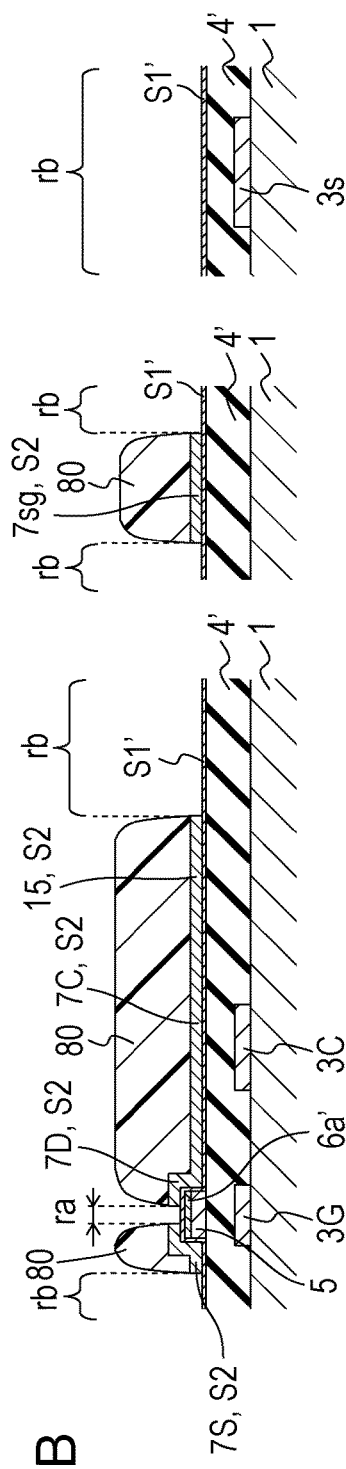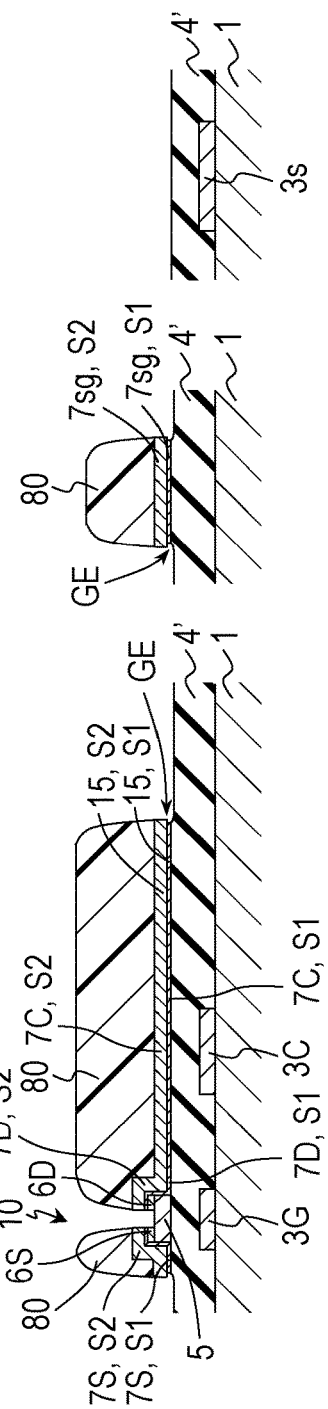

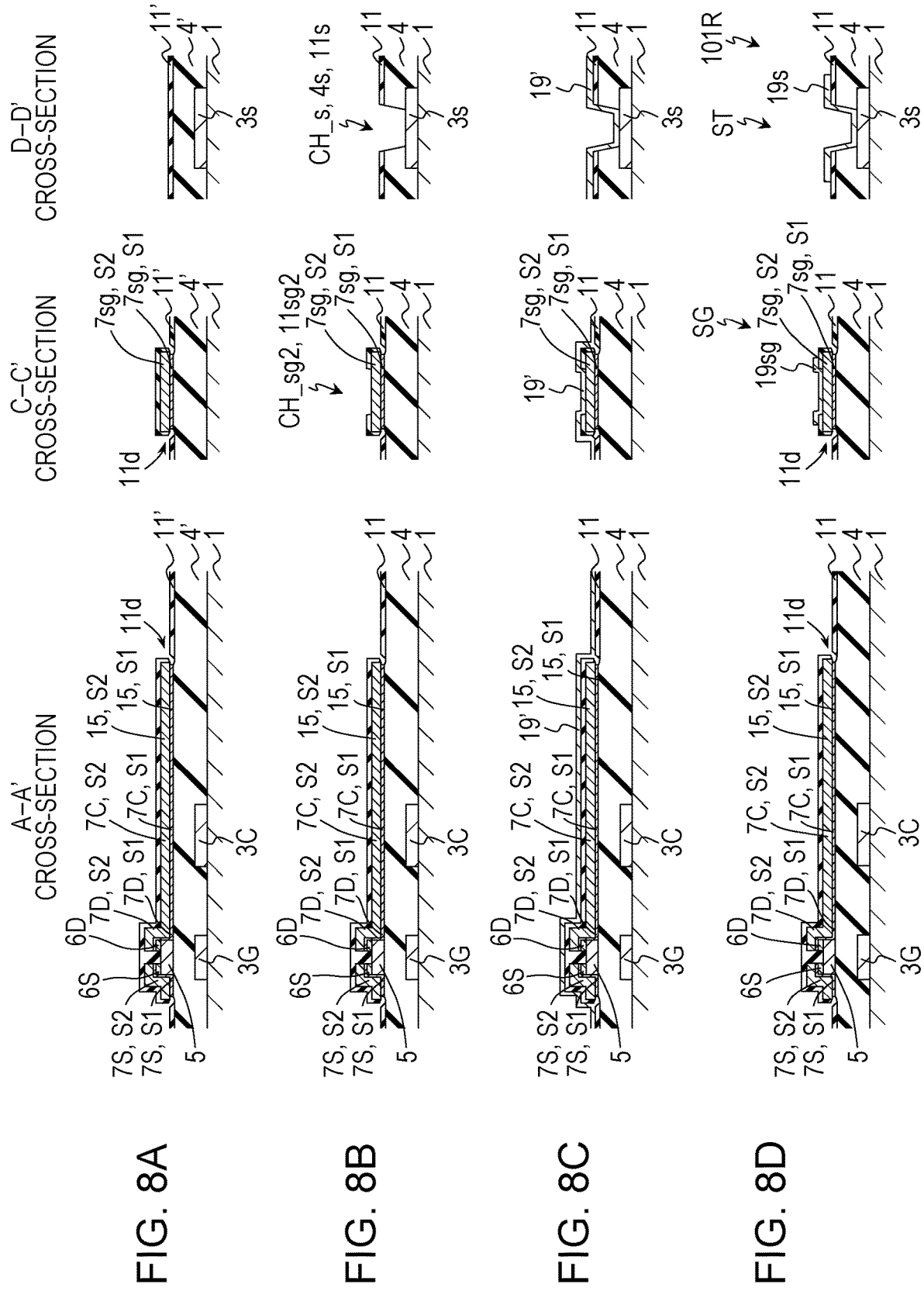

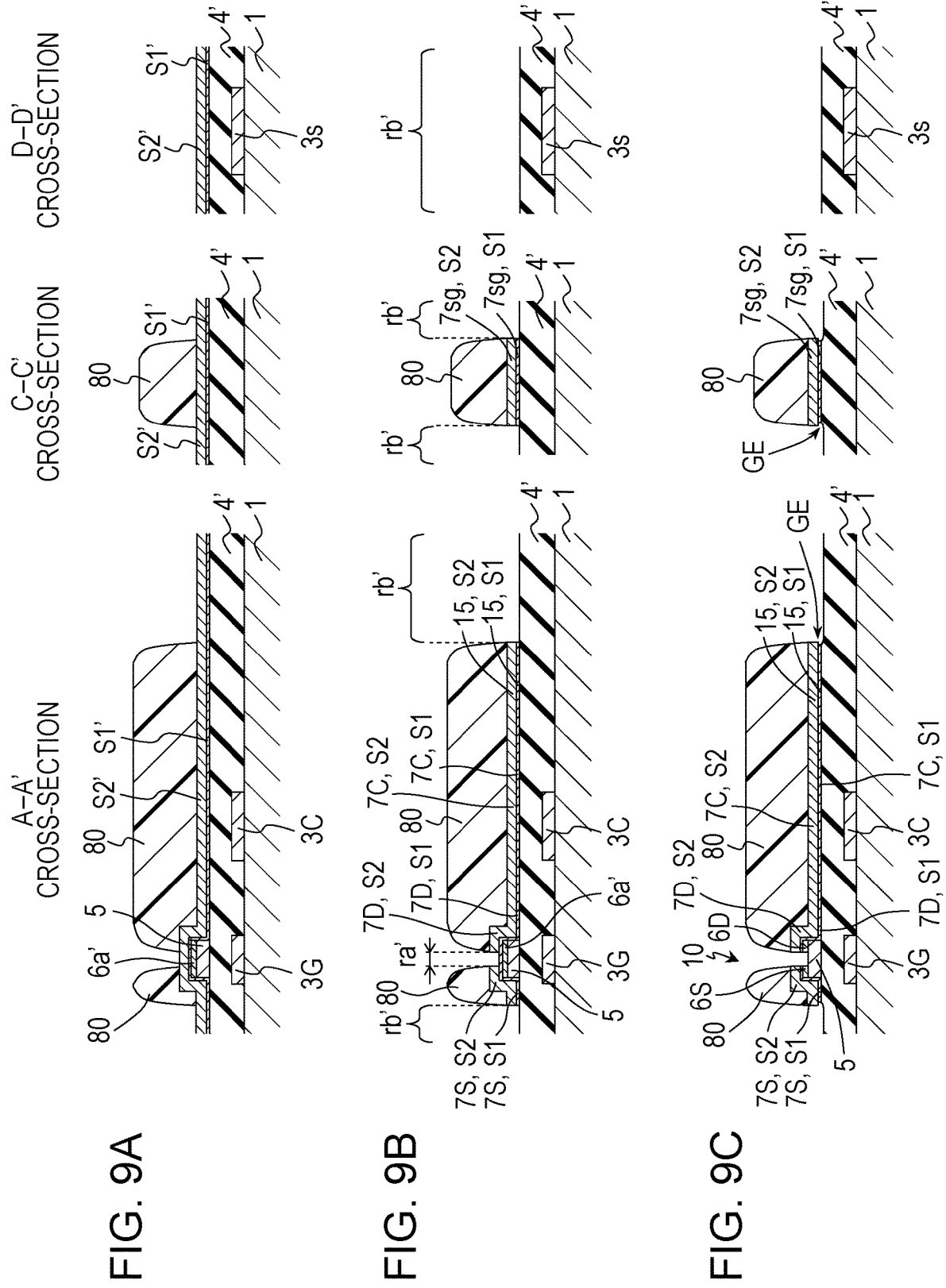

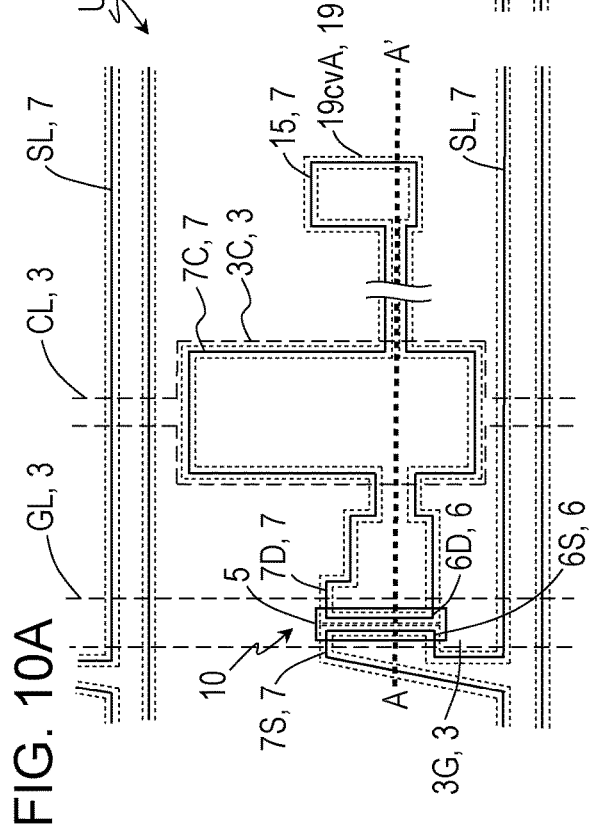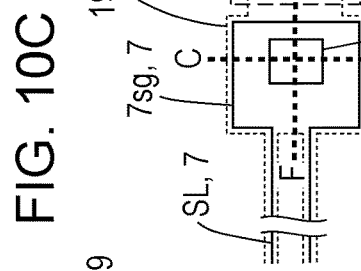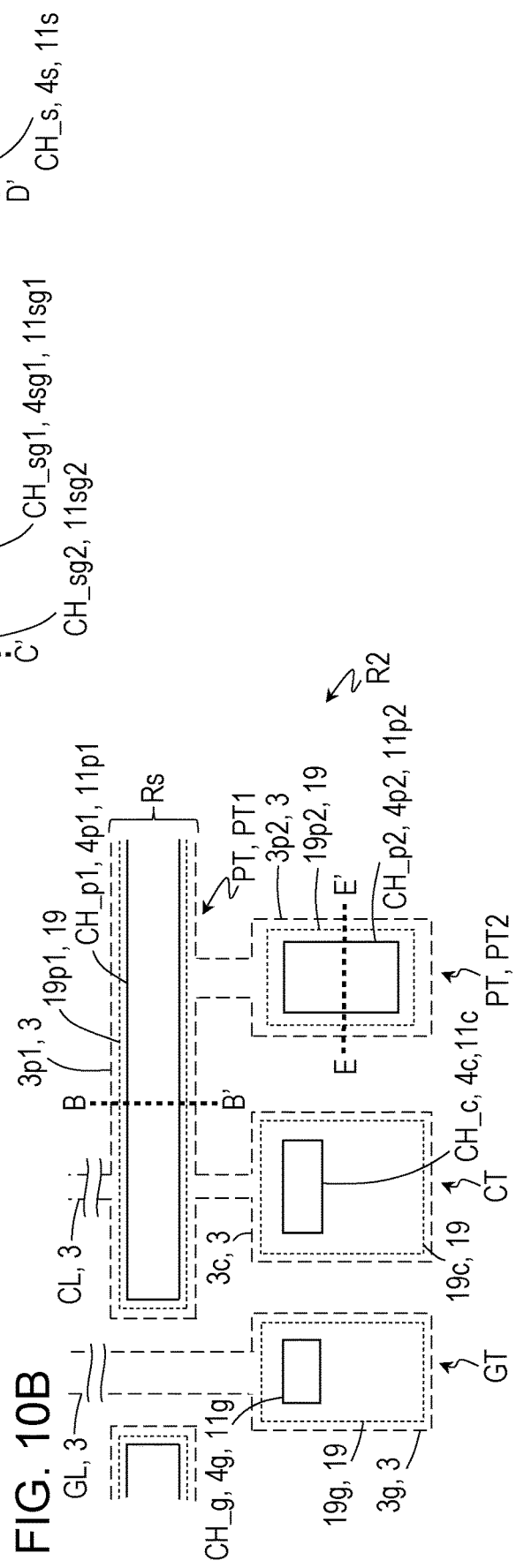

A-A' CROSS-SECTION

B-B' CROSS-SECTION

C-C' CROSS-SECTION

D-D' CROSS-SECTION

E-E' CROSS-SECTION

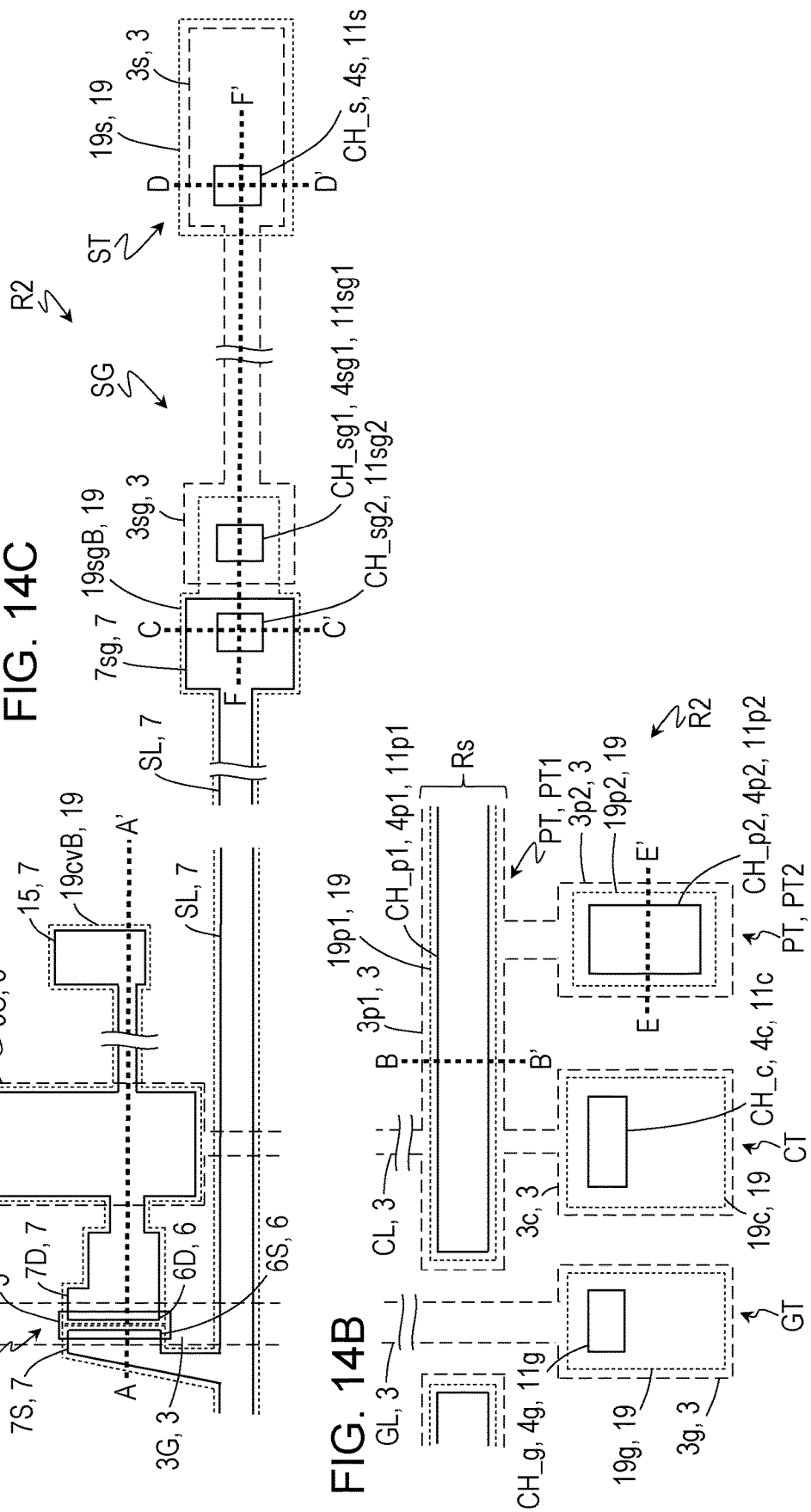

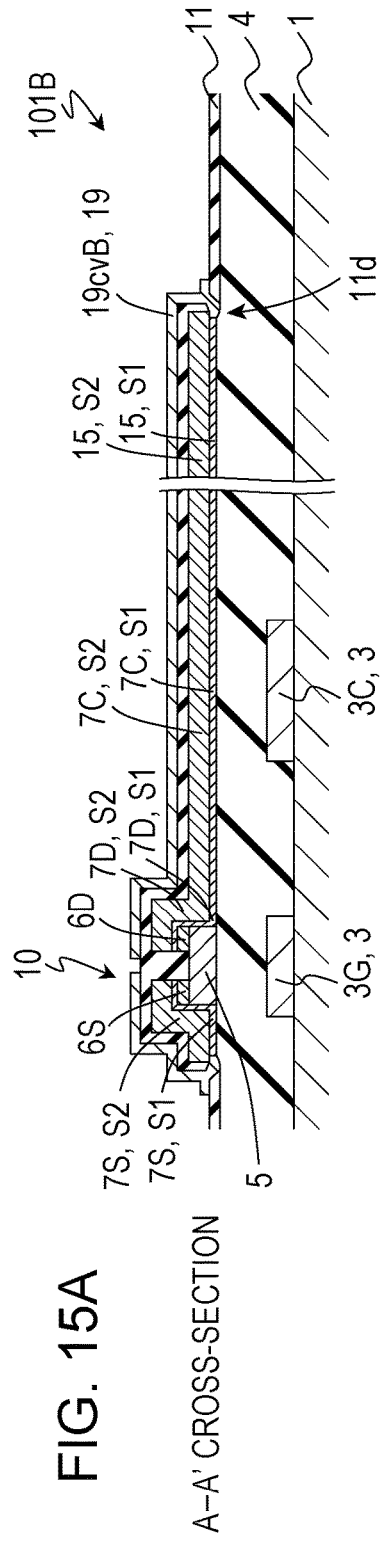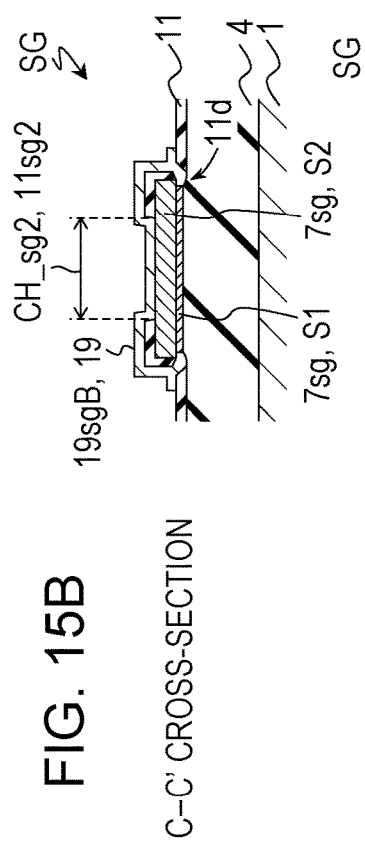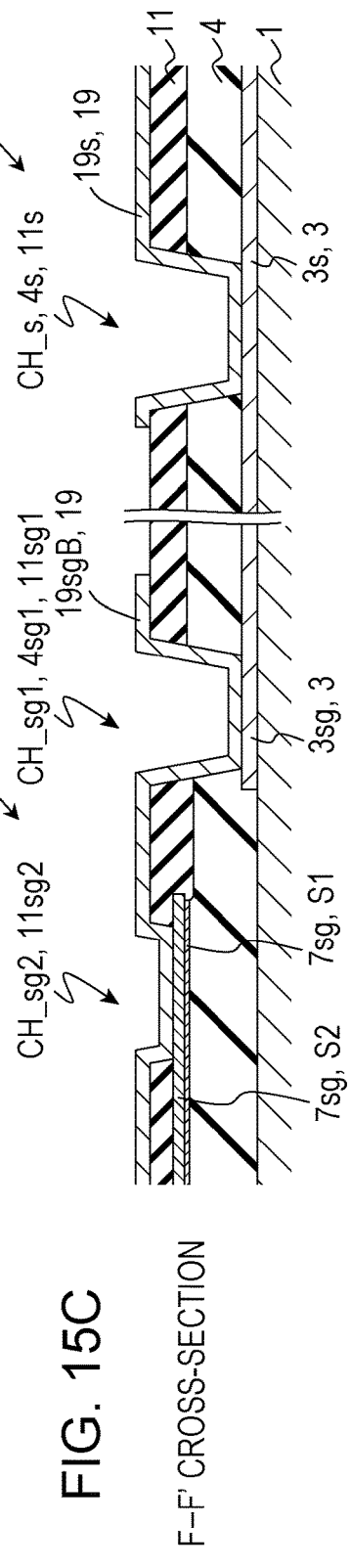

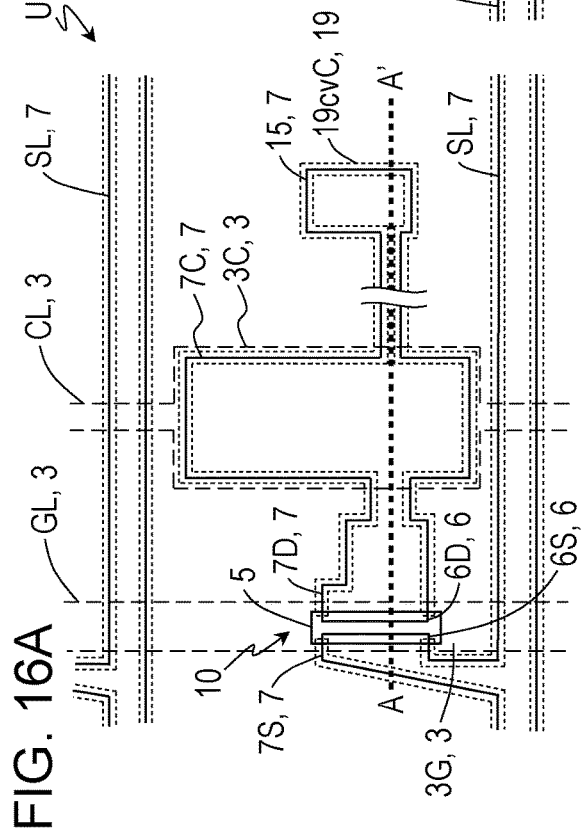
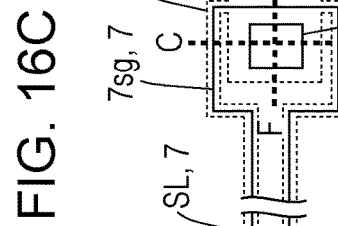
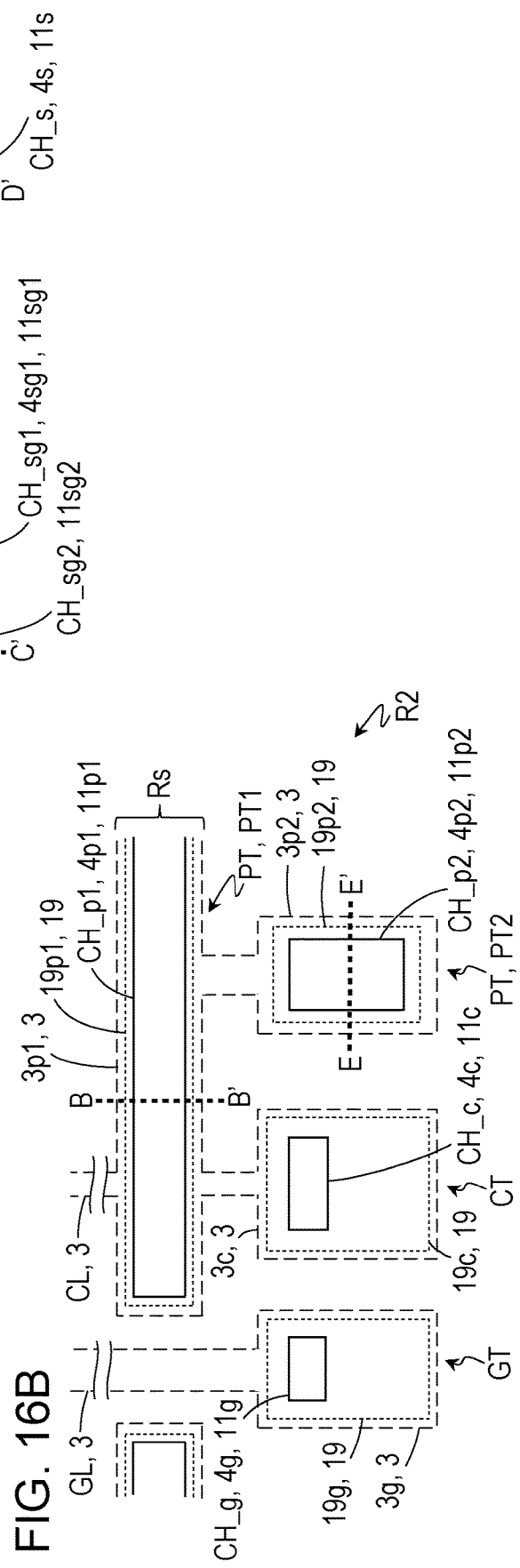
FIG. 16A
FIG. 16B
FIG. 16C

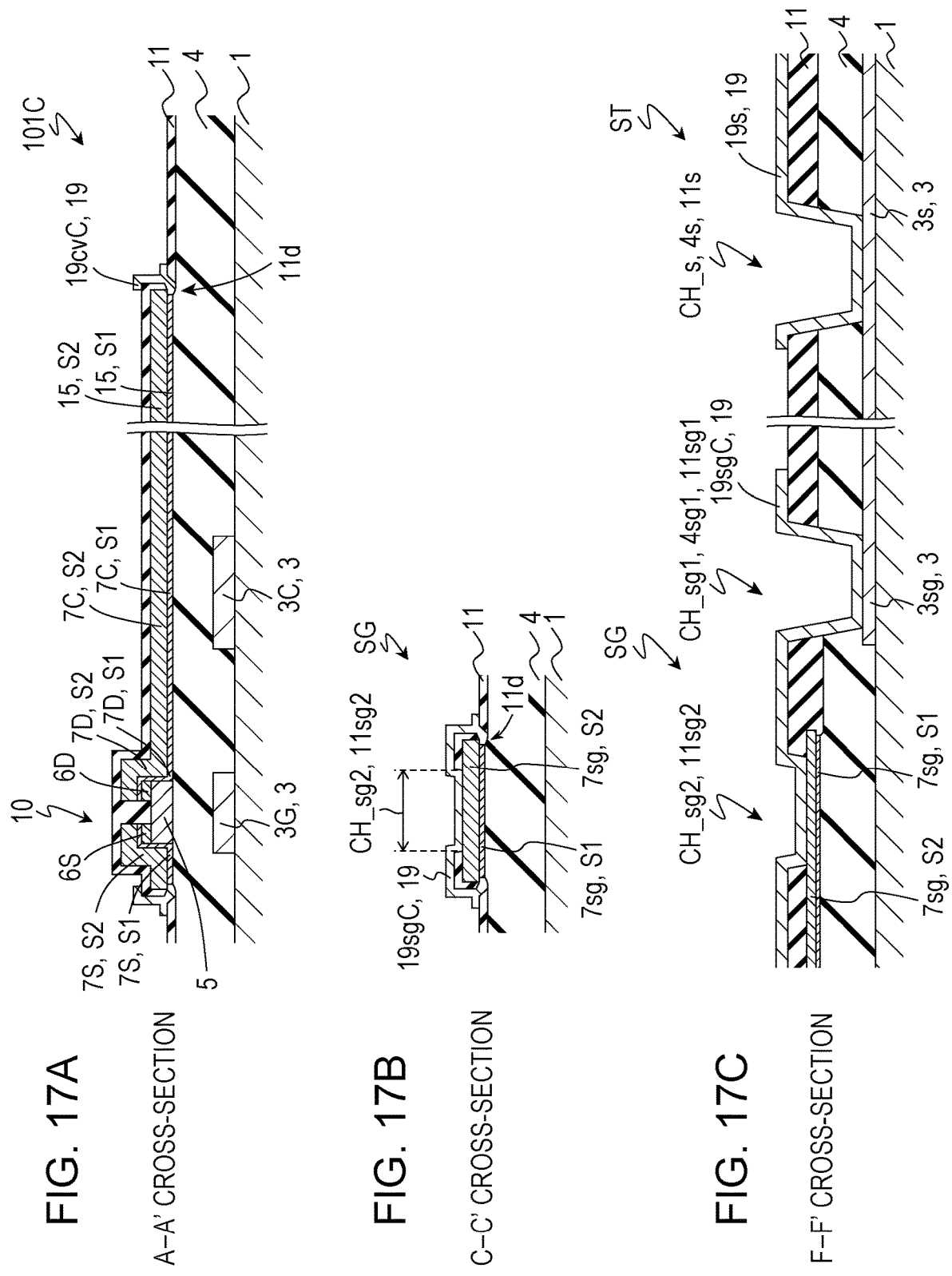

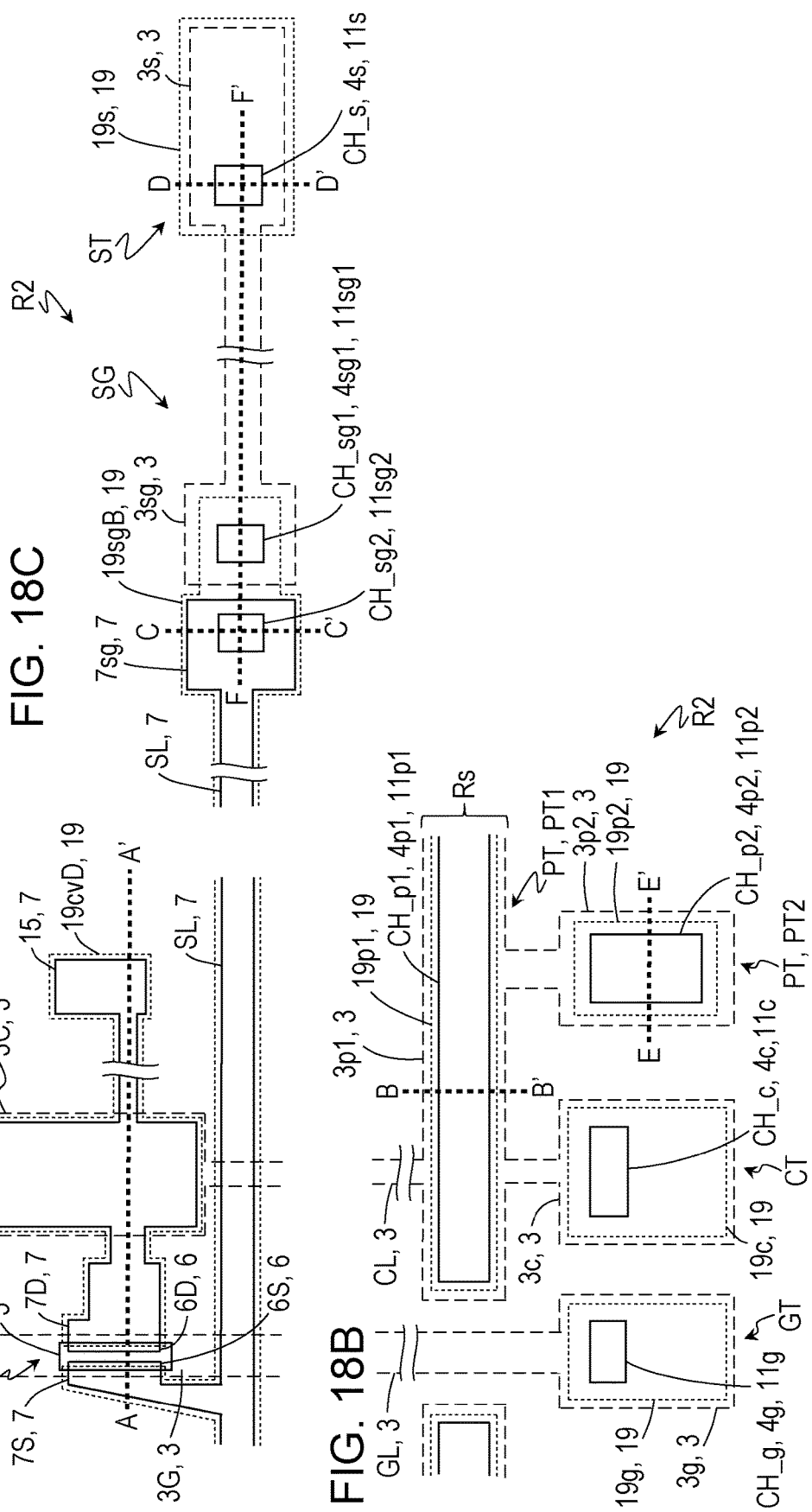

A-A' CROSS-SECTION

B-B' CROSS-SECTION

C-C' CROSS-SECTION

D-D' CROSS-SECTION

E-E' CROSS-SECTION

F-F' CROSS-SECTION

G-G' CROSS-SECTION

H-H' CROSS-SECTION

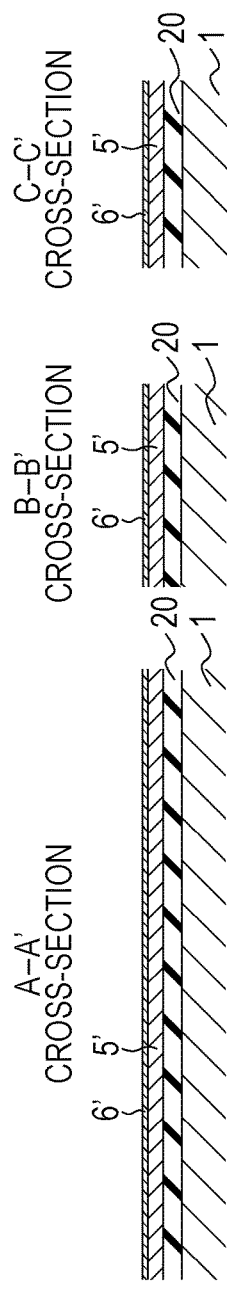
FIG. 24A
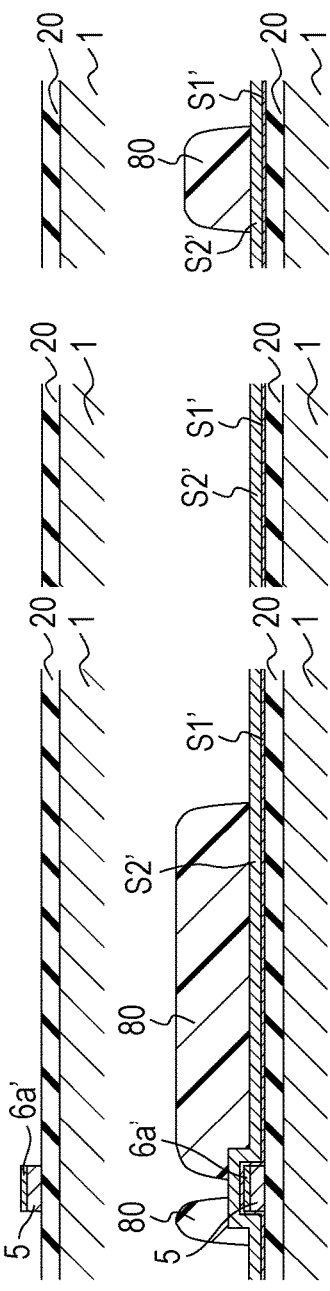
FIG. 24B
FIG. 24C
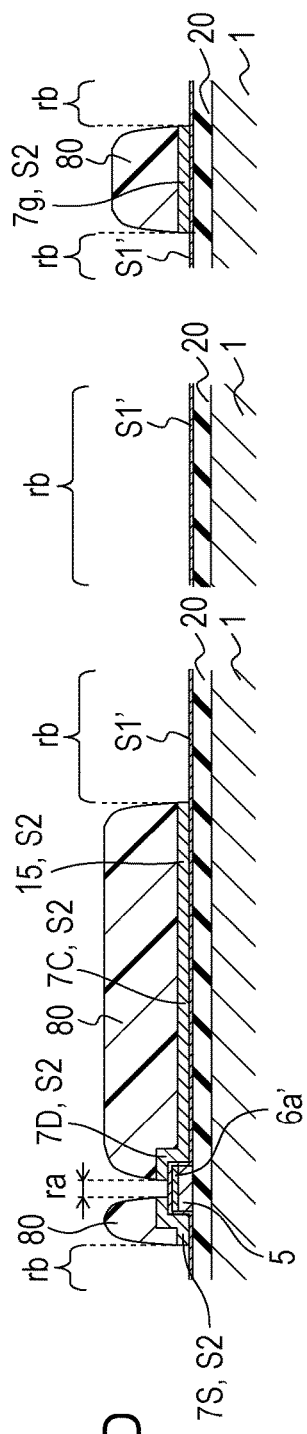
FIG. 24D
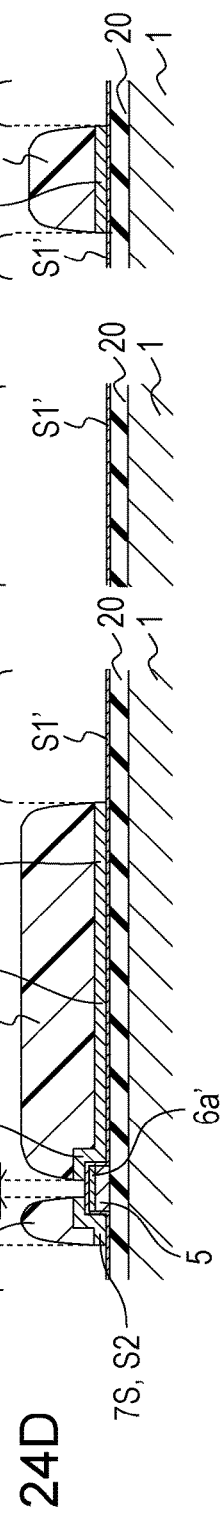
FIG. 24E
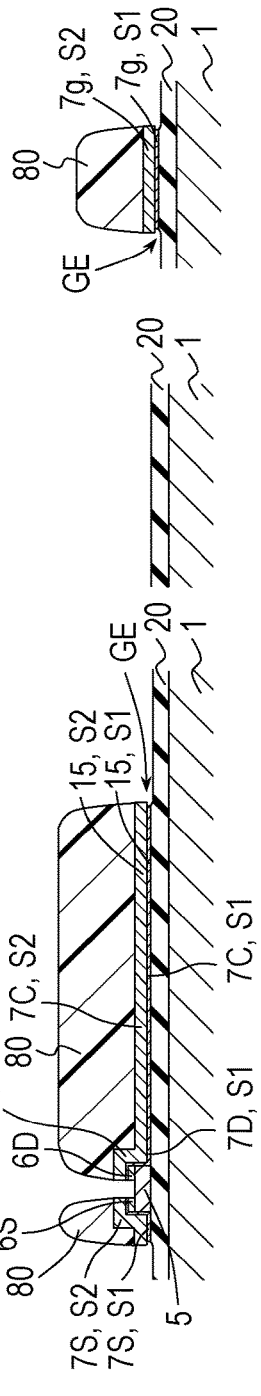

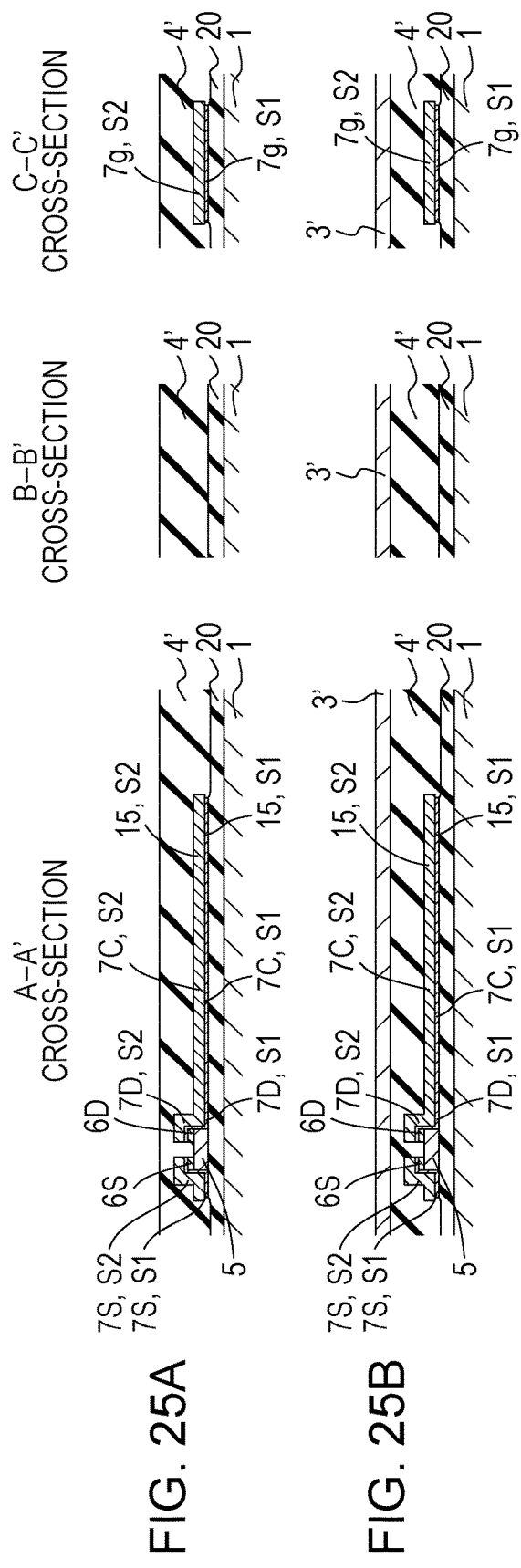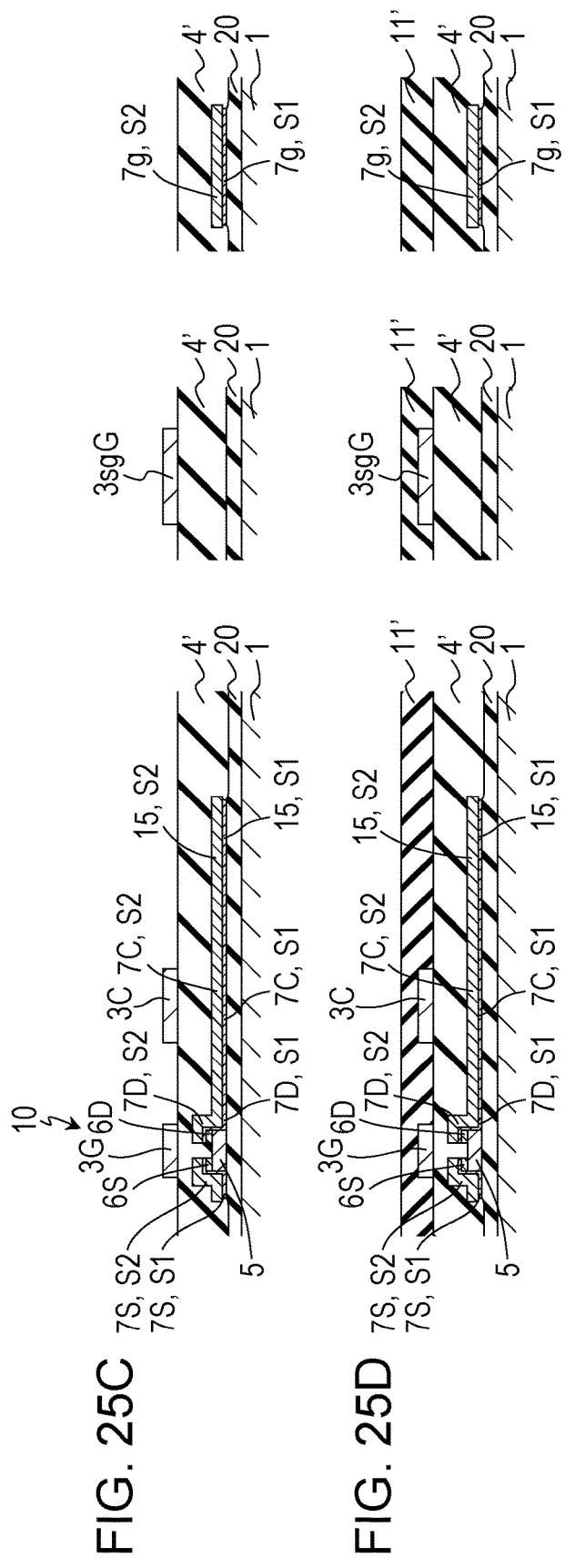

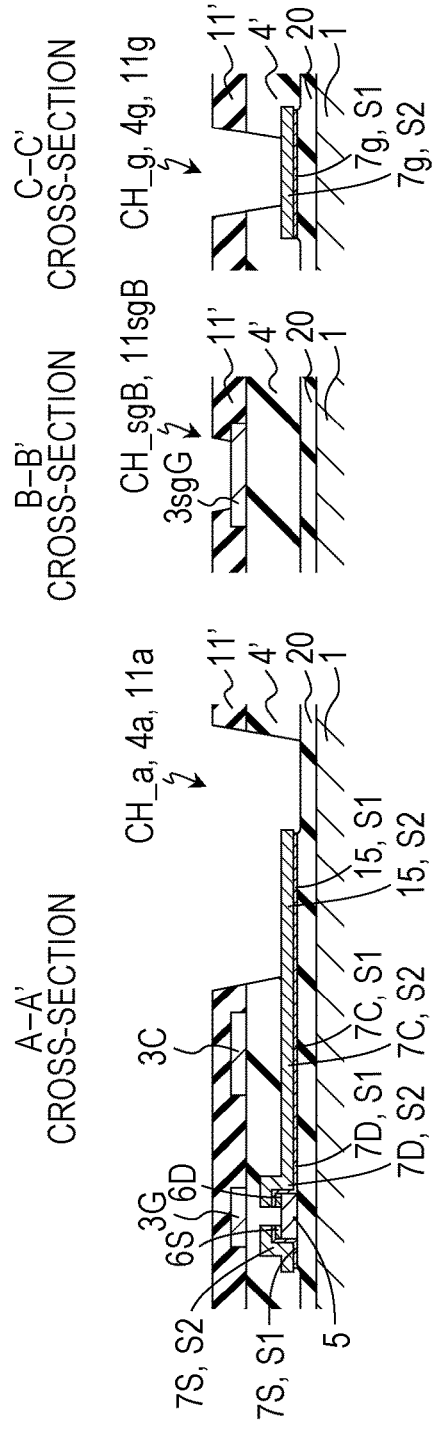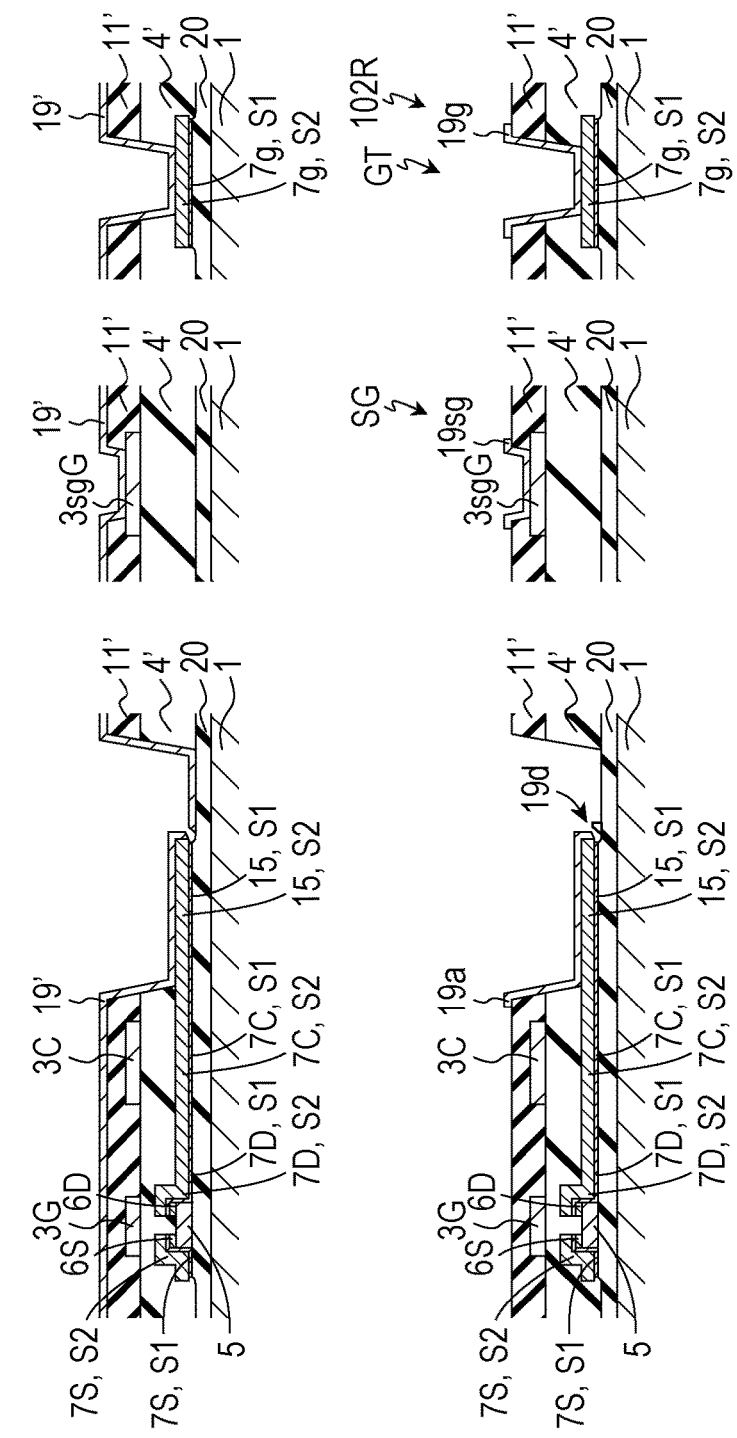
FIG. 26A
FIG. 26B
FIG. 26C

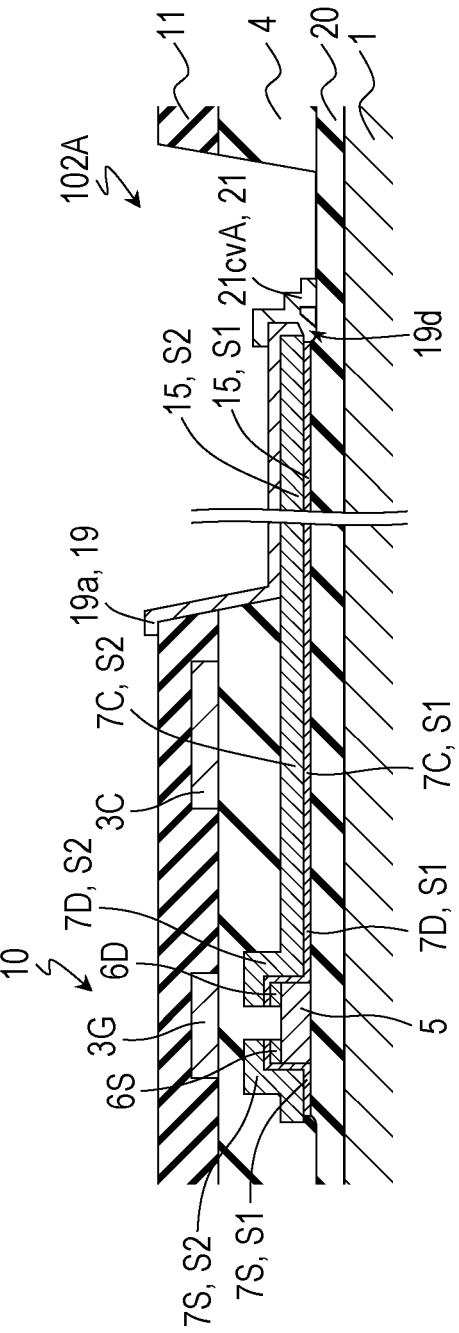

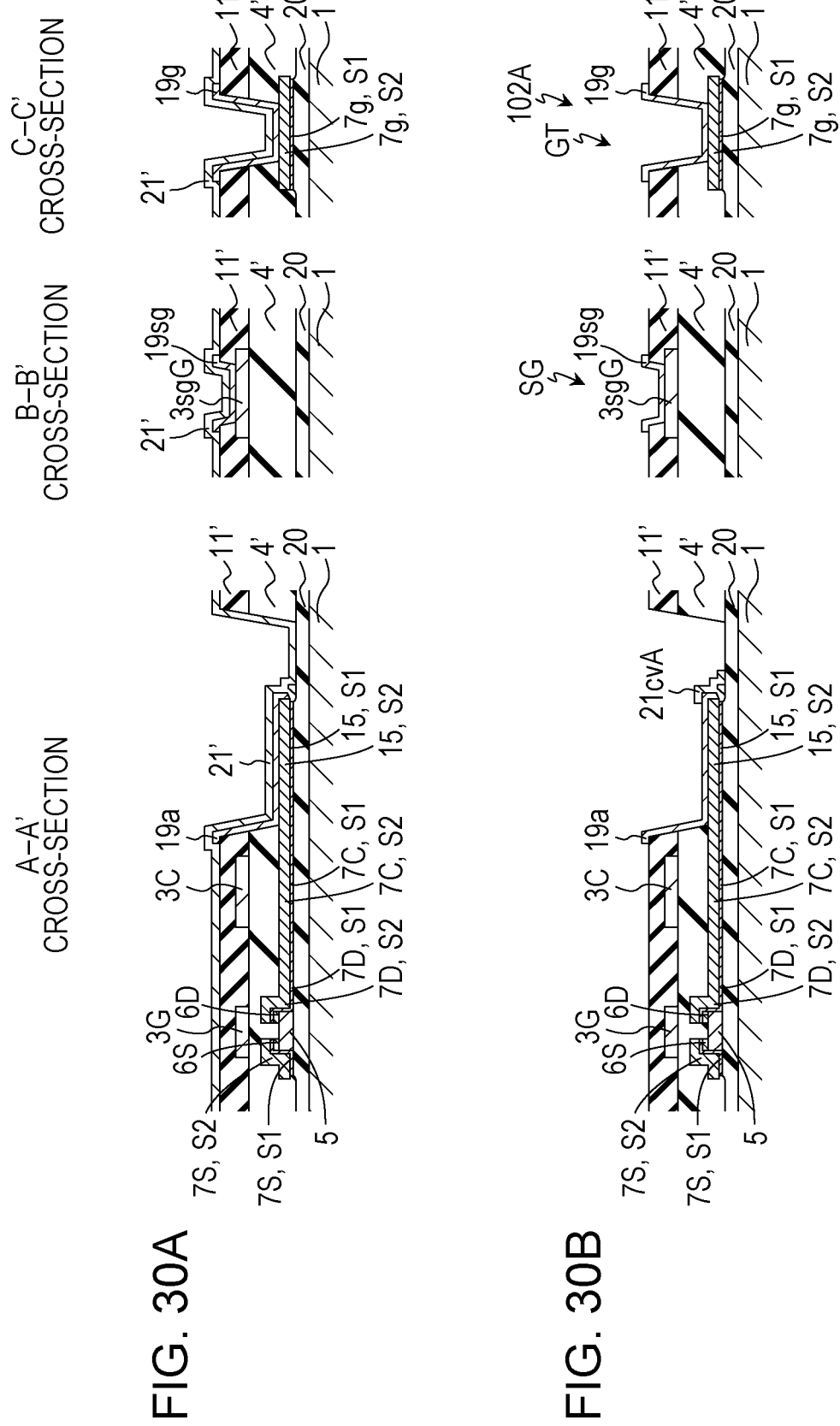

FIG. 31A
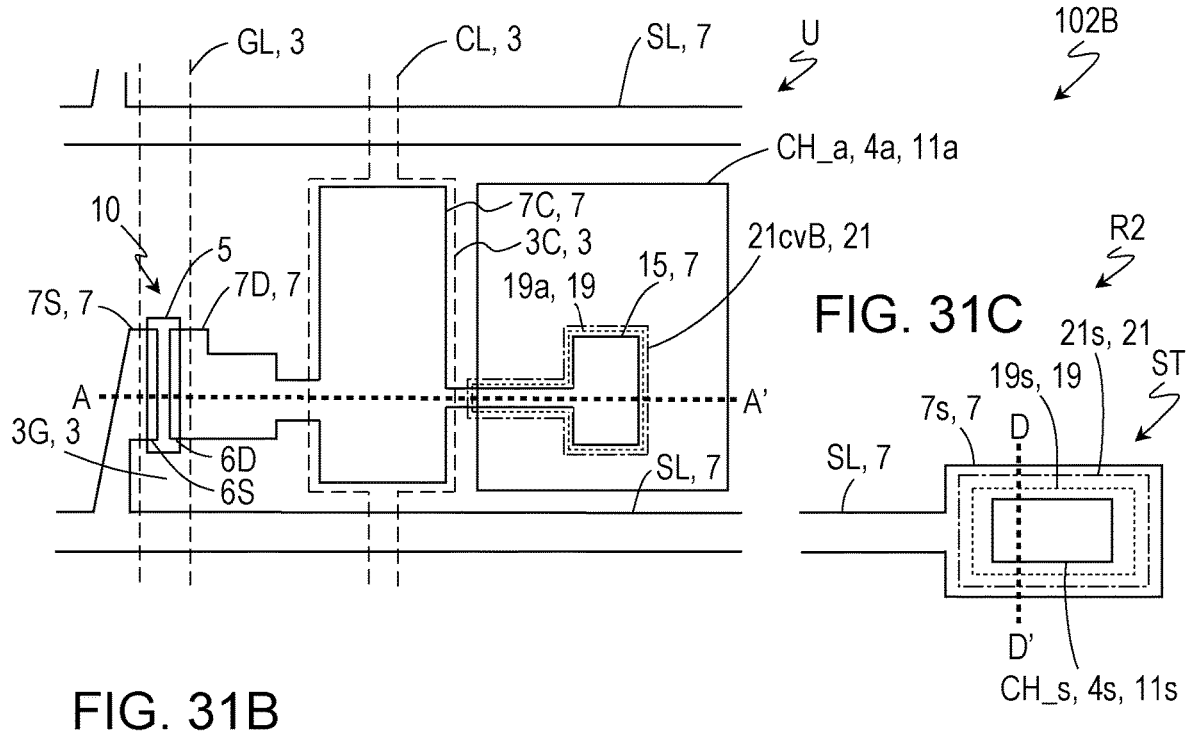
FIG. 31C
FIG. 31B
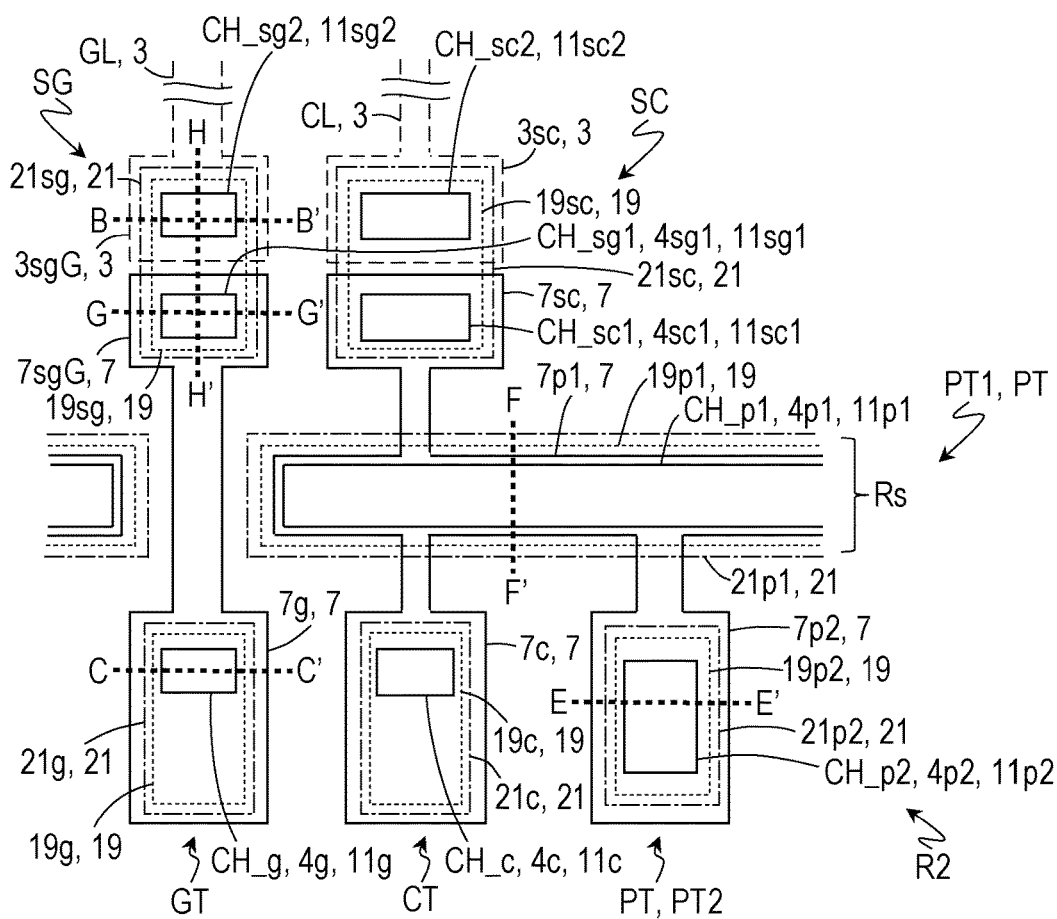

A-A' CROSS-SECTION

B-B' CROSS-SECTION

C-C' CROSS-SECTION

D-D' CROSS-SECTION

E-E' CROSS-SECTION

F-F' CROSS-SECTION

G-G' CROSS-SECTION

H-H' CROSS-SECTION

TFT SUBSTRATE, SCANNED ANTENNA HAVING TFT SUBSTRATE, AND METHOD FOR MANUFACTURING TFT SUBSTRATE

BACKGROUND

1. Field

The present disclosure relates to a scanning antenna, in particular, to a scanning antenna (also referred to as a "liquid crystal array antenna") in which an antenna unit (also referred to as an "element antenna") has a liquid crystal capacity, a TFT substrate to be used in such a scanning antenna, and a method of manufacturing such a TFT substrate.

2. Description of the Related Art

Antennas for mobile communication and satellite broadcasting have a function of being able to change beam direction (referred to as "beam scanning" or "beam steering"). A phased array antenna provided with an antenna unit is known as an antenna having such a function (referred to below as a "scanning antenna"). However, the phased array antenna of the related art is expensive, which is an obstacle to widespread use as a consumer product. In particular, as the number of antenna units increases, the cost rises remarkably.

Therefore, scanning antennas using the high dielectric anisotropy (birefringence) of a liquid crystal material (including a nematic liquid crystal and a polymer-dispersed liquid crystal) have been proposed (Japanese Unexamined Patent Application Publication No. 2007-116573, Japanese Unexamined Patent Application Publication No. 2007-295044, Japanese Unexamined Patent Application Publication (Translation of PCT Application) No. 2009-538565, Japanese Unexamined Patent Application Publication (Translation of PCT Application) No. 2013-539949, and International Publication No. 2015/126550 and R. A. Stevenson et al., "Rethinking Wireless Communications: Advanced Antenna Design using LCD Technology", SID 2015 DIGEST, pp. 827-830). Since the dielectric constant of the liquid crystal material has frequency variance, in the present specification, the dielectric constant in the frequency band of microwaves (also referred to as "dielectric constant with respect to microwaves") is denoted as the "dielectric constant M (CM)" in particular.

Japanese Unexamined Patent Application Publication (Translation of PCT Application) No. 2009-538565 and R. A. Stevenson et al., "Rethinking Wireless Communications: Advanced Antenna Design using LCD Technology", SID 2015 DIGEST, pp. 827-830 state that it is possible to obtain an inexpensive scanning antenna by using liquid crystal display device (referred to below as "LCD") technology.

The present applicant has developed a scanning antenna which is able to be mass-produced using the manufacturing techniques of LCD of the related art. International Publication No. 2017/061527 by the present applicant discloses a scanning antenna which is able to be mass-produced using the manufacturing techniques of LCD of the related art, a TFT substrate to be used for such a scanning antenna, and a manufacturing method and a driving method for such a scanning antenna. All of the disclosure of International Publication No. 2017/061527 is incorporated in the present specification by reference.

During the course of studying various structures in order to further improve the antenna performance and mass productivity of the scanning antenna described in International Publication No. 2017/061527, the antenna performance of the prototype scanning antenna was deteriorated at times. As described below, it is understood that, in the scanning antennas in which the antenna performance was deteriorated, metal eluted from a source metal layer into a liquid crystal layer. In the present disclosure, it is desirable to provide a scanning antenna capable of suppressing deterioration of the antenna performance, a TFT substrate to be used for such a scanning antenna, and a method of manufacturing such a TFT substrate.

SUMMARY

A TFT substrate according to an embodiment of the present disclosure includes a dielectric substrate and a plurality of antenna unit regions arranged on the dielectric substrate and each having a TFT and a patch electrode electrically connected to a drain electrode of the TFT, the TFT substrate including a semiconductor layer of the TFT, a gate metal layer including a gate electrode of the TFT, a gate insulating layer formed between the gate metal layer and the semiconductor layer, a source metal layer formed on the semiconductor layer and including a source electrode and the drain electrode electrically connected to the semiconductor layer, and a contact layer including a source contact portion formed between the semiconductor layer and the source electrode and a drain contact portion formed between the semiconductor layer and the drain electrode, in which the source metal layer has a laminated structure including a lower source metal layer including at least one element selected from a group consisting of Ti, Ta, and W, and an upper source metal layer formed on the lower source metal layer and including Cu or Al, an edge of the lower source metal layer is positioned inside an edge of the upper source metal layer when viewed in a direction normal to the dielectric substrate, and at least a portion, which does not overlap the source contact portion or the drain contact portion in the edge of the lower source metal layer and the edge of the upper source metal layer in the plurality of antenna unit regions when viewed in the direction normal to the dielectric substrate, is covered with at least two inorganic layers.

A scanning antenna according to an embodiment of the present disclosure includes the TFT substrate according to any of the above, a slot substrate arranged to face the TFT substrate, a liquid crystal layer provided between the TFT substrate and the slot substrate, and a reflective conductive plate arranged to face a surface of the slot substrate on an opposite side to the liquid crystal layer with a dielectric layer interposed therebetween, in which the slot substrate has another dielectric substrate, and a slot electrode formed on a surface of the other dielectric substrate on a side of the liquid crystal layer, the slot electrode has a plurality of slots, and each of the plurality of slots is arranged to correspond to the patch electrode in each of the plurality of antenna unit regions of the TFT substrate.

According to an embodiment of the present disclosure, a method of manufacturing a TFT substrate including a dielectric substrate and a plurality of antenna unit regions arranged on the dielectric substrate and each having a TFT and a patch electrode electrically connected to a drain electrode of the TFT, in which the source electrode and the drain electrode of the TFT each include a lower source metal layer including at least one element selected from a group consisting of Ti, Ta, and W and an upper source metal layer formed on the lower source metal layer and including Cu or Al, includes (a)

forming a gate electrode of the TFT on the dielectric substrate, (b) forming a semiconductor layer of the TFT overlapping the gate electrode above the gate electrode with an insulating film interposed therebetween, and a contact portion in contact with an upper surface of the semiconductor layer, (c) forming a lower conductive film including at least one element selected from a group consisting of Ti, Ta, and W on the contact portion, (d) forming an upper conductive film including Cu or Al on the lower conductive film, (e) forming a resist layer on the upper conductive film, (f) forming the upper source metal layer by etching the upper conductive film with the resist layer as an etching mask, (g) forming the lower source metal layer by etching the lower conductive film with the resist layer as an etching mask, (h) forming a source contact portion connecting the semiconductor layer and the source electrode and a drain contact portion connecting the semiconductor layer and the drain electrode by dry etching the contact portion with the resist layer as an etching mask, (i) forming an interlayer insulating layer covering the TFT, (j) forming a conductive film on the interlayer insulating layer, and (k) forming an upper conductive layer on the interlayer insulating layer by patterning the conductive film, in which (k) includes forming the upper conductive layer such that the upper conductive layer covers at least a portion which does not overlap the source contact portion or the drain contact portion in an edge of the lower source metal layer and an edge of the upper source metal layer in the plurality of antenna unit regions when viewed in a direction normal to the dielectric substrate.

According to another embodiment of the present disclosure, a method of manufacturing a TFT substrate including a dielectric substrate and a plurality of antenna unit regions arranged on the dielectric substrate and each having a TFT and a patch electrode electrically connected to a drain electrode of the TFT, in which a source electrode and the drain electrode of the TFT and the patch electrode each include a lower source metal layer including at least one element selected from a group consisting of Ti, Ta, and W, and an upper source metal layer formed on the lower source metal layer and including Cu or Al, includes (A) forming a semiconductor layer of the TFT and a contact portion in contact with an upper surface of the semiconductor layer on the dielectric substrate, (B) forming a lower conductive film including at least one element selected from a group consisting of Ti, Ta, and W on the contact portion, (C) forming an upper conductive film including Cu or Al on the lower conductive film, (D) forming a resist layer on the upper conductive film, (E) forming the upper source metal layer by etching the upper conductive film with the resist layer as an etching mask, (F) forming the lower source metal layer by etching the lower conductive film with the resist layer as an etching mask, (G) forming a source contact portion connecting the semiconductor layer and the source electrode and a drain contact portion connecting the semiconductor layer and the drain electrode, by dry etching the contact portion with the resist layer as an etching mask, (H) forming a gate insulating film on the source electrode and the drain electrode, (I) forming, on the gate insulating film, a gate electrode of the TFT overlapping the semiconductor layer with the gate insulating film interposed therebetween, (J) forming an interlayer insulating film covering the TFT on the gate electrode, (K) forming a gate insulating layer and an interlayer insulating layer by forming a contact hole reaching the patch electrode in the gate insulating film and the interlayer insulating film, (L) forming a first upper conductive film on the interlayer insulating layer, (M) forming a first upper conductive layer on the interlayer insulating layer by patterning the first upper conductive film, (N) forming a second upper conductive film on the first upper conductive layer, and (O) forming a second upper conductive layer on the first upper conductive layer by patterning the second upper conductive film, in which (M) includes forming the first upper conductive layer such that the first upper conductive layer covers an edge of the lower source metal layer and an edge of the upper source metal layer of the patch electrode, when viewed in a direction normal to the dielectric substrate, and (O) includes forming the second upper conductive layer such that the second upper conductive layer covers an edge of the lower source metal layer and an edge of the upper source metal layer of the patch electrode when viewed in a direction normal to the dielectric substrate.

BRIEF DESCRIPTION OF THE DRAWINGS

FIG. 2A and FIG. 2B are schematic plan views showing a TFT substrate and a slot substrate provided in the scanning antenna, respectively;

FIG. 3A is a schematic plan view of an antenna unit region of a transmission/reception region of a TFT substrate of Reference Example 1, and FIG. 3B and FIG. 3C are schematic plan views of a non-transmission/reception region of the TFT substrate of Reference Example 1;

FIG. 7A to FIG. 7C are schematic cross-sectional views for illustrating the first method of manufacturing the TFT substrate of Reference Example 1;

FIG. 8A to FIG. 8D are schematic cross-sectional views for illustrating the first method of manufacturing the TFT substrate of Reference Example 1;

FIG. 9A to FIG. 9C are schematic cross-sectional views for illustrating a second method of manufacturing the TFT substrate of Reference Example 1;

FIG. 10A is a schematic plan view of the antenna unit region of the transmission/reception region of the TFT substrate, and FIG. 10B and FIG. 10C are schematic plan views of the non-transmission/reception region of the TFT substrate;

FIG. 14A is a schematic plan view of the antenna unit region of the transmission/reception region of a TFT substrate of Modification Example 1 of the first embodiment, and FIG. 14B and FIG. 14C are schematic plan views of a non-transmission/reception region of the TFT substrate;

FIG. 15A to FIG. 15C are schematic cross-sectional views of the TFT substrate;

FIG. 16A is a schematic plan view of the antenna unit region of the transmission/reception region of a TFT substrate of Modification Example 2 of the first embodiment, and FIG. 16B and FIG. 16C are schematic plan views of the non-transmission/reception region of the TFT substrate;

FIG. 17A to FIG. 17C are schematic cross-sectional views of the TFT substrate;

FIG. 18A is a schematic plan view of the antenna unit region of the transmission/reception region of a TFT substrate of Modification Example 3 of the first embodiment, and FIG. 18B and FIG. 18C are schematic plan views of the non-transmission/reception region of the TFT substrate;

FIG. 24A to FIG. 24E are schematic cross-sectional views for illustrating a first method of manufacturing the TFT substrate of Reference Example 2;

FIG. 25A to FIG. 25D are schematic cross-sectional views for illustrating the first method of manufacturing the TFT substrate of Reference Example 2;

FIG. 26A to FIG. 26C are schematic cross-sectional views for illustrating the first method of manufacturing the TFT substrate of Reference Example 2;

FIG. 29 is a schematic cross-sectional view of the TFT substrate;

FIG. 30A and FIG. 30B are schematic cross-sectional views for illustrating the method of manufacturing the TFT substrate;

FIG. 31A is a schematic plan view of the antenna unit region of the transmission/reception region of a TFT substrate of a modification example of the second embodiment, and FIG. 31B and FIG. 31C are schematic plan views of the non-transmission/reception region of the TFT substrate;

DESCRIPTION OF THE EMBODIMENTS

Figure 1:
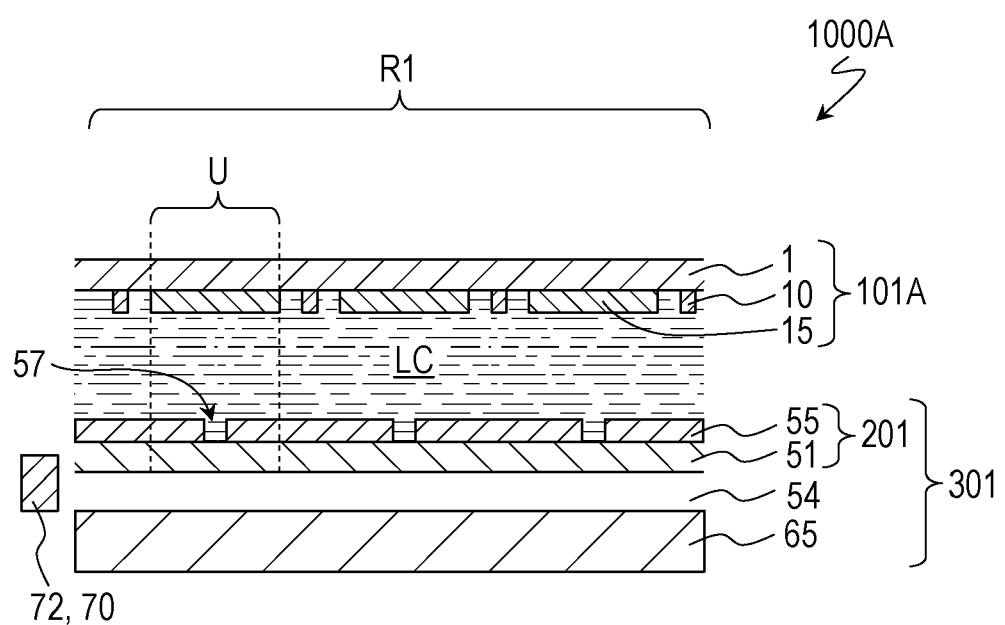
FIG. 1 is a cross-sectional view schematically showing a portion of a scanning antenna according to a first embodiment of the present disclosure.

A description will be given below of a scanning antenna, a method of manufacturing a scanning antenna, and a TFT substrate to be used for a scanning antenna according to embodiments of the present disclosure with reference to the drawings. Here, the present disclosure is not limited to the embodiments exemplified below. In addition, the embodiments of the present disclosure are not limited to the drawings. For example, the thicknesses of layers in a cross-sectional view, the sizes of conductive portions and opening portions in a plan view, and the like are examples.

Basic Structure of Scanning Antenna

In a scanning antenna using antenna units using the anisotropy (birefringence) of a liquid crystal material with a large dielectric constant M ($\varepsilon M$), the voltage to be applied to each liquid crystal layer of antenna units associated with pixels of an LCD panel is controlled and the effective dielectric constant M ($\varepsilon M$) of the liquid crystal layer in each antenna unit is changed to form a two-dimensional pattern in antenna units with different electrostatic capacities (corresponding to the display of an image on the LCD). Retardation is imparted to electromagnetic waves (for example, microwaves) to be emitted from an antenna or to be received by an antenna according to the electrostatic capacity of each antenna unit to give a strong directivity in a specific direction (beam scanning) corresponding to the two-dimensional pattern formed by the antenna units having different electrostatic capacitances. For example, the electromagnetic waves to be emitted from the antenna are obtained by integrating spherical waves obtained as a result of input electromagnetic waves being incident to each antenna unit and scattered in each antenna unit, while taking the retardation to be imparted by each antenna unit into consideration. It is also possible to consider each antenna unit as functioning as a "phase shifter". Refer to Japanese Unexamined Patent Application Publication No. 2007-116573, Japanese Unexamined Patent Application Publication No. 2007-295044, Japanese Unexamined Patent Application Publication (Translation of PCT Application) No. 2009-538565, and Japanese Unexamined Patent Application Publication (Translation of PCT Application) No. 2013-539949 and R. A. Stevenson et al., "Rethinking Wireless Communications: Advanced Antenna Design using LCD Technology", SID 2015 DIGEST, pp. 827-830 and M. ANDO et al., "A Radial Line Slot Antenna for 12 GHz Satellite TV Reception", IEEE Transactions of Antennas and Propagation, Vol. AP-33, No. 12, pp. 1347-1353 (1985) for the basic structure and operating principles of a scanning antenna using a liquid crystal material. M. ANDO et al., "A Radial Line Slot Antenna for 12 GHz Satellite TV Reception", IEEE Transactions of Antennas and Propagation, Vol. AP-33, No. 12, pp. 1347-1353 (1985) discloses the basic structure of a scanning antenna in which a plurality of slots are arranged spirally. All the disclosures of Japanese Unexamined Patent Application Publication No. 2007-116573, Japanese Unexamined Patent Application Publication No. 2007-295044, Japanese Unexamined Patent Application Publication (Translation of PCT Application) No. 2009-538565, and Japanese Unexamined Patent Application Publication (Translation of PCT Application) No. 2013-539949 and R. A. Stevenson et al., "Rethinking Wireless Communications: Advanced Antenna Design using LCD Technology", SID 2015 DIGEST, pp. 827-830 and M. ANDO et al., "A Radial Line Slot Antenna for 12 GHz Satellite TV Reception", IEEE Transactions of Antennas and Propagation, Vol. AP-33, No. 12, pp. 1347-1353 (1985) are incorporated in the present specification by reference.

Although the antenna units in the scanning antenna according to the embodiment of the present disclosure are similar to the pixels of an LCD panel, the structure of the antenna units differs from the structure of the pixels of the LCD panel and the arrangement of the plurality of antenna units also differs from the arrangement of the pixels in the LCD panel. A description will be given of the basic structure of the scanning antenna according to an embodiment of the present disclosure with reference to FIG. 1 showing the scanning antenna 1000A of the first embodiment which will be described in detail below. The scanning antenna 1000A is a radial inline slot antenna in which the slots are arranged in concentric circles; however, the scanning antenna according to the embodiment of the present disclosure is not limited thereto and, for example, the arrangement of the slots may be various known arrangements. In particular, for the slot and/or antenna unit arrangements, the entire disclosure of International Publication No. 2015/126550 is incorporated into the present specification for reference.

FIG. 1 is a cross-sectional view schematically showing a portion of the scanning antenna 1000A of the present embodiment, and schematically showing a portion of a cross-section along the radial direction from a power supply pin 72 (refer to FIG. 2B) provided in the vicinity of the center of the slots arranged in concentric circles.

The scanning antenna 1000A is provided with the TFT substrate 101A, the slot substrate 201, a liquid crystal layer LC arranged therebetween, and a reflective conductive plate 65 arranged to face the slot substrate 201 with an air layer 54 interposed therebetween. The scanning antenna 1000A transmits and receives microwaves from the TFT substrate 101A side.

The TFT substrate 101A has a dielectric substrate 1, which is a glass substrate or the like, a plurality of patch electrodes 15 formed on the dielectric substrate 1, and a plurality of TFTs 10. Each of the patch electrodes 15 is connected to a corresponding TFT 10. Each of the TFTs 10 is connected to a gate bus line and a source bus line.

The slot substrate 201 has a dielectric substrate 51, which is a glass substrate or the like, and a slot electrode 55 formed on the liquid crystal layer LC side of the dielectric substrate 51. The slot electrode 55 has a plurality of slots 57.

The reflective conductive plate 65 is arranged to face the slot substrate 201 with the air layer 54 interposed therebetween. Instead of the air layer 54, it is possible to use a layer formed of a dielectric body having a small dielectric constant M with respect to microwaves (for example, a fluorine resin such as PTFE). The slot electrode 55 and the reflective conductive plate 65 function as a waveguide 301 along with the dielectric substrate 51 and the air layer 54 therebetween.

The patch electrode 15, a portion of the slot electrode 55 including the slots 57, and the liquid crystal layer LC therebetween from the antenna unit U. In each antenna unit U, one patch electrode 15 faces a portion of the slot electrode 55 including one slot 57 with the liquid crystal layer LC interposed therebetween, and forms a liquid crystal capacity. In addition, each antenna unit U has an auxiliary capacitance (refer to FIG. 3) electrically connected in parallel with the liquid crystal capacity. The antenna unit U of the scanning antenna 1000A and the pixels in the LCD panel have a similar configuration. However, the scanning antenna 1000A has many points of difference from the LCD panel.

First, the performance of the dielectric substrates 1 and 51 of the scanning antenna 1000A is different from the performance of the substrate of the LCD panel.

Generally, a transparent substrate transparent to visible light is used for the LCD panel and, for example, it is possible to use a glass substrate or a plastic substrate. A semiconductor substrate may be used in a reflective LCD panel since the substrate on the rear side does not need transparency. On the other hand, the dielectric substrates 1 and 51 for antennas preferably have a small dielectric loss with respect to microwaves (the dielectric loss tangent with respect to microwaves is expressed as tan δM). The tan δM of the dielectric substrates 1 and 51 is preferably approximately 0.03 or less, and more preferably 0.01 or less.

Specifically, it is possible to use a glass substrate or a plastic substrate. The glass substrate is superior to the plastic substrate in dimensional stability and heat resistance, and is suitable for forming circuit elements such as TFTs, wiring, and electrodes using LCD technology. For example, in a case where the material forming the waveguide is air and glass, since the dielectric loss of the glass is larger, from the viewpoint that it is possible to reduce the waveguide loss when the glass is thinner, the glass is preferably 400 μm or less, and more preferably 300 μm or less. There is no particular lower limit as long as handling is possible without breaking in the manufacturing process.

The conductive material used for the electrodes is also different. In many cases, an ITO film is used as a transparent conductive film for a pixel electrode and a counter electrode of an LCD panel. However, ITO has a large tan δM with respect to microwaves and use thereof as a conductive layer in an antenna is not possible. The slot electrode 55 functions as a wall of the waveguide 301 together with the reflective conductive plate 65. Accordingly, in order to suppress the transmission of microwaves in the wall of the waveguide 301, the thickness of the wall of the waveguide 301, that is, the thickness of the metal layer (Cu layer or Al layer), is preferably large. It is known that if the thickness of the metal layer is three times the skin depth, the electromagnetic waves are attenuated to 1/20 (−26 dB), and if the thickness of the metal layer is 5 times, the electromagnetic waves are attenuated to 1/150 (−43 dB). Therefore, if the thickness of the metal layer is five times the skin depth, it is possible to reduce the electromagnetic wave transmittance to 1%. For example, for microwaves of 10 GHz, if a Cu layer having a thickness of 3.3 μm or more and an Al layer having a thickness of 4.0 μm or more are used, it is possible to reduce the microwaves to 1/150. In addition, for microwaves of 30 GHz, if a Cu layer having a thickness of 1.9 μm or more and an Al layer having a thickness of 2.3 μm or more are used, it is possible to reduce the microwaves to 1/150. In this manner, the slot electrode 55 is preferably formed of a comparatively thick Cu layer or Al layer. There is no particular upper limit to the thickness of the Cu layer or the Al layer, and it is possible to appropriately set the thickness in consideration of the film forming time and cost. Using a Cu layer obtains the advantage of being thinner than when using an Al layer. As for the forming of the relatively thick Cu layer or Al layer, it is also possible to adopt not only the thin film deposition methods used in LCD manufacturing processes but also other methods such as bonding Cu foil or Al foil to a substrate. The thickness of the metal layer is, for example, 2 μm or more and 30 μm or less. In a case where the thin film deposition method is used, the thickness of the metal layer is preferably 5 μm or less. As the reflective conductive plate 65, for example, it is possible to use an aluminum plate, a copper plate, or the like having a thickness of several mm.

Since the patch electrode 15 does not form the waveguide 301 in the manner of the slot electrode 55, it is possible to use a Cu layer or an Al layer having a smaller thickness than the slot electrode 55 for the patch electrode 15. However, the resistance thereof is preferably low in order to avoid loss turning into heat when the vibration of free electrons in the vicinity of the slots 57 of the slot electrode 55 induces the vibration of free electrons in the patch electrode 15. From the viewpoint of mass production, it is preferable to use an Al layer rather than a Cu layer, and the thickness of the Al layer is preferably 0.3 m or more and 2 μm or less, for example.

In addition, the arrangement pitch of the antenna units U is largely different from the pixel pitch. For example, when considering an antenna for microwaves of 12 GHz (Ku band), the wavelength λ is, for example, 25 mm. Then, as described in Japanese Unexamined Patent Application Publication (Translation of PCT Application) No. 2013-539949, since the pitch of the antenna unit U is λ/4 or less and/or λ/5 or less, the wavelength λ is 6.25 mm or less and/or 5 mm or less. This is greater than the pixel pitch of the LCD panel by ten times or more. Accordingly, the lengths and widths of the antenna units U are also approximately ten times greater than the lengths and widths of the pixels of the LCD panel.

Naturally, it is possible for the arrangement of the antenna units U to be different from the arrangement of the pixels in the LCD panel. Here, an example in which the antenna units U are arranged in concentric circles (for example, refer to Japanese Unexamined Patent Application Publication No. 2002-217640) is shown, but, without being limited thereto, the antenna units U may be arranged in a spiral, for example, as described in M. ANDO et al., "A Radial Line Slot Antenna for 12 GHz Satellite TV Reception", IEEE Transactions of Antennas and Propagation, Vol. AP-33, No. 12, pp. 1347-1353 (1985). Furthermore, the antenna units U may be arranged in a matrix as described in Japanese Unexamined Patent Application Publication (Translation of PCT Application) No. 2013-539949.

The characteristics of the liquid crystal material of the liquid crystal layer LC of the scanning antenna 1000A are different from the characteristics of the liquid crystal material of an LCD panel. The display of an LCD panel is created by changing the refractive index of the liquid crystal layer of the pixels to impart retardation to the polarized light of visible light (wavelength 380 nm to 830 nm) to change the polarization state (for example, rotating the polarization axis direction of linearly polarized light or changing the degree of circular polarization of circularly polarized light). In contrast, the scanning antenna 1000A according to the embodiment changes the phase of the microwaves to be excited (re-radiated) from each patch electrode by changing the electrostatic capacitance value of the liquid crystal capacity of the antenna unit U. Accordingly, in the liquid crystal layer, the anisotropy ($\delta\varepsilon M$) of the dielectric constant M ($\varepsilon M$) with respect to microwaves is preferably large and tan $\delta M$ is preferably small. For example, it is possible to suitably use the liquid crystal material described in M. Wittek et al., SID 2015 DIGEST pp. 824-826 in which $\delta\varepsilon M$ is 4 or more and tan $\delta M$ is 0.02 or less (both values of 19 Gz). In addition, it is possible to use the liquid crystal material described in Kuki, Polymer 55 vol. August issue pp. 599-602 (2006) in which $\delta\varepsilon M$ is 0.4 or more and tan $\delta M$ is 0.04 or less.

In general, the dielectric constant of a liquid crystal material has a frequency variance, but the dielectric anisotropy $\delta\varepsilon M$ with respect to microwaves has a positive correlation with the refractive index anisotropy $\delta n$ with respect to visible light. Accordingly, the liquid crystal material for an antenna unit for microwaves is preferably a material having a large refractive index anisotropy $\delta n$ with respect to visible light in other words. The refractive index anisotropy $\delta n$ of the liquid crystal material for LCD is evaluated by the refractive index anisotropy with respect to light at 550 nm. Here too, when δn (birefringence) for light at 550 nm is used as an index, a nematic liquid crystal having δn of 0.3 or more, preferably 0.4 or more, is used for an antenna unit for microwaves. δn has no particular upper limit. However, since a liquid crystal material having a large δn tends to have a strong polarity, there is a concern that the reliability may be deteriorated. The thickness of the liquid crystal layer is, for example, 1 μm to 500 μm.

A more detailed description will be given below of the structure and method of manufacturing the scanning antenna according to an embodiment of the present disclosure.

First Embodiment

First, reference will be made to FIG. 1, FIG. 2A and FIG. 2B. FIG. 1 is a schematic partial cross-sectional view of the vicinity of the center of the scanning antenna 1000A as detailed above, and FIG. 2A and FIG. 2B are plan views of the TFT substrate 101A and the slot substrate 201 provided in the scanning antenna 1000A.

The scanning antenna 1000A has a plurality of antenna units U arranged two-dimensionally and, in the scanning antenna 1000A exemplified here, the plurality of antenna units are arranged in concentric circles. In the following description, the region of the TFT substrate 101A and the region of the slot substrate 201 corresponding to the antenna units U are referred to as the "antenna unit region", and the same reference character U as the antenna unit is added thereto. In addition, as shown in FIG. 2A and FIG. 2B, in the TFT substrate 101A and the slot substrate 201, a region defined by a plurality of two-dimensionally arranged antenna unit regions is referred to as a "transmission/reception region R1" and a region other than the transmission/reception region R1 is referred to as a "non-transmission/reception region R2". In the non-transmission/reception region R2, a terminal portion, a drive circuit, and the like are provided.

FIG. 2A is a schematic plan view showing the TFT substrate 101A provided in the scanning antenna 1000A.

In the illustrated example, the transmission/reception region R1 has a donut shape when viewed in the direction normal to the TFT substrate 101A. The non-transmission/reception region R2 includes a first non-transmission/reception region R2a positioned at the center of the transmission/reception region R1 and a second non-transmission/reception region R2b positioned at the periphery of the transmission/reception region R1. The outer diameter of the transmission/reception region R1 is, for example, 200 mm to 1500 mm, and is set according to the communication volume or the like.

A plurality of gate bus lines GL and a plurality of source bus lines SL supported by the dielectric substrate 1 are provided in the transmission/reception region R1 of the TFT substrate 101A, and the antenna unit region U is defined by these wirings. The antenna unit regions U are, for example, arranged in concentric circles in the transmission/reception region R1. Each of the antenna unit regions U includes a TFT and a patch electrode electrically connected to the TFT. The source electrode and the gate electrode of the TFT are electrically connected to the source bus line SL and the gate bus line GL, respectively. In addition, the drain electrode is electrically connected to the patch electrode.

In the non-transmission/reception region R2 (R2a and R2b), a seal region Rs is arranged to surround the transmission/reception region R1. A sealing material (not shown) is applied to the seal region Rs. The sealing material bonds the TFT substrate 101A and the slot substrate 201 to each other and also encloses a liquid crystal between the substrates 101A and 201.

A gate terminal portion GT, a gate driver GD, a source terminal portion ST, and a source driver SD are provided outside the seal region Rs in the non-transmission/reception region R2. Each of the gate bus lines GL is connected to the gate driver GD via the gate terminal portion GT. Each of the source bus lines SL is connected to the source driver SD via the source terminal portion ST. In this example, the source driver SD and the gate driver GD are formed on the dielectric substrate 1, but one or both of these drivers may be provided on another dielectric substrate.

In the non-transmission/reception region R2, a plurality of transfer terminal portions PT are also provided. The transfer terminal portion PT is electrically connected to the slot electrode 55 (FIG. 2B) of the slot substrate 201. In the present specification, a connection portion between the transfer terminal portion PT and the slot electrode 55 is referred to as a "transfer portion". As shown in the drawing, the transfer terminal portion PT (transfer portion) may be arranged in the seal region Rs. In such a case, resin-containing conductive particles may be used as the sealing material. Due to this, liquid crystal is enclosed between the TFT substrate 101A and the slot substrate 201, and it is possible to secure the electrical connection between the transfer terminal portion PT and the slot electrode 55 of the slot substrate 201. In this example, the transfer terminal portion PT is arranged in both the first non-transmission/reception region R2a and the second non-transmission/reception region R2b, but may be arranged in only one thereof.

Here, the transfer terminal portion PT (transfer portion) may not be arranged in the seal region Rs. For example, the transfer terminal portion PT may be arranged outside the seal region Rs in the non-transmission/reception region R2.

FIG. 2B is a schematic plan view illustrating the slot substrate 201 in the scanning antenna 1000A, and shows the surface of the slot substrate 201 on the liquid crystal layer LC side.

In the slot substrate 201, the slot electrode 55 is formed on the dielectric substrate 51 across the transmission/reception region R1 and the non-transmission/reception region R2.

In the transmission/reception region R1 of the slot substrate 201, a plurality of the slots 57 are arranged in the slot electrode 55. The slots 57 are arranged corresponding to the antenna unit region U on the TFT substrate 101A. In the illustrated example, in the plurality of the slots 57, pairs of the slots 57 are arranged in concentric circles extending in a direction substantially orthogonal to each other to form a radial inline slot antenna. Since the slots are substantially orthogonal to each other, it is possible for the scanning antenna 1000A to transmit and receive circularly polarized waves.

A plurality of terminal portions IT of the slot electrodes 55 are provided in the non-transmission/reception region R2. The terminal portions IT are electrically connected to the transfer terminal portion PT (FIG. 2A) of the TFT substrate 101A. In this example, the terminal portions IT are arranged in the seal region Rs and are electrically connected to the corresponding transfer terminal portion PT by a sealing material containing conductive particles.

In addition, in the first non-transmission/reception region R2a, the power supply pin 72 is arranged on the rear surface side of the slot substrate 201. Microwaves enter into the waveguide 301 formed by the slot electrode 55, the reflective conductive plate 65, and the dielectric substrate 51 through the power supply pin 72. The power supply pin 72 is connected to a power supply device 70. The power is supplied from the center of the concentric circle in which the slots 57 are arranged. The power supply method may be either a direct coupling power supply method or an electro-magnetic coupling method, and it is possible to adopt a known power supply structure.

FIG. 2A and FIG. 2B show an example in which the seal region Rs is provided to surround a comparatively narrow region including the transmission/reception region R1, but the present disclosure is not limited thereto. In particular, the seal region Rs provided outside the transmission/reception region R1 may be provided, for example, in the vicinity of the side of the dielectric substrate 1 and/or the dielectric substrate 51 to have a certain distance or more from the transmission/reception region R1. Naturally, for example, the terminal portion and the drive circuit provided in the non-transmission/reception region R2 may be formed outside the seal region Rs (that is, the side where the liquid crystal layer is not present). Forming the seal region Rs at a position separated by a certain distance or more from the transmission/reception region R1 makes it possible to suppress deterioration of the antenna performance due to the influence of impurities (particularly ionic impurities) contained in the sealing material (particularly, curable resin).

TFT Substrate 101R (Antenna Unit Region U) of Reference Example 1

Before describing the detailed structure of the TFT substrate 101A of the present embodiment, first, a description will be given of the TFT substrate 101R of Reference Example 1 with reference to FIG. 3A to FIG. 5. When the present inventors manufactured and drove prototype scanning antennas provided with the TFT substrate 101R of Reference Example 1, the antenna performance thereof sometimes deteriorated. In the following description, description common to the TFT substrate 101A of the present embodiment may be omitted in order to avoid duplication. FIG. 3A to FIG. 3C are schematic plan views of the TFT substrate 101R of Reference Example 1, FIG. 4A to FIG. 4E and FIG. 5 are schematic cross-sectional views of the TFT substrate 101R of Reference Example 1.

Figure 4A:
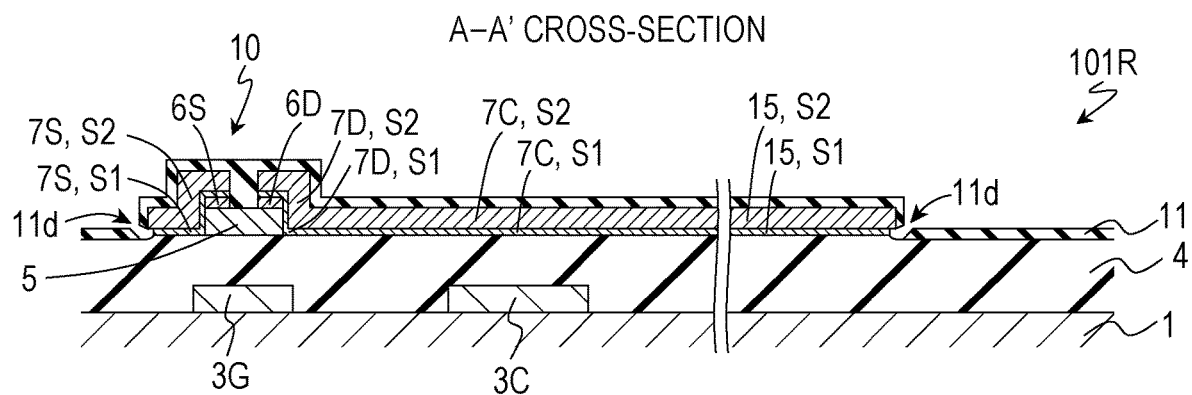
FIG. 4A to FIG. 4E are schematic cross-sectional views of the TFT substrate of Reference Example 1.

With reference to FIG. 3A and FIG. 4A, a description will be given of the structure of the antenna unit region U of the TFT substrate 101R of Reference Example 1. FIG. 3A is a schematic plan view of the antenna unit region U of the transmission/reception region R1 of the TFT substrate 101R of Reference Example 1. FIG. 4A is a schematic cross-sectional view of the antenna unit region U of the TFT substrate 101R of Reference Example 1 and shows a cross-section along a line A-A' in FIG. 3A.

As shown in FIG. 3A and FIG. 4A, the TFT substrate 101R of Reference Example 1 has the dielectric substrate 1, and a plurality of antenna unit regions U arranged on the dielectric substrate 1 and each having the TFT 10 and the patch electrode 15 electrically connected to a drain electrode 7D of the TFT 10. The TFT 10 has a semiconductor layer 5, a gate electrode 3G, a gate insulating layer 4 formed between the gate electrode 3G and the semiconductor layer 5, a source electrode 7S and the drain electrode 7D formed on the semiconductor layer 5 and electrically connected to the semiconductor layer 5, a source contact portion 6S formed between the semiconductor layer 5 and the source electrode 7S, and a drain contact portion 6D formed between the semiconductor layer 5 and the drain electrode 7D. As shown in FIG. 4A, a source metal layer 7 including the source electrode 7S and the drain electrode 7D has a laminated structure including a lower source metal layer S1 including at least one element selected from the group consisting of Ti, Ta, and W, and an upper source metal layer S2 formed on the lower source metal layer S1 and including Cu or Al. That is, each of the source electrode 7S and the drain electrode 7D includes the lower source metal layer S1 and the upper source metal layer S2. The edge of the lower source metal layer S1 is positioned inside the edge of the upper source metal layer S2 when viewed in the direction normal to the dielectric substrate 1.

In the plan view, for simplicity, the edge of the lower source metal layer S1 and the edge of the upper source metal layer S2 may not be distinguished from each other but may be shown as edges of the source metal layer 7. In the same manner, the edges of the source contact portion 6S and the drain contact portion 6D may not be distinguished from the edge of the lower source metal layer S1 and/or the edge of the upper source metal layer S2.

As shown in FIG. 4A, in the TFT substrate 101R of Reference Example 1, when viewed in the direction normal to the dielectric substrate 1, the edge of the lower source metal layer S1 is inside the edge of the upper source metal layer S2. That is, the source metal layer 7 has a side surface with a reverse taper shape. In the present specification, a structure in which the edge of the lower source metal layer S1 is positioned inside the edge of the upper source metal layer S2 when viewed in the direction normal to the dielectric substrate 1 may be referred to as a "reverse taper shape" or a "reverse tapered side surface". The side surface of the source metal layer 7 having a reverse taper shape generates a defect 11$d$ in the inorganic layer (here, an interlayer insulating layer 11 formed to cover the TFT 10) formed on the source metal layer 7. In the present specification, a location in the source metal layer 7 which is not completely covered with the inorganic layer (for example, an inorganic insulating layer or an oxide conductive layer (may be referred to as a "transparent conductive layer", for example, an ITO layer)) formed on the source metal layer 7 is referred to as a defect of the inorganic layer. In the defect 11$d$ of the interlayer insulating layer 11, for example, the interlayer insulating layer 11 is discontinuous.

In the cross-sectional view, for simplicity, the gate insulating layer 4 and/or the interlayer insulating layer 11 may be represented as a planarizing layer, but, in general, a layer formed by a thin film deposition method (for example, a CVD method, a sputtering method, or a vacuum evaporation method) has a surface reflecting the level difference of the base.

Since the interlayer insulating layer 11 of the TFT substrate 101R of Reference Example 1 has the defect 11$d$, the liquid crystal material in the scanning antenna provided with the TFT substrate 101R of Reference Example 1 is degraded due to metal ions (Cu ions or Al ions) eluting from the source metal layer 7 to the liquid crystal layer and the antenna performance is deteriorated.

In this example, in the electrodes and the conductive portion included in the source metal layer 7, metal ions elute from any electrode or conductive portion including the upper source metal layer S2. For example, in the illustrated example, the source metal layer 7 includes the source electrode 7S, the drain electrode 7D, and the patch electrode 15. The source metal layer 7 has a laminated structure including the lower source metal layer S1 and the upper source metal layer S2. Accordingly, each of the source electrode 7S, the drain electrode 7D, and the patch electrode 15 includes the lower source metal layer S1 and the upper source metal layer S2. Accordingly, metal ions elute from all of these electrodes.

As described above, the scanning antenna controls the voltage applied to each liquid crystal layer of each antenna and changes the effective dielectric constant M (CM) of the liquid crystal layer of each antenna unit to form a two-dimensional pattern in the antenna units with different electrostatic capacitances. Since the specific resistance is low in the liquid crystal material having a large dielectric anisotropy δεM (birefringence δn with respect to visible light) in the microwave region, the holding ratio of the voltage applied to the liquid crystal capacity is low. When the voltage holding ratio of the liquid crystal capacity decreases, the effective voltage to be applied to the liquid crystal layer decreases and the target voltage is not applied to the liquid crystal layer. As a result, the retardation to be imparted to the microwaves by the liquid crystal layer of each antenna is shifted from the prescribed value. If the retardation is shifted from the prescribed value, the antenna performance is deteriorated. In practice, since the scanning antenna is designed to maximize the gain at a predetermined resonance frequency, the decrease in the voltage holding ratio manifests as a decrease in gain, for example.

A liquid crystal material having a large dielectric anisotropy δεM in the microwave region includes, for example, an isothiocyanate group (—NCS) or a thiocyanate group (—SCN). The liquid crystal material including an isothiocyanate group or a thiocyanate group tends to degrade. When the liquid crystal material degrades, the specific resistance further decreases and the voltage holding ratio further decreases. A liquid crystal material including an isothiocyanate group or a thiocyanate group has a strong polarity and has low chemical stability in comparison with liquid crystal materials currently used for LCDs. Since the isothiocyanate group and the thiocyanate group have strong polarity, the liquid crystal material including an isothiocyanate group or a thiocyanate group easily absorbs moisture and may react with metal ions (for example, Cu ions or Al ions). In addition, when a DC voltage is continuously applied thereto, an electrical decomposition reaction may occur. In addition, a liquid crystal material including an isothiocyanate group or a thiocyanate group tends to absorb light from the ultraviolet region to in the vicinity of 430 nm and to be photo-decomposed. In addition, liquid crystal materials including an isothiocyanate group or a thiocyanate group are also comparatively weak against heat. Due to this, since the specific resistance of the liquid crystal material decreases and/or the ionic impurity increases, the voltage holding ratio of the liquid crystal capacity decreases.

According to the studies by the present inventors, when viewed in the direction normal to the dielectric substrate 1 of the TFT substrate 101R of Reference Example 1, it was found that a structure in which the edge of the lower source metal layer S1 is positioned inside the edge of the upper source metal layer S2 is created by the manufacturing process of the TFT substrate 101R of Reference Example 1.

Structure of TFT Substrate 101R of Reference Example 1 (Non-Transmission/Reception region R2).

A description will be given of the structure of the non-transmission/reception region R2 of the TFT substrate 101R of Reference Example 1 with reference to FIG. 3A to FIG. 5. As shown in FIG. 3A to FIG. 5, also in the non-transmission/reception region R2, the source metal layer 7 has a laminated structure including the lower source metal layer S1 and the upper source metal layer S2, and the edge of the lower source metal layer S1 is positioned inside the edge of the upper source metal layer S2. However, the structure of the non-transmission/reception region R2 of the TFT substrate 101R of Reference Example 1 is not limited to the illustrated example. The problem that the above-described antenna characteristic deteriorates may occur regardless of the structure outside the seal region Rs in the non-transmission/reception region R2. This is because there is no liquid crystal layer LC outside the seal region Rs in the non-transmission/reception region R2, thus, the problem in which metal ions elute from the upper source metal layer S2 to the liquid crystal layer LC does not occur.

Since the TFT substrate 101A (refer to FIG. 10A to FIG. 12) of the present embodiment described below is basically the same as the TFT substrate 101R of Reference Example 1 in the structure of the non-transmission/reception region R2, a description may be given with that of the TFT substrate 101R of Reference Example 1.

FIG. 3B shows the transfer terminal portion PT, the gate terminal portion GT, and a CS terminal portion CT provided in the non-transmission/reception region R2, and FIG. 3C shows the source-gate connection portion SG and source terminal portion ST provided in the non-transmission/reception region R2.

The transfer terminal portion PT includes a first transfer terminal portion PT1 positioned in the seal region Rs and a second transfer terminal portion PT2 provided outside (on the side with no liquid crystal layer) the seal region Rs. In the illustrated example, the first transfer terminal portion PT1 extends along the seal region Rs to surround the transmission/reception region R1.

Figure 4B:
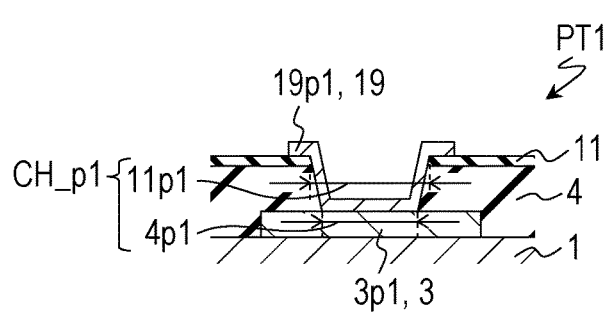
Figure 4C:
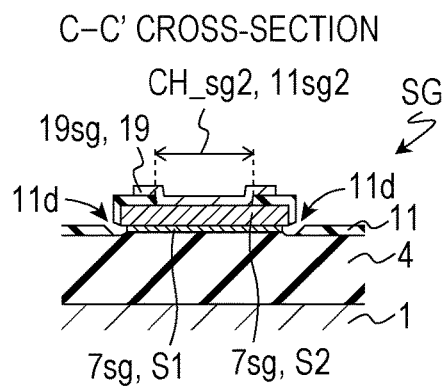
Figure 4D:
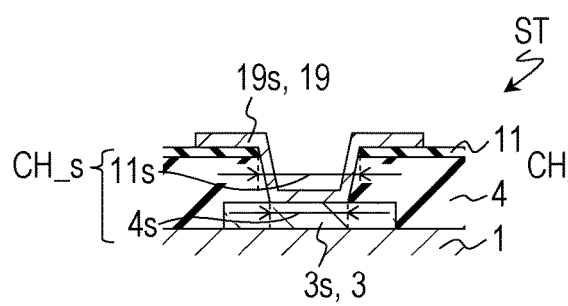
Figure 4E:
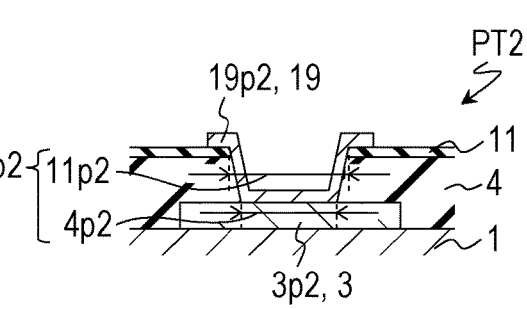
Figure 5:
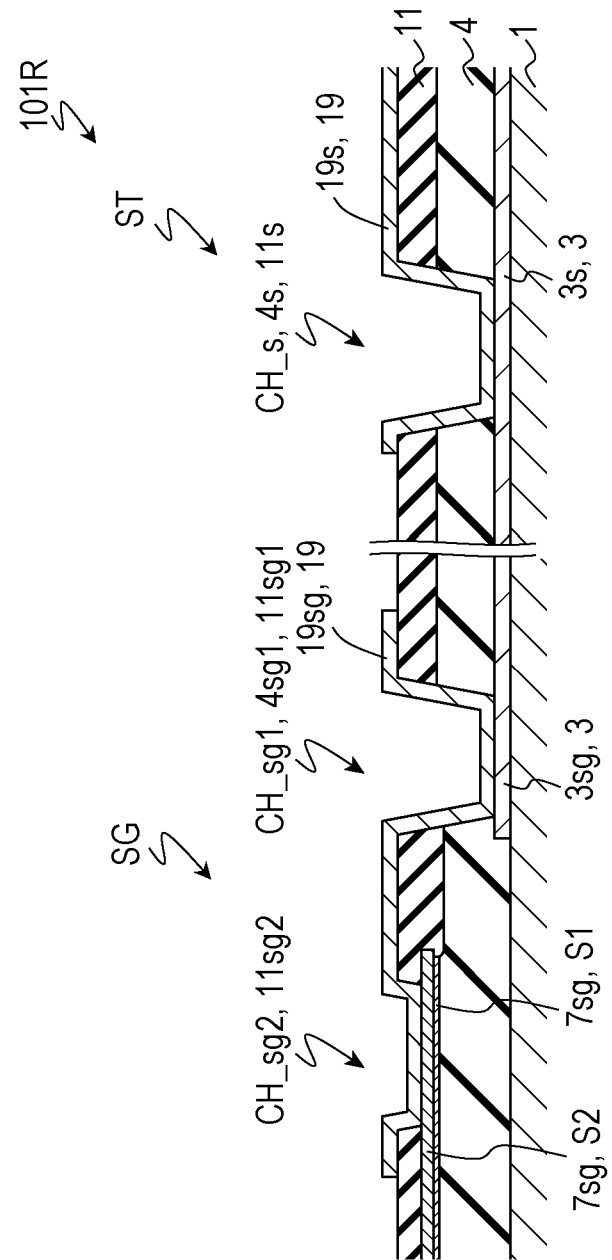
FIG. 5 is a schematic cross-sectional view of the TFT substrate of Reference Example 1.

FIG. 4B shows a cross-section of the first transfer terminal portion PT1 along line B-B' in FIG. 3B, FIG. 4C shows a cross-section of the source-gate connection portion SG along the line C-C' in FIG. 3C, FIG. 4D shows a cross-section of the source terminal portion ST along the line D-D' in FIG. 3C, FIG. 4E shows a cross-section of the second transfer terminal portion PT2 along the line E-E' in FIG. 3B, and FIG. 5 shows a cross-section of the source-gate connection portion SG and the source terminal portion ST along a line F-F' in FIG. 3C.

Generally, the gate terminal portion GT and the source terminal portion ST are provided for the gate bus line and the source bus line, respectively. The source-gate connection portion SG is generally provided corresponding to each source bus line. FIG. 3B shows the CS terminal portion CT and the second transfer terminal portion PT2 side by side with the gate terminal portion GT; however, the number and arrangement of the CS terminal portion CT and the second transfer terminal portion PT2 are each set independently of the gate terminal portion GT. Normally, the numbers of the CS terminal portions CT and the second transfer terminal portions PT2 are smaller than the number of the gate terminal portions GT and are set as appropriate in consideration of the uniformity of the voltages of the CS electrode and the slot electrode. In addition, it is possible to omit the second transfer terminal portion PT2 in a case where the first transfer terminal portion PT1 is formed.

Each CS terminal portion CT is provided corresponding to each CS bus line, for example. Each CS terminal portion CT may be provided to correspond to a plurality of CS bus lines. For example, in a case where the same voltage as the slot voltage is supplied to each CS bus line, it is sufficient if the TFT substrate 101R of Reference Example 1 has at least one CS terminal portion CT. However, in order to reduce the wiring resistance, the TFT substrate 101R of Reference Example 1 preferably has a plurality of CS terminal portions CT. The slot voltage is, for example, the ground potential. In addition, in a case where the same voltage as the slot voltage is supplied to the CS bus line, it is possible to omit either the CS terminal portion CT or the second transfer terminal portion PT2.

Source-Gate Connection Portion SG

As shown in FIG. 3C, the TFT substrate 101R of Reference Example 1 has a source-gate connection portion SG in the non-transmission/reception region R2. The source-gate connection portion SG is generally provided for each source bus line SL. The source-gate connection portion SG electrically connects each source bus line SL to a connection wiring (may be referred to as a "source lower connection wiring") formed in a gate metal layer 3. As described below, providing the source-gate connection portion SG makes it possible to form the lower connection portion of the source terminal portion ST in the gate metal layer 3. Due to this, the source terminal portion ST of the TFT substrate 101R of Reference Example 1 has excellent reliability.

As shown in FIG. 3C, FIG. 4C, and FIG. 5, the source-gate connection portion SG has a source lower connection wiring 3sg, an opening portion 4sg1 formed in the gate insulating layer 4, a source bus line connection portion 7sg, an opening portion 11sg1 and an opening portion 11sg2 formed in the interlayer insulating layer 11, and a source bus line upper connection portion 19sg.

The source lower connection wiring 3sg is included in the gate metal layer 3. The source lower connection wiring 3sg is electrically separated from the gate bus line GL.

The opening portion 4sg1 formed in the gate insulating layer 4 reaches the source lower connection wiring 3sg.

The source bus line connection portion 7sg is included in the source metal layer 7 and is electrically connected to the source bus line SL. In this example, the source bus line connection portion 7sg extends from the source bus line SL and is formed integrally with the source bus line SL. The source bus line connection portion 7sg includes the lower source metal layer S1 and the upper source metal layer S2. The width of the source bus line connection portion 7sg may be larger than the width of the source bus line SL.

The opening portion 11sg1 formed in the interlayer insulating layer 11 overlaps the opening portion 4sg1 formed in the gate insulating layer 4 when viewed in the direction normal to the dielectric substrate 1. The opening portion 4sg1 formed in the gate insulating layer 4 and the opening portion 11sg1 formed in the interlayer insulating layer 11 form a contact hole CH_sg1.

The opening portion 11sg2 formed in the interlayer insulating layer 11 reaches the source bus line connection portion 7sg. The opening portion 11sg2 may be referred to as a contact hole CH_sg2.

The source bus line upper connection portion 19sg (may be referred to simply as the "upper connection portion 19sg) is included in an upper conductive layer 19. The upper connection portion 19sg is formed on the interlayer insulating layer 11, in the contact hole CH_sg1, and in the contact hole CH_sg2 and is connected to the source lower connection wiring 3sg in the contact hole CH_sg1, and connected to the source bus line connection portion 7sg in the contact hole CH_sg2. For example, here, the upper connection portion 19sg is in contact with the source lower connection wiring 3sg in the opening portion 4sg1 formed in the gate insulating layer 4, and in contact with the source bus line connection portion 7sg in the opening portion 11sg2 formed in the interlayer insulating layer 11.

The portion in the source lower connection wiring 3sg exposed by the opening portion 4sg1 is preferably covered with the upper connection portion 19sg. A portion in the source bus line connection portion 7sg exposed by the opening portion 11sg2 is preferably covered with the upper connection portion 19sg.

The upper conductive layer 19 includes, for example, a transparent conductive layer (for example, an ITO layer). The upper conductive layer 19 may be formed of only a transparent conductive layer, for example. Alternatively, the upper conductive layer 19 may have a laminated structure including a first layer, which includes a transparent conductive layer, and a second layer, which is formed under the first layer. The second layer is formed, for example, of one layer or a laminate of two or more layers selected from the group consisting of a Ti layer, a MoNbNi layer, a MoNb layer, a MoW layer, a W layer, and a Ta layer.

As shown in FIG. 4C, in the source-gate connection portion SG of the TFT substrate 101R of Reference Example 1, the source metal layer 7 has a reverse tapered side surface, and the interlayer insulating layer 11 has the defect 11d. In a case where the source-gate connection portion SG is arranged inside the seal region Rs in the non-transmission/reception region R2, due to the interlayer insulating layer 11 having the defect 11d, there is a problem in that the metal ions may elute from the upper source metal layer S2 to the liquid crystal layer LC. However, in a case where the source-gate connection portion SG is arranged outside the seal region Rs in the non-transmission/reception region R2, as described above, even if the interlayer insulating layer 11 has the defect 11d, the problem in which metal ions elute from the upper source metal layer S2 to the liquid crystal layer LC does not occur.

In the illustrated example, the contact hole CH_sg2 is formed at a position separated from the contact hole CH_sg1. The present embodiment is not limited thereto, and the contact hole CH_sg1 and the contact hole CH_sg2 may be continuous (that is, may be formed as a single contact hole). The contact hole CH_sg1 and the contact hole CH_sg2 may be formed as a single contact hole in the same step. Specifically, a single contact hole reaching the source lower connection wiring 3sg and the source bus line connection portion 7sg may be formed in the gate insulating layer 4 and the interlayer insulating layer 11, and the upper connection portion 19sg may be formed in the contact hole and on the interlayer insulating layer 11. At this time, the upper connection portion 19sg is preferably formed to cover a portion in the source lower connection wiring 3sg and the source bus line connection portion 7sg exposed in the contact hole.

Source Terminal Portion ST

As shown in FIG. 3C, the TFT substrate 101R of Reference Example 1 has the source terminal portion ST in the non-transmission/reception region R2. The source terminal portion ST is generally provided corresponding to each source bus line SL. Here, the source terminal portion ST and the source-gate connection portion SG are provided corresponding to each source bus line SL.

As shown in FIG. 3C, FIG. 4C, and FIG. 5, the source terminal portion ST has a source terminal lower connection portion 3s (may also be referred to simply as the "lower connection portion 3s") connected to the source lower connection wiring 3sg formed in the source-gate connection portion SG, an opening portion 4s formed in the gate insulating layer 4, an opening portion 11s formed in the interlayer insulating layer 11, a source terminal upper connection portion 19s (may be referred to simply as the "upper connection portion 19s").

The lower connection portion 3s is included in the gate metal layer 3. The lower connection portion 3s is electrically connected to the source lower connection wiring 3sg formed in the source-gate connection portion SG. In this example, the lower connection portion 3s extends from the source lower connection wiring 3sg and is integrally formed with the source lower connection wiring 3sg.

The opening portion 4s formed in the gate insulating layer 4 reaches the lower connection portion 3s.

The opening portion 11s formed in the interlayer insulating layer 11 overlaps the opening portion 4s formed in the gate insulating layer 4 when viewed in the direction normal to the dielectric substrate 1. The opening portion 4s formed in the gate insulating layer 4 and the opening portion 11s formed in the interlayer insulating layer 11 form a contact hole CH_s.

The upper connection portion 19s is included in the upper conductive layer 19. The upper connection portion 19s is formed on the interlayer insulating layer 11 and in the contact hole CH_s and is connected to the lower connection portion 3s in the contact hole CH_s. Here, the upper connection portion 19s is in contact with the lower connection portion 3s in the opening portion 4s formed in the gate insulating layer 4.

In this example, the source terminal portion ST does not include the conductive portion included in the source metal layer 7.

Since the source terminal portion ST has the lower connection portion 3s included in the gate metal layer 3, the source terminal portion ST has excellent reliability.

Corrosion may occur due to moisture (which may include impurities) in the atmosphere at the terminal portion, particularly, at the terminal portion outside (on the opposite side to the liquid crystal layer) the seal region Rs. Moisture in the atmosphere may enter from the contact hole reaching the lower connection portion and reach the lower connection portion and corrosion may occur in the lower connection portion. From the viewpoint of suppressing the occurrence of corrosion, the contact hole reaching the lower connection portion is preferably deep. That is, the thickness of the insulating layer in which the opening portion forming the contact hole is formed is preferably large.

In addition, in the step of manufacturing a TFT substrate having a glass substrate as a dielectric substrate, scratches or disconnection may occur in the lower connection portion of the terminal portion due to debris or chips (cullet) of the glass substrate. For example, a plurality of TFT substrates are manufactured from one mother substrate. Cullet occurs, for example, when cutting the mother substrate, when forming a scribe line on the mother substrate, or the like. From the viewpoint of avoiding scratches and disconnection of the lower connection portion of the terminal portion, the contact hole reaching the lower connection portion is preferably deep. That is, the thickness of the insulating layer in which the opening portions forming the contact hole is formed is preferably large.

In the source terminal portion ST of the TFT substrate 101R of Reference Example 1, since the lower connection portion 3s is included in the gate metal layer 3, the contact hole CH_s reaching the lower connection portion 3s has the opening portion 4s formed in the gate insulating layer 4 and the opening portion 11s formed in the interlayer insulating layer 11. The depth of the contact hole CH_s is the sum of the thickness of the gate insulating layer 4 and the thickness of the interlayer insulating layer 11. On the other hand, for example, in a case where the lower connection portion is included in the source metal layer 7, the contact hole reaching the lower connection portion has only the opening portion formed in the interlayer insulating layer 11, and the depth thereof is the thickness of the interlayer insulating layer 11 and is smaller than the depth of the contact hole CH_s. Here, the depth of the contact hole and the thickness of the insulating layer refer to the depth and the thickness in the direction normal to the dielectric substrate 1, respectively. Other contact holes and insulating layers are also the same unless otherwise specified. As described above, since the lower connection portion 3s is included in the gate metal layer 3, the source terminal portion ST of the TFT substrate 101R of Reference Example 1 has excellent reliability, for example, in comparison with a case where the lower connection portion is included in the source metal layer 7.

The opening portion 4s formed in the gate insulating layer 4 is formed to expose only a portion of the lower connection portion 3s. The opening portion 4s formed in the gate insulating layer 4 is inside the lower connection portion 3s when viewed in the direction normal to the dielectric substrate 1. Accordingly, all regions in the opening portion 4s have a laminated structure having the lower connection portion 3s and the upper connection portion 19s on the dielectric substrate 1. In the source terminal portion ST, the outside of the lower connection portion 3s has a laminated structure including the gate insulating layer 4 and the interlayer insulating layer 11. Due to this, the source terminal portion ST of the TFT substrate 101R of Reference Example 1 has excellent reliability. From the viewpoint of obtaining excellent reliability, the sum of the thickness of the gate insulating layer 4 and the thickness of the interlayer insulating layer 11 is preferably large.

The portion of the lower connection portion 3s exposed by the opening portion 4s is covered with the upper connection portion 19s.

Gate Terminal Portion GT

As shown in FIG. 3B, the TFT substrate 101R of Reference Example 1 has the gate terminal portion GT in the non-transmission/reception region R2. As shown in FIG. 3B, the gate terminal portion GT has the same configuration as the source terminal portion ST, for example. The gate terminal portion GT is generally provided for each gate bus line GL.

As shown in FIG. 3B, in this example, the gate terminal portion GT has a gate terminal lower connection portion 3g (may also be referred to simply as the "lower connection portion 3g"), an opening portion 4g formed in the gate insulating layer 4, an opening portion 11g formed in the interlayer insulating layer 11, and a gate terminal upper connection portion 19g (may also be referred to simply as an "upper connection portion 19g").

The lower connection portion 3g is included in the gate metal layer 3 and is electrically connected to the gate bus line GL. In this example, the lower connection portion 3g extends from the gate bus line GL and is formed integrally with the gate bus line GL.

The opening portion 4g formed in the gate insulating layer 4 reaches the lower connection portion 3g.

The opening portion 11g formed in the interlayer insulating layer 11 overlaps the opening portion 4g formed in the gate insulating layer 4 when viewed in the direction normal to the dielectric substrate 1. The opening portion 4g formed in the gate insulating layer 4 and the opening portion 11g formed in the interlayer insulating layer 11 form a contact hole CH_g.

The upper connection portion 19g is included in the upper conductive layer 19. The upper connection portion 19g is formed on the interlayer insulating layer 11 and the contact hole CH_g and is connected to the lower connection portion 3g in the contact hole CH_g. Here, the upper connection portion 19g is in contact with the lower connection portion 3g in the opening portion 4g formed in the gate insulating layer 4.

In this example, the gate terminal portion GT has no conductive portion included in the source metal layer 7.

Since the gate terminal portion GT has the lower connection portion 3g included in the gate metal layer 3, the gate terminal portion GT has excellent reliability in the same manner as the source terminal portion ST.

CS Terminal Portion CT

As shown in FIG. 3B, the TFT substrate 101R of Reference Example 1 has the CS terminal portion CT in the non-transmission/reception region R2. Here, as shown in FIG. 3B, the CS terminal portion CT has the same configuration as the source terminal portion ST and the gate terminal portion GT. For example, the CS terminal portion CT may be provided corresponding to each CS bus line CL.

As shown in FIG. 3B, the CS terminal portion CT has a CS terminal lower connection portion 3c (may also be referred to simply as a "lower connection portion 3c"), an opening portion 4c formed in the gate insulating layer 4, an opening portion 11c formed in the interlayer insulating layer 11, and a CS terminal upper connection portion 19c (may be referred to simply as the "upper connection portion 19c").

The lower connection portion 3c is included in the gate metal layer 3. The lower connection portion 3c is electrically connected to the CS bus line CL. In this example, the lower connection portion 3c extends from the CS bus line CL and is formed integrally with the CS bus line CL.

The opening portion 4c formed in the gate insulating layer 4 reaches the lower connection portion 3c.

The opening portion 11c formed in the interlayer insulating layer 11 overlaps the opening portion 4c formed in the gate insulating layer 4 when viewed in the direction normal to the dielectric substrate 1. The opening portion 4c formed in the gate insulating layer 4 and the opening portion 11c formed in the interlayer insulating layer 11 form a contact hole CH_c.

The upper connection portion 19c is included in the upper conductive layer 19. The upper connection portion 19c is formed on the interlayer insulating layer 11 and in the contact hole CH_c and is connected to the lower connection portion 3c in the contact hole CH_c. Here, the upper connection portion 19c is in contact with the lower connection portion 3c in the opening portion 4c formed in the gate insulating layer 4.

In this example, the CS terminal portion CT has no conductive portion included in the source metal layer 7.

Since the CS terminal portion CT has the lower connection portion 3c included in the gate metal layer 3, the CS terminal portion CT has excellent reliability in the same manner as the source terminal portion ST.

Transfer Terminal Portion PT

As shown in FIG. 3B, the TFT substrate 101R of Reference Example 1 has a first transfer terminal portion PT1 in the non-transmission/reception region R2. Here, the first transfer terminal portion PT1 is provided in the seal region Rs (that is, the first transfer terminal portion PT1 is provided in the seal portion surrounding the liquid crystal layer).

As shown in FIG. 3B and FIG. 4B, the first transfer terminal portion PT1 has a first transfer terminal lower connection portion 3p1 (may also be referred to simply as a "lower connection portion 3p1"), an opening portion 4p1 formed in the gate insulating layer 4, an opening portion 11p1 formed in the interlayer insulating layer 11, and a first transfer terminal upper connection portion 19p1 (may be referred to simply as the "upper connection portion 19p1").

The lower connection portion 3p1 is included in the gate metal layer 3. That is, the lower connection portion 3p1 is formed of the same conductive film as the gate bus line GL. The lower connection portion 3p1 is electrically separated from the gate bus line GL. For example, in a case where the same voltage as the slot voltage is supplied to the CS bus line CL, the lower connection portion 3p1 is electrically connected to the CS bus line CL, for example. As shown in the drawing, the lower connection portion 3p1 may extend from the CS bus line. However, the present disclosure is not limited to this example, and the lower connection portion 3p1 may be electrically separated from the CS bus line.

The opening portion 4p1 formed in the gate insulating layer 4 reaches the lower connection portion 3p1.

The opening portion 11p1 formed in the interlayer insulating layer 11 overlaps the opening portion 4p1 formed in the gate insulating layer 4 when viewed in the direction normal to the dielectric substrate 1. The opening portion 4p1 formed in the gate insulating layer 4 and the opening portion 11p1 formed in the interlayer insulating layer 11 form a contact hole CH_p1.

The upper connection portion 19p1 is included in the upper conductive layer 19. The upper connection portion 19p1 is formed on the interlayer insulating layer 11 and in the contact hole CH_p1 and is connected to the lower connection portion 3p1 in the contact hole CH_p1. Here, the upper connection portion 19p1 is in contact with the lower connection portion 3p1 in the opening portion 4p1 formed in the gate insulating layer 4. The upper connection portion 19p1 is connected to the transfer terminal upper connection portion on the slot substrate side by a sealing material including, for example, conductive particles (refer to FIG. 20B).

In this example, the first transfer terminal portion PT1 has no conductive portion included in the source metal layer 7.

In this example, the lower connection portion 3p1 is arranged between two gate bus lines GL adjacent to each other. The two lower connection portions 3p1 arranged with the gate bus line GL interposed therebetween may be electrically connected via a conductive connection portion (not shown). For example, a conductive connection portion for electrically connecting the two lower connection portions 3p1 may be included in the source metal layer 7.

Here, one contact hole CH_p1 is provided such that the lower connection portion 3p1 is connected to the upper connection portion 19p1; however, it is sufficient if at least one contact hole CH_p1 is provided with respect to one lower connection portion 3p1. A plurality of contact holes may be provided with respect to one lower connection portion 3p1. The number and shape of the contact holes are not limited to the illustrated example.

The second transfer terminal portion PT2 is provided outside the seal region Rs (on the side opposite to the transmission/reception region R1). Here, as shown in FIG. 3B and FIG. 4E, the second transfer terminal portion PT2 has the same cross-sectional structure as the first transfer terminal portion PT1. The second transfer terminal portion PT2 has a second transfer terminal lower connection portion 3p2 (may be referred to simply as the "lower connection portion 3p2"), an opening portion 4p2 formed in the gate insulating layer 4, an opening portion 11p2 formed in the interlayer insulating layer 11, and a second transfer terminal upper connection portion 19p2 (may be referred to simply as the "upper connection portion 19p2").

The lower connection portion 3p2 is included in the gate metal layer 3. Here, the lower connection portion 3p2 extends from the lower connection portion 3p1 for the first transfer terminal and is formed integrally with the lower connection portion 3p1 for the first transfer terminal.

The opening portion 4p2 formed in the gate insulating layer 4 reaches the lower connection portion 3p2.

The opening portion 11p2 formed in the interlayer insulating layer 11 overlaps the opening portion 4p2 formed in the gate insulating layer 4 when viewed in the direction normal to the dielectric substrate 1. The opening portion 4p2 formed in the gate insulating layer 4 and the opening portion 11p2 formed in the interlayer insulating layer 11 form a contact hole CH_p2.

The upper connection portion 19p2 is included in the upper conductive layer 19. The upper connection portion 19p2 is formed on the interlayer insulating layer 11 and in the contact hole CH_p2 and is connected to the lower connection portion 3p2 in the contact hole CH_p2. Here, the upper connection portion 19p2 is in contact with the lower connection portion 3p2 in the opening portion 4p2 formed in the gate insulating layer 4.

Also in the second transfer terminal portion PT2, the upper connection portion 19p2 may be connected to the transfer terminal upper connection portion on the slot substrate side by a sealing material including, for example, conductive particles.

In this example, the second transfer terminal portion PT2 has no conductive portion included in the source metal layer 7.

First Method of Manufacturing the TFT Substrate 101R of Reference Example 1

When the TFT substrate 101R of Reference Example 1 is used, a problem in that a metal element (Cu or Al) is eluted from the source metal layer 7 into the liquid crystal layer occurs because the source metal layer is exposed from the inorganic layer by defects being formed in the inorganic layer covering the source metal layer in the manufacturing method described below. The defects of the inorganic layer are formed, in particular, due to the process of forming the source contact portion 6S, the drain contact portion 6D, the lower source metal layer S1, and the upper source metal layer S2.

With reference to FIG. 6A to FIG. 8D, a description will be given of the first method of manufacturing the TFT substrate 101R of Reference Example 1.

FIG. 6A to FIG. 6D, FIG. 7A to FIG. 7C, and FIG. 8A to FIG. 8D are schematic cross-sectional views for illustrating the first method of manufacturing the TFT substrate 101R of Reference Example 1. Each of these diagrams shows a cross-section corresponding to FIG. 4A, FIG. 4C, and FIG. 4D (the A-A' cross-section, the C-C' cross-section, and the D-D' cross-section of the TFT substrate 101R of Reference Example 1).

Figure 6A:
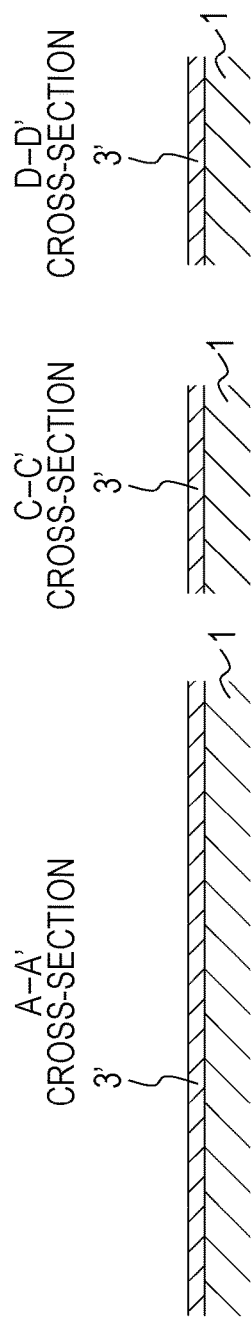
FIG. 6A to FIG. 6D are schematic cross-sectional views for illustrating a first method of manufacturing the TFT substrate of Reference Example 1.

First, as shown in FIG. 6A, a gate conductive film 3' is formed on the dielectric substrate 1 by a sputtering method or the like. The material of the gate conductive film 3' is not particularly limited and, for example, it is possible to appropriately use metals such as aluminum (Al), tungsten (W), molybdenum (Mo), tantalum (Ta), chromium (Cr), titanium (Ti), and copper (Cu), or alloys thereof, or a film including a metal nitride thereof. Here, as the gate conductive film 3', a laminated film (MoN/Al) is formed in which an Al film (thickness: 150 nm, for example) and a MoN film (thickness: 100 nm, for example) are laminated in this order.

Figure 6B:

Next, the gate conductive film 3' is patterned to form the gate metal layer 3 as shown in FIG. 6B. Specifically, the gate electrode 3G, a gate bus line GL, an auxiliary capacitance counter electrode 3C, and a CS bus line CL are formed in the antenna unit forming region, the source lower connection wiring 3sg is formed in the source-gate connection portion forming region, and lower connection portions 3s, 3g, 3c, 3p1, and 3p2 are formed in each terminal portion forming region. Here, patterning of the gate conductive film 3' is performed by, for example, wet etching.

Figure 6C:
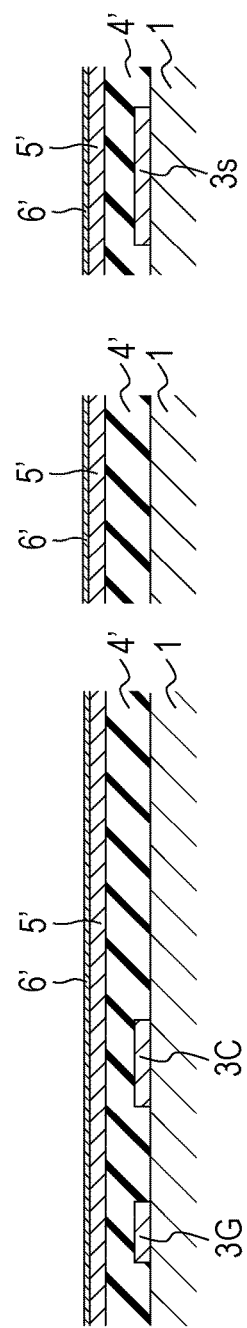

Thereafter, as shown in FIG. 6C, a gate insulating film 4', an intrinsic amorphous silicon film 5', and an n+ type amorphous silicon film 6' are formed in this order to cover the gate metal layer 3. It is possible to form the gate insulating film 4' by a CVD method or the like. As the gate insulating film 4', it is possible to appropriately use a silicon oxide (SiOx) film, a silicon nitride (SixNy) film, a silicon oxynitride (SiOxNy; x>y) film, a silicon nitride oxide (SiNxOy; x>y), and the like. Here, as the gate insulating film 4', for example, a silicon nitride (SixNy) film having a thickness of 350 nm is formed. Further, for example, the intrinsic amorphous silicon film 5' having a thickness of 120 nm and, for example, the n+ type amorphous silicon film 6' having a thickness of 30 nm are formed. Alternatively, a crystalline silicon film (for example, a polysilicon film) may be formed as the intrinsic amorphous silicon film 5'.

Figure 6D:
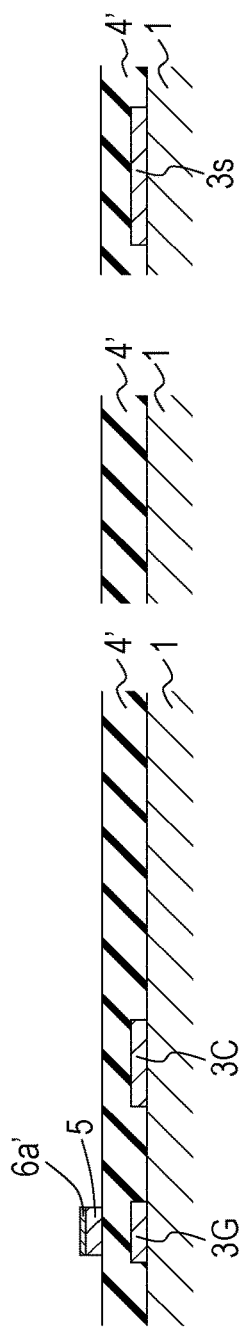

Next, the intrinsic amorphous silicon film 5' and the n+ type amorphous silicon film 6' are patterned to form the island-shaped semiconductor layer 5 and a contact portion 6a' as shown in FIG. 6D. Here, patterning of the intrinsic amorphous silicon film 5' and the n+ type amorphous silicon film 6' is carried out by etching using dry etching utilizing the same etching mask (photoresist), for example. The contact portion 6a' is formed to be in contact with the upper surface of the semiconductor layer 5.

Next, as shown in FIG. 7A, a source lower conductive film S1' is formed on the gate insulating film 4' and on the contact portion 6a' by a sputtering method or the like, and a source upper conductive film S2' is formed on the source lower conductive film S1'. Thereafter, a resist layer 80 is formed on the source upper conductive film S2' using a photoresist. The source lower conductive film S1' includes at least one element selected from the group consisting of Ti, Ta, and W, and the source upper conductive film S2' includes Cu or Al. Here, a Ti film (thickness: 20 nm, for example) is formed as the source lower conductive film S1', and a Cu film (thickness: 500 nm, for example) is formed as the source upper conductive film S2' (in such a case, the source metal layer 7 to be formed has a laminated structure (Cu/Ti) in which a Ti layer and a Cu layer are laminated in this order). Alternatively, a Ti film (thickness: 20 nm, for example) may be formed as the source lower conductive film S1' and a laminated film (MoN/Al) in which an Al film (thickness: 750 nm, for example) as the source upper conductive film S2' and a MoN film (thickness: 100 nm, for example) are laminated in this order may be formed (in such a case, the source metal layer 7 to be formed has a laminated structure (MoN/Al/Ti) in which a Ti layer, an Al layer, and an MoN layer are laminated in this order).

Next, as shown in FIG. 7B, the upper source metal layer S2 is formed by etching the source upper conductive film S2'. In addition, as shown in FIG. 7C, the lower source metal layer S1 is formed by etching the source lower conductive film S1', and the contact portion 6a' is etched to form the source contact portion 6S and the drain contact portion 6D. As described below, patterning of the source lower conductive film S1' and the source upper conductive film S2' is performed for both with the resist layer 80 as an etching mask. Due to this, the source metal layer 7 having a laminated structure including the lower source metal layer S1 and the upper source metal layer S2 is formed. The source metal layer 7 includes the source electrode 7S, the drain electrode 7D, a source bus line SL, an auxiliary capacitance electrode 7C, and the patch electrode 15 in the antenna unit forming region, and includes the source bus line connection portion 7sg in the source-gate connection portion forming region. Since the source metal layer 7 has the above-described laminated structure, each of the source electrode 7S, the drain electrode 7D, the source bus line SL, the auxiliary capacitance electrode 7C, the patch electrode 15, and the source bus line connection portion 7sg includes the lower source metal layer S1 and the upper source metal layer S2. The source contact portion 6S is formed to connect the semiconductor layer 5 and the source electrode 7S, and the drain contact portion 6D is formed to connect the semiconductor layer 5 and the drain electrode 7D.

Specifically, first, the source upper conductive film S2' is etched by wet etching or dry etching with the resist layer 80 as an etching mask to form the upper source metal layer S2 as shown in FIG. 7B. In this etching step, an etchant having a large etching selection ratio with respect to the etching rate of the source lower conductive film S1' is used.

For example, in a case where a Cu film is formed as the source upper conductive film S2', etching of the source upper conductive film S2' is performed using, for example, a mixed acid aqueous solution. In a case of forming a laminated film (MoN/Al) in which an Al film and a MoN film are laminated in this order as the source upper conductive film S2', etching of the source upper conductive film S2' is performed using an aqueous solution including phosphoric acid, nitric acid, and acetic acid. At this time, the MoN film and the Al film are etched using the same etchant. The present disclosure is not limited thereto, and the MoN film and the Al film may be etched using different etchants.

Next, the source lower conductive film S1' and the contact portion 6a' are etched by dry etching with the resist layer 80 as an etching mask to form the lower source metal layer S1 and the source contact portion 6S and the drain contact portion 6D which are separated from each other as shown in FIG. 7C. Here, etching of the source lower conductive film S1' and the contact portion 6a' is performed using a chlorine-based gas, for example.

As shown in FIG. 7B, at the point of time before this dry etching step is performed, the region exposed from the resist layer 80 includes a region ra having the contact portion 6a' and a region rb not having contact portion 6a'. Both the region ra and the region rb have the source lower conductive film S1'. In the dry etching step, in comparison with the region ra, the source lower conductive film S1' and/or the gate insulating film 4' is over-etched in the region rb by an amount that does not have the contact portion 6a'. If the etching rate of the source lower conductive film S1' is higher than the etching rate of the source upper conductive film S2' with the etchant used in this dry etching step, the edge of the lower source metal layer S1 comes inside the edge of the upper source metal layer S2 as shown in FIG. 7C. That is, the side etching also etches (undercuts) the portion of the source lower conductive film S1' under the resist layer 80 which is the etching mask. Due to this, the side surface of the source metal layer 7 has a reverse taper shape. In addition, for example, as shown in FIG. 7C, the gate insulating film 4' is etched in a region GE along the edge of the lower source metal layer S1.

Here, from the viewpoint of suppressing process damage to the semiconductor layer 5, this dry etching step is preferably performed under a condition with a low etching rate of the semiconductor layer 5. From such a viewpoint, when the etching conditions (for example, the etchant) are selected, the side surface of the source metal layer 7 may have a reverse taper shape as described above.

Here, in the source-gate connection portion forming region, the source metal layer 7 is formed so that at least a portion of the source lower connection wiring 3sg does not overlap with the source bus line connection portion 7sg. In addition, each terminal portion forming region has no conductive portion included in the source metal layer 7.

Next, the resist layer 80 is removed, and thereafter, as shown in FIG. 8A, an interlayer insulating film 11' is formed to cover the TFT 10 and the source metal layer 7. The interlayer insulating film 11' is formed by a CVD method, for example. As the interlayer insulating film 11', it is possible to appropriately use a silicon oxide (SiOx) film, a silicon nitride (SixNy) film, a silicon oxynitride (SiOxNy; x>y) film, a silicon nitride oxide (SiNxOy; x>y), and the like. In this example, the interlayer insulating film 11' is formed to be in contact with the channel region of the semiconductor layer 5. Here, as the interlayer insulating film 11', for example, a silicon nitride (SixNy) film having a thickness of 100 nm is formed.

At this time, since the source metal layer 7 has a side surface with a reverse taper shape, the interlayer insulating film 11' may not be able to completely cover the side surface of the source metal layer 7. That is, the defect (for example, a discontinuous portion) 11d is formed in the interlayer insulating film 11'. Etching the region GE (refer to FIG. 7C) along the edge of the lower source metal layer S1 in the gate insulating film 4' may make the defects (discontinuous portions) 11d of the interlayer insulating film 11' larger. Depending on the thicknesses of the upper source metal layer S2 and the lower source metal layer S1, for example, in a case where the thickness of the interlayer insulating film 11' is 200 nm or less, the defect 11d tends to occur in the interlayer insulating film 11'.

Subsequently, as shown in FIG. 8B, the etching of the interlayer insulating film 11' and the gate insulating film 4' is performed using a known photolithography process to form the interlayer insulating layer 11 and the gate insulating layer 4. Specifically, in the source-gate connection portion forming region, the contact hole CH_sg1 reaching the source lower connection wiring 3sg is formed in the gate insulating film 4' and the interlayer insulating film 11', and the opening portion 11sg2 reaching the source bus line connection portion 7sg (contact hole CH_sg2) is formed in the interlayer insulating film 11'. In each terminal portion forming region, contact holes CH_s, CH_g, CH_c, CH_p1, and CH_p2 reaching the lower connection portions 3s, 3g, 3c, 3p1, and 3p2 respectively are formed in the interlayer insulating film 11' and the gate insulating film 4'.

In this etching step, the interlayer insulating film 11' and the gate insulating film 4' are etched with the source metal layer 7 as an etch stop.

In the source-gate connection portion forming region, the interlayer insulating film 11' and the gate insulating film 4' are etched as a batch in a region overlapping the source lower connection wiring 3sg (for example, etching is performed using the same etching mask and the same etchant), while the interlayer insulating film 11' is etched in the region overlapping the source bus line connection portion 7sg due to the source bus line connection portion 7sg functioning as an etch stop. Due to this, contact holes CH_sg1 and CH_sg2 are obtained.

The contact hole CH_sg1 has the opening portion 4sg1 formed in the gate insulating layer 4 and the opening portion 11sg1 formed in the interlayer insulating layer 11. Here, since at least a portion of the source lower connection wiring 3sg is formed to not overlap the source bus line connection portion 7sg, the contact hole CH_sg1 is formed in the gate insulating film 4' and the interlayer insulating film 11'. The side surface of the opening portion 4sg1 may be aligned with the side surface of the opening portion 11sg1 on the side surface of the contact hole CH_sg1.

In the present specification, "the side surfaces are aligned" for two or more different layers in the contact hole means not only a case the side surfaces exposed in the contact hole in these layers are flush in the vertical direction, but also includes a case where inclined surfaces with a tapered shape or the like are continuously formed. It is possible to obtain such a configuration, for example, by etching these layers with the same mask, by etching the lower layer with the upper layer as a mask, or the like.

In the source terminal portion forming region, the interlayer insulating film 11' and the gate insulating film 4' are etched as a batch to form the contact hole CH_s. The contact hole CH_s has the opening portion 4s formed in the gate insulating film 4' and the opening portion 11s formed in the interlayer insulating film 11'. The side surface of the opening portion 4s may be aligned with the side surface of the opening portion 11s on the side surface of the contact hole CH_s.

In the gate terminal portion forming region, the interlayer insulating film 11' and the gate insulating film 4' are etched as a batch to form the contact hole CH_g. The contact hole CH_g has the opening portion 4g formed in the gate insulating film 4' and the opening portion 11g formed in the interlayer insulating film 11'. The side surface of the opening portion 4g may be aligned with the side surface of the opening portion 11g on the side surface of the contact hole CH_g.

In the CS terminal portion forming region, the interlayer insulating film 11' and the gate insulating film 4' are etched as a batch to form the contact hole CH_c. The contact hole CH_c has the opening portion 4c formed in the gate insulating film 4' and the opening portion 11c formed in the interlayer insulating film 11'. The side surface of the opening portion 4c may be aligned with the side surface of the opening portion 11c on the side surface of the contact hole CH_c.

In the first transfer terminal portion forming region, the interlayer insulating film 11' and the gate insulating film 4' are etched as a batch to form the contact hole CH_p1. The contact hole CH_p1 has the opening portion 4p1 formed in the gate insulating film 4' and the opening portion 11p1 formed in the interlayer insulating film 11'. The side surface of the opening portion 4p1 may be aligned with the side surface of the opening portion 11p1 on the side surface of the contact hole CH_p1.

In the second transfer terminal portion forming region, the interlayer insulating film 11' and the gate insulating film 4' are etched as a batch to form the contact hole CH_p2. The contact hole CH_p2 has the opening portion 4p2 formed in the gate insulating film 4' and the opening portion 11p2 formed in the interlayer insulating film 11'. The side surface of the opening portion 4p2 may be aligned with the side surface of the opening portion 11p2 on the side surface of the contact hole CH_p2.

Next, as shown in FIG. 8C, on the interlayer insulating layer 11, an upper conductive film 19' is formed by, for example, a sputtering method in the contact hole CH_s, the contact hole CH_g, the contact hole CH_c, the contact hole CH_p1, and the contact hole CH_p2. The upper conductive film 19' includes, for example, a transparent conductive film. As the transparent conductive film, it is possible to use, for example, an ITO (indium tin oxide) film, an IZO film, a ZnO film (zinc oxide film), or the like. Here, for example, an ITO film having a thickness of 70 nm is used as the upper conductive film 19'. Alternatively, a laminated film (ITO/Ti) in which Ti (thickness: 50 nm, for example) and ITO (thickness: 70 nm, for example) are laminated in this order may be used as the upper conductive film 19'. Instead of the Ti film, one film or a laminated film of two or more films selected from the group consisting of a MoNbNi film, a MoNb film, a MoW film, a W film, and a Ta film may be used. That is, as the upper conductive film 19', a laminated film in which one film or a laminated film of two or more films selected from the group consisting of a Ti film, a MoNbNi film, a MoNb film, a MoW film, a W film, and a Ta film, and an ITO film are laminated in this order may be used.

Next, by patterning the upper conductive film 19', the upper conductive layer 19 is formed as shown in FIG. 8D. Specifically, in the source-gate connection portion forming region, the upper connection portion 19sg connected to the source lower connection wiring 3sg in the contact hole CH_sg1 and connected to the source bus line connection portion 7sg in the contact hole CH_sg2 is formed. The upper connection portion 19s in contact with the lower connection portion 3s in the contact hole CH_s is formed in the source terminal portion forming region, the upper connection portion 19g in contact with the lower connection portion 3s in the contact hole CH_g is formed in the gate terminal portion forming region, the upper connection portion 19c in contact with the lower connection portion 3c in the contact hole CH_c is formed in the CS terminal portion forming region, the upper connection portion 19p1 in contact with the lower connection portion 3p1 in the contact hole CH_p1 is formed in the first transfer terminal portion forming region, and the upper connection portion 19p2 in contact with the lower connection portion 3p2 in the contact hole CH_p2 is formed in the second transfer terminal portion forming region. In a case of forming a laminated film (ITO/Ti) in which a Ti film and an ITO film are laminated in this order as the upper conductive film 19', for example, the ITO film is wet etched using oxalic acid and then the Ti film is dry etched using a chlorine-based gas.

Due to this, the antenna unit region U, the source-gate connection portion SG, the source terminal portion ST, the gate terminal portion GT, the CS terminal portion CT, the first transfer terminal portion PT1, and the second transfer terminal portion PT2 are obtained.

In this manner, the TFT substrate 101R of Reference Example 1 is manufactured.

As shown in FIG. 8B, when the upper conductive film 19' is formed on the interlayer insulating layer 11, it is possible to cover the side surface of the source metal layer 7 exposed to the defect 11d with the upper conductive film 19'. However, as shown in FIG. 8D, since the upper conductive layer 19 is not formed in the antenna unit region U in the manufactured TFT substrate 101R of Reference Example 1, in the antenna unit forming region U of the TFT substrate 101R of Reference Example 1, there are places where the lower source metal layer S1 and the upper source metal layer S2 are exposed without being covered with the inorganic layer (here, including the interlayer insulating layer 11 and the upper conductive layer 19).

In addition, as shown in FIG. 8D, in the source-gate connection portion SG, the upper connection portion 19sg is formed to not cover the side surface of the source bus line connection portion 7sg. Due to this, also in the source-gate connection portion SG, there may be places where the lower source metal layer S1 and the upper source metal layer S2 are exposed without being covered with the inorganic layer (here, including the interlayer insulating layer 11 and the upper conductive layer 19).

Second Method of Manufacturing TFT Substrate 101R of Reference Example 1

The TFT substrate 101R of Reference Example 1 is also manufactured by the method described below.

With reference to FIG. 9A to FIG. 9C, a description will be given of the second method of manufacturing the TFT substrate 101R of Reference Example 1.

The second method of manufacturing the TFT substrate 101R of Reference Example 1 is different from the first manufacturing method described with reference to FIG. 6A to FIG. 8D in the method of forming the source contact portion 6S, the drain contact portion 6D, the lower source metal layer S1, and the upper source metal layer S2. In the first manufacturing method, the source upper conductive film S2' is etched (wet etching or dry etching), and then the source lower conductive film S1' and the contact portion 6a' are etched by dry etching. In contrast, in the second manufacturing method, the source upper conductive film S2' and the source lower conductive film S1' are etched (wet etching or dry etching), and then the contact portion 6a' is etched by dry etching.

FIG. 9A to FIG. 9C are schematic cross-sectional views for illustrating the second method of manufacturing the TFT substrate 101R of Reference Example 1. These diagrams respectively show the cross-sections corresponding to FIG. 4A, FIG. 4C, and FIG. 4D (the A-A' cross-section, the C-C' cross-section, and the D-D' cross-section of the TFT substrate 101R of Reference Example 1). A description will be mostly given below of differences from the first manufacturing method.

First, as shown in FIG. 6A to FIG. 6D, the gate metal layer 3, the gate insulating film 4', the island-shaped semiconductor layer 5, and the contact portion 6a' are formed on the dielectric substrate 1.

Next, as shown in FIG. 9A, the source lower conductive film S1' is formed on the gate insulating film 4' and on the contact portion 6a' by a sputtering method or the like, and the source upper conductive film S2' is formed on the source lower conductive film S1'. Thereafter, the resist layer 80 is formed on the source upper conductive film S2' using a photoresist. For example, the films exemplified in the first manufacturing method may be formed as the source lower conductive film S1' and the source upper conductive film S2'. Alternatively, a Ti film (thickness: 100 nm, for example) may be formed as the source lower conductive film S1', and a laminated film (Ti/Al) in which an Al film (thickness: 750 nm, for example) and a Ti film (thickness: 50 nm, for example) are laminated in this order may be formed as the source upper conductive film S2' (in such a case, the source metal layer 7 to be formed has a laminated structure (Ti/Al/Ti) in which a Ti layer, an Al layer, and a Ti layer are laminated in this order).

Next, as shown in FIG. 9B, the upper source metal layer S2 and the lower source metal layer S1 are formed by etching the source upper conductive film S2' and the source lower conductive film S1' by wet etching or dry etching with the resist layer 80 as an etching mask. In this etching step, the etching rate of the source lower conductive film S1' is the etching rate of the source upper conductive film S2' or lower. Accordingly, at the point of time when this etching step is completed, the edge of the lower source metal layer S1 does not come inside of the edge of the upper source metal layer S2. For simplicity, FIG. 9B shows an example in which the edge of the lower source metal layer S1 and the edge of the upper source metal layer S2 are flush with each other when viewed in the direction normal to the dielectric substrate 1 at the point of time when the etching step is completed. However, the present disclosure is not limited to the example shown in the drawing and the edge of the lower source metal layer S1 may be outside the edge of the upper source metal layer S2 when viewed in the direction normal to the dielectric substrate 1 at the point of time when the etching step is completed.

For example, in a case where a Ti film is formed as the source lower conductive film S1' and a Cu film is formed as the source upper conductive film S2', the etching of the source upper conductive film S2' and the source lower conductive film S1' is performed by wet etching using a mixed acid aqueous solution, for example. In a case where a Ti film is formed as the source lower conductive film S1' and a laminated film (MoN/Al) in which the Al film and the MoN film are laminated in this order is formed as the source upper conductive film S2', the source upper conductive film S2' and the source lower conductive film S1' are etched by wet etching using a mixed acid aqueous solution. In a case where a Ti film is formed as the source lower conductive film S1' and a laminated film (Ti/Al) in which the Al film and the Ti film are laminated in this order is formed as the source upper conductive film S2', the source upper conductive film S2' and the source lower conductive film S1' are etched by dry etching using a chlorine-based gas. It is also possible to etch the laminated film of the Al film and the Ti film by wet etching using a known etching liquid without being limited to the dry etching.

Although etching of the source upper conductive film S2' and the source lower conductive film S1' may be performed using a plurality of etchants, it is preferable to satisfy a condition in which the etching rate of the source lower conductive film S1' is the same as the etching rate of the source upper conductive film S2' or lower. For example, in the above example, the Ti film and the Al film are etched using the same etchant, but without being limited thereto, the Ti film and the Al film may be etched using different etchants.

Next, the contact portion 6a' is etched by dry etching with the resist layer 80 as an etching mask, such that the source contact portion 6S and the drain contact portion 6D separated from each other are formed as shown in FIG. 9C. Here, the etching of the contact portion 6a' is performed using, for example, a chlorine-based gas.

As shown in FIG. 9B, at the point of time before the dry etching step is performed, the region exposed from the resist layer 80 includes a region ra' having the contact portion 6a' and a region rb' having no contact portion 6a'. The regions ra' and rb' are different from the first manufacturing method in that these regions do not have the source lower conductive film S1'. In the dry etching step, compared to the region ra', side etching of the source lower conductive film S1' and/or over-etching of the gate insulating film 4' is performed in the region rb' to the extent that there is no contact portion 6a'. If the etching rate of the etchant used in this dry etching step for the lower source metal layer S1 is higher than the etching rate for the upper source metal layer S2, the lower source metal layer S1 is further etched in the dry etching step. Accordingly, as shown in FIG. 9C, the edge of the lower source metal layer S1 comes inside the edge of the upper source metal layer S2. That is, a portion of the lower source metal layer S1 under the resist layer 80 which is an etching mask is also etched by the side etching. Due to this, the side surface of the source metal layer 7 has a reverse taper shape. In addition, as shown in FIG. 9C, for example, the gate insulating film 4' is etched in the region GE along the edge of the lower source metal layer S1.

Here, from the viewpoint of suppressing process damage to the semiconductor layer 5, this dry etching step is preferably performed under a condition in which the etching rate of the semiconductor layer 5 is low. When etching conditions (for example, etchant) are selected from such a viewpoint, the side surface of the source metal layer 7 may have a reverse taper shape as described above.

Thereafter, the TFT substrate 101R of Reference Example 1 is manufactured by performing the same steps as the steps described with reference to FIG. 8A to FIG. 8C. As described with reference to FIG. 8A to FIG. 8C, since the side surface of the source metal layer 7 has a reverse taper shape, the defect 11d is generated in the interlayer insulating layer 11. Due to this, in the antenna unit region U of the TFT substrate 101R of Reference Example 1, a place is generated in which the lower source metal layer S1 and the upper source metal layer S2 are exposed without being covered with the inorganic layer.

Structure of the TFT Substrate 101A (Antenna Unit Region U)

A description will be given of the structure of the antenna unit region U of the transmission/reception region R1 of the TFT substrate 101A of the present embodiment with reference to FIG. 10A and FIG. 11A.

FIG. 10A is a schematic plan view of the antenna unit region U of the transmission/reception region R1 of the TFT substrate 101A. FIG. 11A is a schematic cross-sectional view of the TFT substrate 101A, and shows a cross-section along line A-A' in FIG. 10A.

Figure 11A:
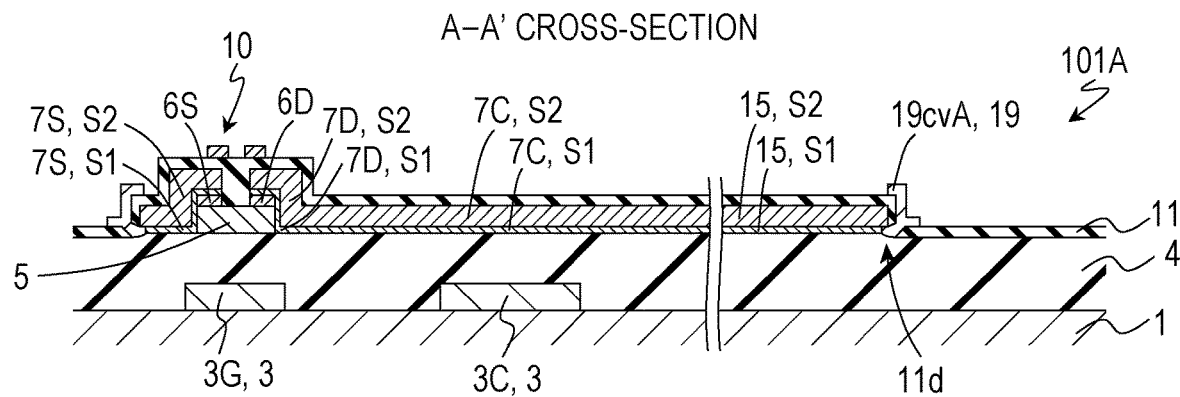
FIG. 11A to FIG. 11E are schematic cross-sectional views of the TFT substrate.

As shown in FIG. 10A and FIG. 11A, the TFT substrate 101A has the dielectric substrate 1 and a plurality of antenna unit regions U arranged on the dielectric substrate 1 and each having the TFT 10, the patch electrode 15 electrically connected to the drain electrode 7D of the TFT 10. The TFT substrate 101A has the semiconductor layer 5 of the TFT 10, the gate metal layer 3 including the gate electrode 3G of the TFT 10, the gate insulating layer 4 formed between the gate metal layer 3 and the semiconductor layer 5, the source metal layer 7 formed on the semiconductor layer 5 and including the source electrode 7S and the drain electrode 7D electrically connected to the semiconductor layer 5, the source contact portion 6S formed between the semiconductor layer 5 and the source electrode 7S, and a contact layer 6 including the drain contact portion 6D formed between the semiconductor layer 5 and the drain electrode 7D. The source metal layer 7 has a laminated structure including the lower source metal layer S1 including at least one element selected from the group consisting of Ti, Ta, and W and the upper source metal layer S2 formed on the lower source metal layer S1 and including Cu or Al. The edge of the lower source metal layer S1 is positioned inside the edge of the upper source metal layer S2 when viewed in the direction normal to the dielectric substrate 1. When viewed in the direction normal to the dielectric substrate 1, the edges of the lower source metal layer S1 and the edge of the upper source metal layer S2 in the plurality of antenna unit regions U are covered with at least two inorganic layers (here, the interlayer insulating layer 11 and the upper conductive layer 19). In this example, the interlayer insulating layer 11 is formed to cover substantially the entire surface of the antenna unit region U, and an upper conductive layer 19cvA of the antenna unit region U is formed to cover the edge of the lower source metal layer S1 and the edge of the upper source metal layer S2 of the plurality of antenna unit regions U when viewed in the direction normal to the dielectric substrate 1.

Here, "covered with at least two inorganic layers" means covered with a plurality of inorganic layers formed using etching masks different to each other. That is, inorganic layers having a laminated structure formed using the same etching mask count as one inorganic layer. The inorganic layer means a layer not including an organic compound but formed from an inorganic compound (including an inorganic oxide, an inorganic nitride, a metal oxide, a metal nitride, and mixtures thereof). The inorganic layer may be an insulating layer or a conductive layer. The inorganic insulating layer is, for example, a silicon oxide layer, a silicon nitride layer, a silicon oxynitride layer, or a silicon nitride oxide layer, and the inorganic conductive layer include, for example, an oxide conductive layer (also referred to as a transparent conductive layer) such as an ITO layer or an IZO layer (IZO is a registered trademark).

In the TFT substrate 101A, the upper source metal layer S2 and the lower source metal layer S1 exposed from the defect 11d of the interlayer insulating layer 11 are covered with the upper conductive layer 19. Due to this, in the scanning antenna 1000A provided with the TFT substrate 101A, it is possible to suppress metal ions (Cu ions or Al ions) from eluting from the source metal layer 7 into the liquid crystal layer LC. It is possible for the scanning antenna 1000A to suppress deterioration of the antenna performance. A description will be given of this effect with reference to FIG. 13.

Figure 13:
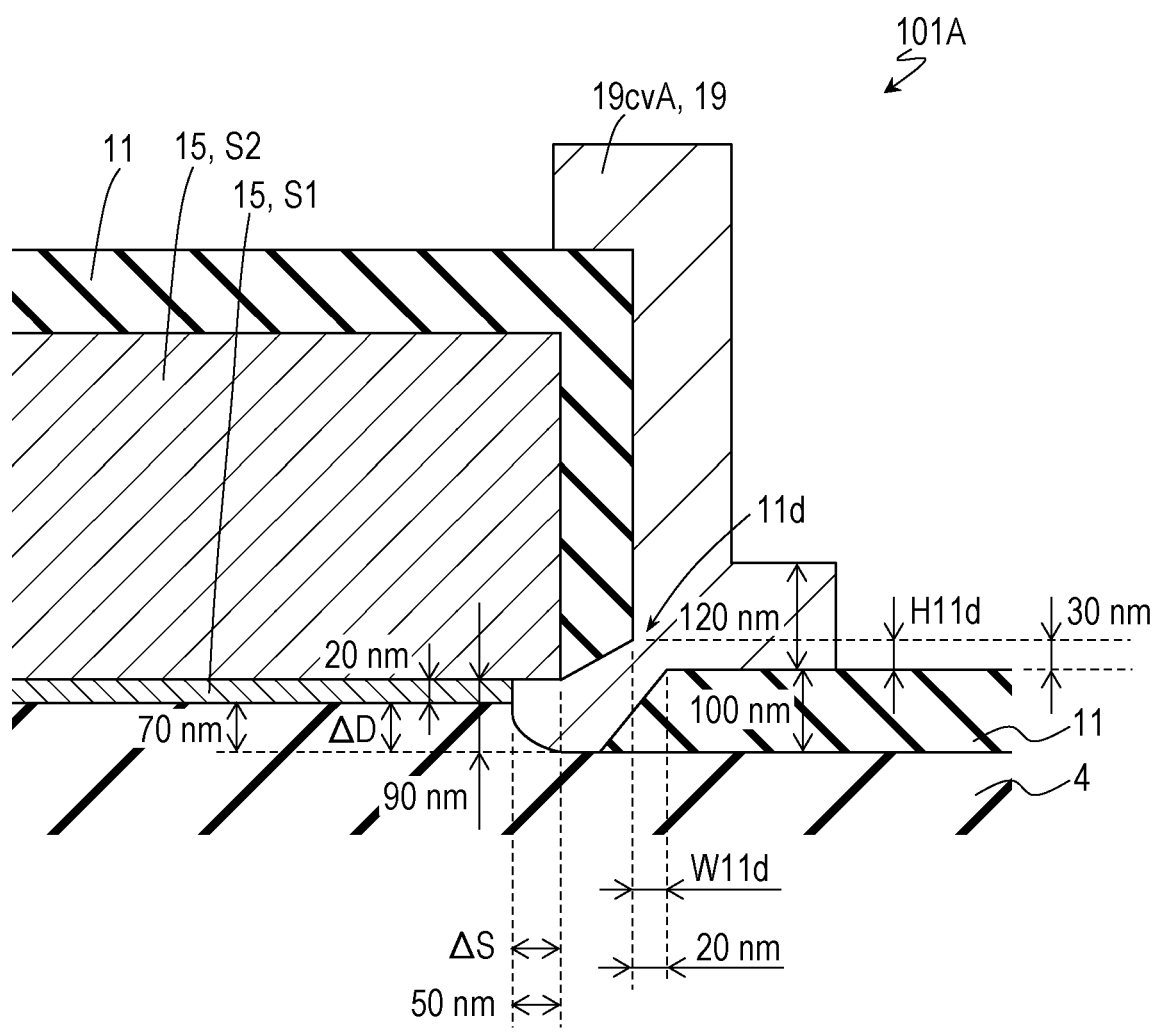
FIG. 13 is a schematic cross-sectional view of the TFT substrate and a view showing a portion in FIG. 11A in an enlarged manner.

FIG. 13 is a schematic cross-sectional view of the TFT substrate 101A showing a portion in FIG. 11A in an enlarged manner. As an example of the present embodiment, the thicknesses of each layer and the like are illustrated in FIG. 13, but the numerical values are examples, and the present embodiment is not limited thereto. For example, as shown in FIG. 13, the TFT substrate 101A has a Ti layer having a thickness of 20 nm as the lower source metal layer S1 and has a silicon nitride (SixNy) layer having a thickness of 100 nm as the interlayer insulating layer 11, and the upper conductive layer 19 has a laminated structure (ITO/Ti) in which a Ti layer (thickness: 50 nm) and an ITO layer (thickness: 70 nm) are laminated in this order. The edge of the lower source metal layer S1 is δS (50 nm in this example) to the inside from the edge of the upper source metal layer S2. As described with reference to FIG. 7A to FIG. 7C and FIG. 9A to FIG. 9C, the gate insulating layer 4 is etched in the step of dry etching the contact portion 6a' in order to form the source contact portion 6S and the drain contact portion 6D. The etching amount in the depth direction is represented by 6D (70 nm in this example). In the in-plane direction (plane parallel to the substrate surface), side etching is performed at 6S from the edge of the upper source metal layer S2, for example. In the illustrated example, the side etching amount of the gate insulating layer 4 is equal to the side etching amount 6S of the lower source metal layer S1, but is not limited thereto. The defect 11d is generated in the interlayer insulating layer 11 due to the reverse tapered side surface of the source metal layer 7. Here, a width W11d of the defect 11d is 20 nm, and a height H11d of the defect 11d is 30 nm. Since the thickness (120 nm) of the upper conductive layer 19 is sufficiently larger than the width W11d and the height H11d of the defect 11d, it is possible to cover the source metal layer 7 exposed from the defect 11d.

As described above, the defect 11d of the interlayer insulating layer 11 tends to occur in a case where the thickness of the interlayer insulating layer 11 is small (for example, 200 nm or less). Conditions under which the defect 11d of the interlayer insulating layer 11 tends to occur are not limited thereto. For example, when the thickness of the lower source metal layer S1 is large (for example, 20 nm or more), the defect 11d of the interlayer insulating layer 11 tends to occur. In addition, when the side etching amount 6S of the lower source metal layer S1 is large (for example, 20 nm or more), the defect 11d of the interlayer insulating layer 11 tends to occur. When the etching amount 6D in the depth direction of the gate insulating layer 4 is large (for example, 30 nm or more), the defect 11d of the interlayer insulating layer 11 tends to occur.

Even if the interlayer insulating layer 11 is formed by side etching of the lower source metal layer S1 and the gate insulating layer 4, it is possible to form a space (cavity) inside the interlayer insulating layer 11. The size of this space is characterized by the side etching amount 6S of the lower source metal layer S1 and the gate insulating layer 4, the etching amount 6D in the depth direction of the gate insulating layer 4, the thickness of the lower source metal layer S1, and the like. For simplicity, the drawings show that the space formed inside the interlayer insulating layer 11 is completely filled with the upper conductive layer 19, but the present embodiment is not limited thereto. The upper source metal layer S2 and the lower source metal layer S1 may not be exposed from the inorganic layer (the upper conductive layer 19 and the interlayer insulating layer 11). That is, it is sufficient if the upper source metal layer S2 and the lower source metal layer S1 exposed from the defect 11d of the interlayer insulating layer 11 is covered with the upper conductive layer 19, and the space formed inside the interlayer insulating layer 11 may not be completely filled with the upper conductive layer 19.

As described above, the upper conductive layer 19 includes, for example, a transparent conductive layer (for example, an ITO layer). The upper conductive layer 19 may be formed of only a transparent conductive layer, for example. The upper conductive layer 19 preferably has a laminated structure including a first layer including a transparent conductive layer and a second layer formed under the first layer. The second layer is formed, for example, of one layer or a laminate of two or more layers selected from the group consisting of a Ti layer, a MoNbNi layer, a MoNb layer, a MoW layer, a W layer, and a Ta layer. In order to more reliably cover the reverse tapered side surface of the source metal layer 7, the thickness of the upper conductive layer 19 is preferably 20 nm or more. The thickness of the second layer may be, for example, 40 nm or more.

As described above, the upper conductive layer 19 is a conductive layer including an upper connection portion of each terminal portion. Since the edge of the lower source metal layer S1 and the edge of the upper source metal layer S2 in the antenna unit region U are covered with at least two inorganic layers including the upper conductive layer 19, it is possible for the TFT substrate 101A to suppress deterioration of the antenna performance. That is, since there is no need to separately form an inorganic layer, it is possible for the TFT substrate 101A to suppress the deterioration of the antenna performance while suppressing an increase in the number of manufacturing steps (for example, the number of photomasks) and the manufacturing cost.

Here, in the TFT substrate 101R of Reference Example 1, it is also thought that it is possible to avoid the occurrence of the defect 11d of the interlayer insulating layer 11 by increasing the thickness of the interlayer insulating layer 11. However, in general, from the viewpoint of antenna performance, the thickness of the inorganic layer (particularly the inorganic insulating layer) covering the patch electrode is preferably small. For example, when the thickness of the interlayer insulating layer 11 is large, the width of variations in the thickness of the interlayer insulating layer 11 increases. When the thickness of the interlayer insulating layer 11 varies, the thickness of the liquid crystal layer also varies. As a result, the electrostatic capacitance between the patch electrode and the slot electrode may vary.

A more detailed description will be given of the structure of the antenna unit region U of the TFT substrate 101A.

As shown in FIG. 10A and FIG. 11A, the TFT substrate 101A has the gate metal layer 3 supported on the dielectric substrate 1, the semiconductor layer 5 formed on the gate metal layer 3, the gate insulating layer 4 formed between the gate metal layer 3 and the semiconductor layer 5, the source metal layer 7 formed on the semiconductor layer 5, the contact layer 6 including the source contact portion 6S and the drain contact portion 6D formed between the semiconductor layer 5 and the source metal layer 7, the interlayer insulating layer 11 formed on the source metal layer 7, and the upper conductive layer 19 formed on the interlayer insulating layer 11. The interlayer insulating layer 11 is formed to cover the TFT 10.

As shown in FIG. 10A and FIG. 11A, the TFT 10 of in each antenna unit region U of the TFT substrate 101A is a TFT having a bottom gate structure. That is, the semiconductor layer 5 is positioned above the gate electrode 3G. In addition, the TFT 10 has a top contact structure in which the source electrode 7S and the drain electrode 7D are arranged on the semiconductor layer 5.

The semiconductor layer 5 is arranged to overlap the gate electrode 3G with the gate insulating layer 4 interposed therebetween.

The source contact portion 6S and the drain contact portion 6D are arranged on both sides of a region (channel region) where a channel is formed in the semiconductor layer 5 when viewed in the direction normal to the dielectric substrate 1. Here, the source contact portion 6S and the drain contact portion 6D are formed to be in contact with the upper surface of the semiconductor layer 5. The semiconductor layer 5 is, for example, an intrinsic amorphous silicon (i-a-Si) layer, and the source contact portion 6S and the drain contact portion 6D are, for example, n+ type amorphous silicon (n+-a-Si) layers. The semiconductor layer 5 may be a crystalline silicon layer (for example, a polysilicon layer).

The source electrode 7S and the drain electrode 7D are electrically connected to the semiconductor layer 5 via the source contact portion 6S and the drain contact portion 6D, respectively. Here, the source electrode 7S is provided to be in contact with the source contact portion 6S, and the drain electrode 7D is provided to be in contact with the drain contact portion 6D.

The gate electrode 3G is electrically connected to the gate bus line GL, and the scanning signal voltage is supplied from the gate bus line GL. The source electrode 7S is electrically connected to the source bus line SL, and the data signal voltage is supplied from the source bus line SL. In this example, the gate electrode 3G and the gate bus line GL are formed of the same conductive film (gate conductive film). Here, the source electrode 7S, the drain electrode 7D, and the source bus line SL are formed from the same conductive film (a source conductive film). The gate conductive film and the source conductive film are, for example, metal films.

In this specification, a layer (layer) including the gate electrode 3G formed using a gate conductive film may be referred to as a "gate metal layer 3", and a layer including the source electrode 7S formed using a source conductive film may be referred to as the "source metal layer 7". The gate metal layer 3 includes the gate electrode 3G of the TFT 10 and a gate bus line GL, and the source metal layer 7 includes the source electrode 7S and the drain electrode 7D of the TFT 10 and the source bus line SL. In addition, a layer including the source contact portion 6S and the drain contact portion 6D formed using a certain conductive film (for example, an n+ type amorphous silicon film) may be referred to as the contact layer 6. Regarding other conductive layers and insulating layers, "layer" may include all portions formed using the same film.

Here, the patch electrode 15 is included in the source metal layer 7. The patch electrode 15 includes the lower source metal layer S1 and the upper source metal layer S2. The patch electrode 15 is covered with the interlayer insulating layer 11. In this example, the patch electrode 15 includes a Cu layer or an Al layer as a main layer. The upper source metal layer S2 of the patch electrode 15 may be referred to as the "main layer".

The upper source metal layer S2 may have a laminated structure of a layer including Cu or Al (typically a Cu layer or an Al layer) and a high melting point metal-containing layer. For example, the high melting point metal-containing layer may be formed on a layer including Cu or Al. "High melting point metal-containing layer" is a layer including at least one element selected from the group consisting of titanium (Ti), tungsten (W), molybdenum (Mo), tantalum (Ta), and niobium (Nb). The "high melting point metal-containing layer" may have a laminated structure. For example, the high-melting point metal containing layer indicates a layer formed of any one of Ti, W, Mo, Ta, Nb, an alloy containing the above, nitrides thereof, or a solid solution of the metal or the alloy and the nitride.

The performance of the scanning antenna is correlated with the electrical resistance of the patch electrode 15, and the thickness of the main layer is set to obtain a desired resistance. From the viewpoint of electrical resistance, there is a possibility that the thickness of the patch electrode 15 may be made smaller in the Cu layer than in the Al layer. The thickness of the main layer of the patch electrode 15 is set to, for example, 0.3 µm or more in a case of being formed of an Al layer, and is set to, for example, 0.2 µm or more in a case of being formed of a Cu layer.

Here, each antenna unit region U has an auxiliary capacitance electrically connected in parallel with the liquid crystal capacity. In this example, the auxiliary capacitance is formed by the auxiliary capacitance electrode 7C electrically connected to the drain electrode 7D, the gate insulating layer 4, and the auxiliary capacitance counter electrode 3C facing the auxiliary capacitance electrode 7C with the gate insulating layer 4 interposed therebetween. The auxiliary capacitance counter electrode 3C is included in the gate metal layer 3, and the auxiliary capacitance electrode 7C is included in the source metal layer 7. The gate metal layer 3 further includes a CS bus line (auxiliary capacity line) CL connected to the auxiliary capacitance counter electrode 3C. The CS bus line CL extends, for example, substantially in parallel with the gate bus line GL. In this example, the auxiliary capacitance counter electrode 3C is formed integrally with the CS bus line CL. The width of the auxiliary capacitance counter electrode 3C may be larger than the width of the CS bus line CL. In addition, in this example, the auxiliary capacitance electrode 7C is extended from the drain electrode 7D. The width of the auxiliary capacitance electrode 7C may be larger than the width of a portion other than the auxiliary capacitance electrode 7C in the portion extending from the drain electrode 7D. The arrangement relationship between the auxiliary capacitance and the patch electrode 15 is not limited to that of the illustrated example.

TFT Substrate 101A (Non-Transmission/Reception Region R2) of Example 1

A description will be given of the structure of the non-transmission/reception region R2 of the TFT substrate 101A with reference to FIG. 10A to FIG. 12. FIG. 10B and FIG. 10C are schematic plan views of the non-transmission/reception region R2 of the TFT substrate 101A, and FIG. 11B to FIG. 11E and FIG. 12 are schematic cross-sectional views of the non-transmission/reception region R2 of the TFT substrate 101A. The above respectively correspond to the non-transmission/reception region R2 of the TFT substrate 101R of Reference Example 1 shown in FIG. 3B, FIG. 3C, FIG. 4B to FIG. 4E, and FIG. 5. A description will be given below focusing on the differences with the non-transmission/reception region R2 of the TFT substrate 101R of Reference Example 1.

FIG. 10B shows the transfer terminal portion PT, the gate terminal portion GT, and the CS terminal portion CT provided in the non-transmission/reception region R2, and FIG. 10C shows the source-gate connection portion SG and source terminal portion ST provided in the non-transmission/reception region R2.

Figure 11B:
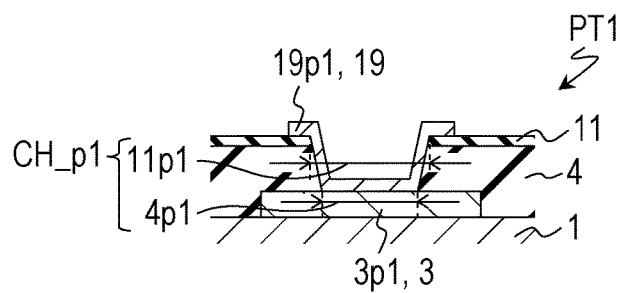
Figure 11C:
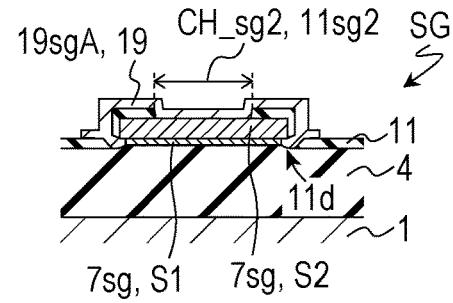
Figure 11D:
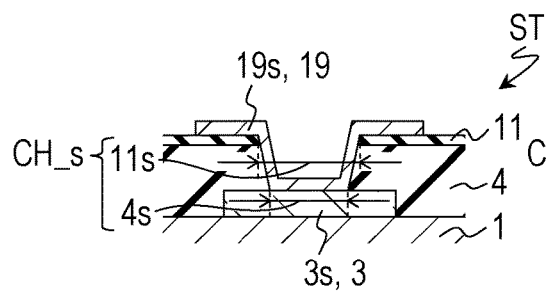
Figure 11E:
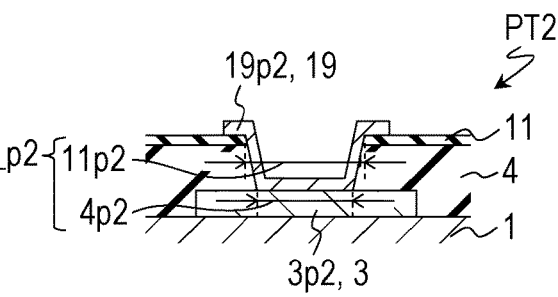
Figure 12:
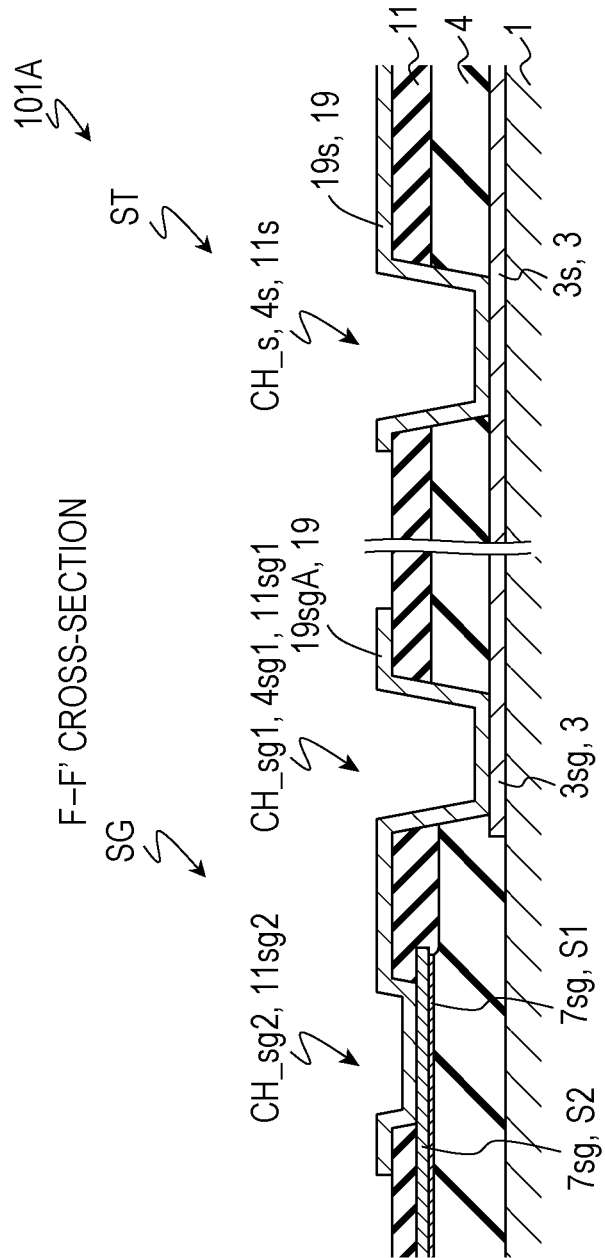
FIG. 12 is a schematic cross-sectional view of the TFT substrate.

FIG. 11B shows a cross-section of the first transfer terminal portion PT1 along line B-B' in FIG. 10B, FIG. 11C shows a cross-section of the source-gate connection portion SG along line C-C' in FIG. 10C, FIG. 11D shows a cross-section of the source-terminal portion ST along line D-D' in FIG. 10C, FIG. 11E shows a cross-section of the second transfer terminal portion PT2 along line E-E' in FIG. 10B, and FIG. 12 shows a cross-section of the source-gate connection portion SG and the source terminal portion ST along line F-F' in FIG. 10C.

As shown in FIG. 10C, FIG. 11C, and FIG. 12, the planar shape of an upper connection portion 19sgA of the source-gate connection portion SG of the TFT substrate 101A is different from that of the TFT substrate 101R of Reference Example 1. The upper connection portion 19sgA of the TFT substrate 101A is formed to cover the edge of the lower source metal layer S1 and the edge of the upper source metal layer S2 of the source-gate connection portion SG when viewed in the direction normal to the dielectric substrate 1. Due to this, even when the source-gate connection portion SG is arranged inside the seal region Rs in the non-transmission/reception region R2, it is possible to suppress the occurrence of the problem that the metal ions elute from the upper source metal layer S2 to the liquid crystal layer LC. In a case where the source-gate connection portion SG is arranged outside the seal region Rs, from the viewpoint of suppressing the occurrence of the problem described above, the structure of the non-transmission/reception region R2 may be arbitrary due to the inclusion of the planar shape of the upper conductive layer 19.

Since the structure of each terminal portion of the illustrated TFT substrate 101A is similar to that of the TFT substrate 101R of Reference Example 1, a description thereof will be omitted.

It is possible to manufacture the TFT substrate 101A by changing the patterning shape of the upper conductive film 19' from that of the method of manufacturing the TFT substrate 101R of Reference Example 1. That is, it is sufficient if the upper conductive layer 19 is formed to cover the edge of the lower source metal layer S1 and the edge of the upper source metal layer S2 of the plurality of antenna unit regions U when viewed in the direction normal to the dielectric substrate 1.

Modification Example 1

With reference to FIG. 14A to FIG. 15C, a description will be given of the TFT substrate 101B according to Modification Example 1 of the present embodiment. The configuration which is common to the TFT substrate 101A is denoted by common reference numerals, and explanation thereof may be omitted.

FIG. 14A is a schematic plan view of the antenna unit region U of the transmission/reception region R1 of the TFT substrate 101B, and FIG. 14B and FIG. 14C are schematic plan views of the non-transmission/reception region R2 of the TFT substrate 101B. FIG. 15A is a schematic cross-sectional view of the antenna unit region U of the TFT substrate 101B, and shows a cross-section along line A-A' in FIG. 14A. FIG. 15B and FIG. 15C are schematic cross-sectional views of the non-transmission/reception region R2 of the TFT substrate 101B and respectively show a cross-section along line C-C' in FIG. 14C and a cross-section along line F-F' in FIG. 14C. Since the other cross-sections of the TFT substrate 101B are the same as the TFT substrate 101A, illustration and description thereof are omitted.

As shown in FIG. 14A and FIG. 15A, an upper conductive layer 19cvB in the antenna unit region U of the TFT substrate 101B is formed to cover the lower source metal layer S1 and the upper source metal layer S2 of plurality of antenna unit regions U when viewed in the direction normal to the dielectric substrate 1.

Even in a scanning antenna having the TFT substrate 101B having such a structure, it is possible to obtain the same effect as that of the scanning antenna 1000A having the TFT substrate 101A.

In addition, as shown in FIG. 14C, FIG. 15B, and FIG. 15C, an upper connection portion 19sgB of the source-gate connection portion SG of the TFT substrate 101B is formed to cover the lower source metal layer S1 and the upper source metal layer S2 of the source-gate connection portion SG when viewed in the direction normal to the dielectric substrate 1. However, the non-transmission/reception region R2 of the TFT substrate 101B is not limited to the illustrated example, and it is possible to apply any of the non-transmission/reception regions R2 of the TFT substrate described above.

It is possible to manufacture the TFT substrate 101B by changing the patterning shape of the upper conductive film 19' from that of the method of manufacturing the TFT substrate 101A. That is, it is sufficient if the upper conductive layer 19 is formed to cover the lower source metal layer S1 and the upper source metal layer S2 of the plurality of antenna unit regions U when viewed in the direction normal to the dielectric substrate 1.

Modification Example 2

With reference to FIG. 16A to FIG. 17C, a description will be given of the TFT substrate 101C according to Modification Example 2 of the present embodiment. The configuration which is common to the TFT substrate 101A is denoted by common reference numerals, and explanation thereof may be omitted.

FIG. 16A is a schematic plan view of the antenna unit region U of the transmission/reception region R1 of the TFT substrate 101C, and FIG. 16B and FIG. 16C are schematic plan views of the non-transmission/reception region R2 of the TFT substrate 101C. FIG. 17A is a schematic cross-sectional view of the antenna unit region U of the TFT substrate 101C and shows a cross-section along line A-A' in FIG. 16A. FIG. 17B and FIG. 17C are schematic cross-sectional views of the non-transmission/reception region R2 of the TFT substrate 101C and show a cross-section along line C-C' in FIG. 16C and a cross-section along line F-F' in FIG. 16C, respectively. Since the other cross-sections of the TFT substrate 101C are the same as the TFT substrate 101A, illustration and explanation thereof will be omitted.

As shown in FIG. 16A and FIG. 17A, an upper conductive layer 19cvC in the antenna unit region U of the TFT substrate 101C is formed to cover a portion which does not overlap the source contact portion 6S or the drain contact portion 6D in the edge of the lower source metal layer S1 and the edge of the upper source metal layer S2 of the plurality of antenna unit regions U when viewed in the direction normal to the dielectric substrate 1. In other words, the upper conductive layer 19cvC of the TFT substrate 101C is different from the upper conductive layer 19cvA of the TFT substrate 101A in the point that a portion which overlaps the source contact portion 6S or the drain contact portion 6D in the edge of the lower source metal layer S1 and the edge of the upper source metal layer S2 of the plurality of antenna unit regions U is not covered. In the TFT substrate 101A, in a case where the distance in the channel length direction between the source electrode 7S and the drain electrode 7D is small, when the upper conductive layer 19 is formed to cover the edge of the source electrode 7S and the edge of the drain electrode 7D, short circuits may occur between the source electrode 7S and the drain electrode 7D and/or the upper conductive layer 19 has to be patterned with high accuracy in order to suppress the occurrence of short circuits between the source electrode and the drain electrode. It is possible for the TFT substrate 101C to suppress the occurrence of a short circuit between the source electrode 7S and the drain electrode 7D as compared with the TFT substrate 101A.

Even in a scanning antenna having the TFT substrate 101C having such a structure, it is possible to obtain the same effect as that of the scanning antenna 1000A having the TFT substrate 101A. The reason why the influence is small from the viewpoint of suppressing elution of the metal element (Cu or Al) from the source metal layer 7 into the liquid crystal layer even if the upper conductive layer 19 in the portion overlapping the source contact portion 6S or the drain contact portion 6D in the edge of the lower source metal layer S1 and the edge of the upper source metal layer S2 of the plurality of antenna unit regions U is omitted is as follows.

As described with reference to FIG. 13, the defect 11d of the interlayer insulating layer 11 tends to occur when the side etching amount 6S and/or the etching amount 6D in the depth direction of the gate insulating layer 4 formed under the lower source metal layer S1 are large. The etching amounts δS and δD are caused by etching of the gate insulating layer 4 in the step of dry etching the contact portion 6a' in order to form the source contact portion 6S and the drain contact portion 6D. However, in the portion overlapping the source contact portion 6S or the drain contact portion 6D in the edge of the lower source metal layer S1 and the edge of the upper source metal layer S2, the contact layer 6 is formed under the lower source metal layer S1. In comparison with the gate insulating layer 4, the contact layer 6 is not easily side-etched in the step of dry etching the contact portion 6a'. Accordingly, defects do not easily occur in the interlayer insulating layer 11 in the portion overlapping the source contact portion 6S or the drain contact portion 6D in the edge of the lower source metal layer S1 and the edge of the upper source metal layer S2.

As described above, in the TFT substrate according to the embodiment of the present disclosure, it is sufficient if at least the portion which does not overlap the source contact portion 6S or the drain contact portion 6D in the edge of the lower source metal layer S1 and the edge of the upper source metal layer S2 of the plurality of antenna unit regions U when viewed in the direction normal to the dielectric substrate 1 is covered with at least two inorganic layers. The at least two inorganic layers may be formed to cover all of the edge of the lower source metal layer S1 and the edge of the upper source metal layer S2 of the plurality of antenna unit regions U when viewed in the direction normal to the dielectric substrate 1 or may be formed to cover all of the lower source metal layer S1 and the upper source metal layer S2 of the plurality of antenna unit regions U.

As shown in FIG. 16C, FIG. 17B, and FIG. 17C, the planar shape of the upper connection portion 19sgC of the source-gate connection portion SG of the TFT substrate 101C is different from the upper connection portion 19sgA of the source-gate connection portion SG of the TFT substrate 101A and the upper connection portion 19sgB of the source-gate connection portion SG of the TFT substrate 101B, but the upper connection portion 19sgC of the TFT substrate 101C is also formed to cover the edge of the lower source metal layer S1 and the edge of the upper source metal layer S2 of the source-gate connection portion SG when viewed in the direction normal to the dielectric substrate 1. The non-transmission/reception region R2 of the TFT substrate 101C is not limited to the illustrated example, and it is possible to apply any of the non-transmission/reception regions R2 of the TFT substrates described above.

It is possible to manufacture the TFT substrate 101C by changing the patterning shape of the upper conductive film 19' from that of the method of manufacturing the TFT substrate 101A. That is, it is sufficient if the upper conductive layer 19 is formed to cover a portion which does not overlap the source contact portion 6S or the drain contact portion 6D in the edge of the lower source metal layer S1 and the edge of the upper source metal layer S2 of the plurality of antenna unit regions U when the upper conductive layer 19 is viewed in the direction normal to the dielectric substrate 1.

Modification Example 3

Figure 19:
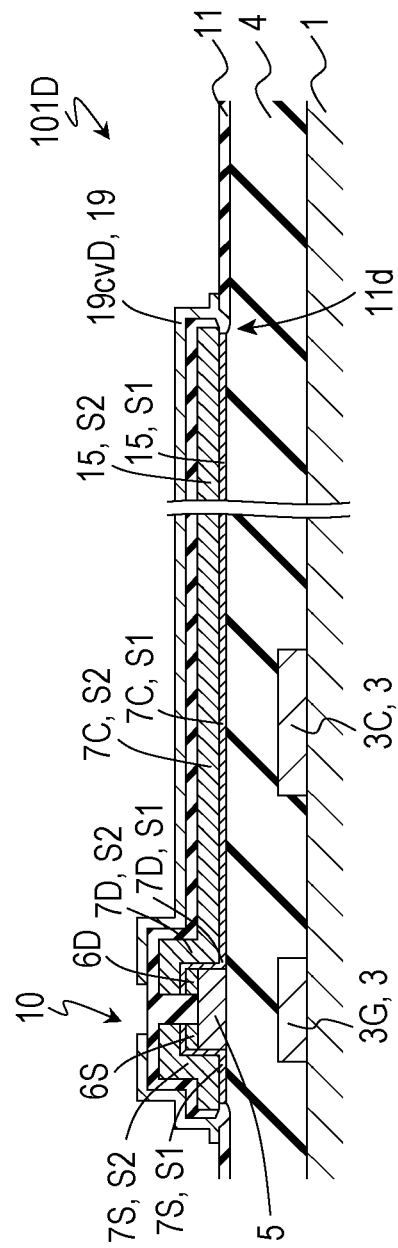
FIG. 19 is a schematic cross-sectional view of the TFT substrate.

With reference to FIG. 18A to FIG. 19, a description will be given of the TFT substrate 101D according to Modification Example 3 of the present embodiment. The configuration which is common to the TFT substrate 101B is denoted by common reference numerals, and explanation thereof may be omitted.

FIG. 18A is a schematic plan view of the antenna unit region U of the transmission/reception region R1 of the TFT substrate 101D, and FIG. 18B and FIG. 18C are schematic plan views of the non-transmission/reception region R2 of the TFT substrate 101D. FIG. 19 is a schematic cross-sectional view of the antenna unit region U of the TFT substrate 101D and shows a cross-section along line A-A' in FIG. 18A. Since the other cross-sections of the TFT substrate 101D are the same as the TFT substrate 101B, illustration and explanation thereof will be omitted.

As shown in FIG. 18A and FIG. 19, an upper conductive layer 19cvD in the antenna unit region U of the TFT substrate 101D is formed to cover a portion which does not overlap the source contact portion 6S or the drain contact portion 6D in the lower source metal layer S1 and the upper source metal layer S2 of the plurality of antenna unit regions U when viewed in the direction normal to the dielectric substrate 1. In other words, the upper conductive layer 19cvD of the TFT substrate 101D is different from the upper conductive layer 19cvB of the TFT substrate 101B in the point that a portion overlapping the source contact portion 6S or the drain contact portion 6D in the lower source metal layer S1 and the upper source metal layer S2 of the plurality of antenna unit regions U is not covered. In comparison with the TFT substrate 101B, it is possible for the TFT substrate 101D to suppress the occurrence of short circuits between the source electrode 7S and the drain electrode 7D.

Even in a scanning antenna having the TFT substrate 101D having such a structure, it is possible to obtain the same effect as that of the scanning antenna having the TFT substrate 101B.

The non-transmission/reception region R2 of the TFT substrate 101D is not limited to the examples shown in FIG. 18B and FIG. 18C and application is also possible to any of the non-transmission/reception regions R2 of the TFT substrates described above.

It is possible to manufacture the TFT substrate 101D by changing the patterning shape of the upper conductive film 19' from that of the method of manufacturing the TFT substrate 101A. That is, it is sufficient if the upper conductive layer 19 is formed to cover a portion which does not overlap the source contact portion 6S or the drain contact portion 6D in the lower source metal layer S1 and the upper source metal layer S2 of the plurality of antenna unit regions U when the upper conductive layer 19 is viewed in the direction normal to the dielectric substrate 1.

Previously, a TFT substrate in which the patch electrode 15 is included in the source metal layer 7 was described as an example, but the embodiment of the present disclosure is not limited thereto. As described above, the problem that the antenna performance is deteriorated occurs due to defects being generated in the inorganic layer formed on the source metal layer 7 when the side surface of the source metal layer 7 in the antenna unit region U has a reverse taper shape. Generally, from the viewpoint of antenna performance, the thickness of the inorganic layer covering the patch electrode is preferably small. The smaller the sum of the thicknesses of the inorganic layers formed on the source metal layer 7 is, the more defects tend to occur in the inorganic layer (for example, tending to be discontinuous), thus, the possibility that the source metal layer 7 will be exposed is high. Accordingly, since the problem that the metal elutes from the patch electrode 15 included in the source metal layer 7 into the liquid crystal layer tends to occur, the TFT substrate in which the patch electrode 15 is included in the source metal layer 7 was exemplified as an embodiment of the present disclosure. Since the patch electrode 15 is included in the source metal layer 7, the TFT substrate of the present embodiment has an advantage in that it is possible to reduce the number of manufacturing steps (for example, the number of photomasks) and the manufacturing cost.

The patch electrode is not limited to the example described above and may be included in the gate metal layer 3 or may be included in a different conductive layer from both the gate metal layer 3 and the source metal layer 7. In such a case, the conductive layer including the patch electrode (may be referred to as a "patch metal layer") is not limited to the above example. The patch metal layer has, for example, a laminated structure having a low resistance metal layer and a high melting point metal-containing layer under the low resistance metal layer. The laminated structure may further have a high melting point metal-containing layer on the low resistance metal layer. The low resistance metal layer of the patch metal layer may be referred to as the "main layer", and the high melting point metal-containing layers below and above the low resistance metal layer may be referred to as the "lower layer" and the "upper layer", respectively. "High melting point metal-containing layer" is a layer including at least one element selected from the group consisting of titanium (Ti), tungsten (W), molybdenum (Mo), tantalum (Ta), and niobium (Nb). The "high melting point metal-containing layer" may have a laminated structure. For example, the high-melting point metal containing layer indicates a layer formed of any one of Ti, W, Mo, Ta, Nb, an alloy containing the above, nitrides thereof, or a solid solution of the metal or the alloy and the nitride. The "low resistance metal layer" is a layer including at least one element selected from the group consisting of copper (Cu), aluminum (Al), silver (Ag), and gold (Au). The "low resistance metal layer" may have a laminated structure.

In addition, the semiconductor film to be used for the semiconductor layer 5 is not limited to an amorphous silicon film. For example, an oxide semiconductor layer may be formed as the semiconductor layer 5. Generally, it is known that a source contact portion and a drain contact portion need not be provided between the oxide semiconductor layer and the source electrode and the drain electrode, but it is naturally also possible to provide a source contact portion and a drain contact portion. It is possible to apply embodiments of the present disclosure by providing a source contact portion and a drain contact portion between an oxide semiconductor layer and a source electrode and a drain electrode.

Structure of Slot Substrate 201

A more detailed description will be given of the structure of the slot substrate 201 with reference to FIG. 20A and FIG. 20B.

Figure 20A:
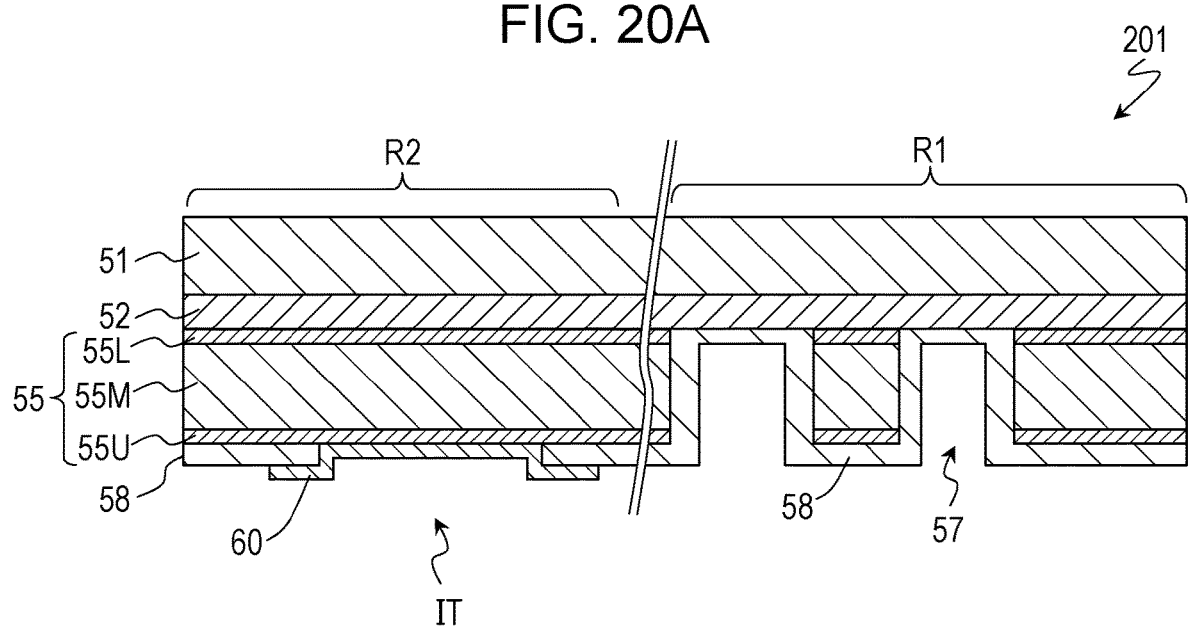
FIG. 20A is a cross-sectional view schematically showing the slot substrate.
Figure 20B:
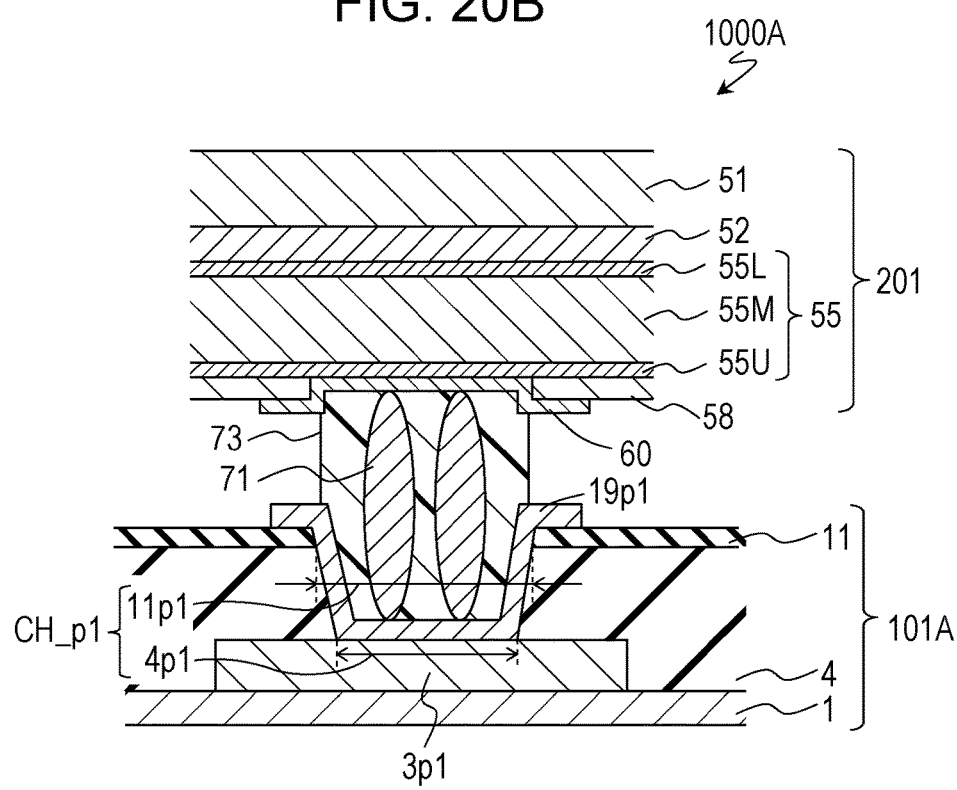
FIG. 20B is a schematic cross-sectional view for illustrating a transfer portion in the TFT substrate and the slot substrate.

FIG. 20A is a cross-sectional view schematically showing the antenna unit region U and the terminal portion IT in the slot substrate 201.

The slot substrate 201 is provided with the dielectric substrate 51 having a front surface and a rear surface, a third insulating layer 52 formed on the surface of the dielectric substrate 51, the slot electrode 55 formed on the third insulating layer 52, and a fourth insulating layer 58 covering the slot electrode 55. The reflective conductive plate 65 is arranged on the back surface of the dielectric substrate 51 to face the dielectric substrate 51 with the dielectric layer (air layer) 54 interposed therebetween. The slot electrode 55 and the reflective conductive plate 65 function as walls of the waveguide 301.

In the transmission/reception region R1, a plurality of the slots 57 are formed in the slot electrode 55. The slots 57 are openings penetrating the slot electrode 55. In this example, one slot 57 is arranged in each antenna unit region U.

The fourth insulating layer 58 is formed on the slot electrode 55 and in the slots 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, thus, it is possible to increase the reliability. When the slot electrode 55 is formed of a Cu layer, Cu may elute into the liquid crystal layer LC. In addition, when the slot electrode 55 is formed of an Al layer by using a thin film deposition technique, a void may be included in the Al layer. It is possible for the fourth insulating layer 58 to avoid the liquid crystal material from entering the void of the Al layer. When the slot electrode 55 is manufactured by pasting an Al layer on the dielectric substrate 51 with an aluminum foil as an adhesive and carrying out patterning thereon, it is possible to avoid the problem of voids.

The slot electrode 55 includes a main layer 55M such as a Cu layer and an Al layer. The slot electrode 55 may have a laminated structure including the main layer 55M and an upper layer 55U and a lower layer 55L arranged with the main layer 55M interposed therebetween. The thickness of the main layer 55M is set in consideration of the skin effect according to the material, and may be, for example, 2 µm or more and 30 µm or less. The thickness of the main layer 55M is typically larger than the thicknesses of the upper layer 55U and the lower layer 55L.

In the illustrated example, the main layer 55M is a Cu layer, the upper layer 55U and the lower layer 55L are Ti layers. Arranging the lower layer 55L between the main layer 55M and the third insulating layer 52 makes it possible to improve the adhesion between the slot electrode 55 and the third insulating layer 52. In addition, providing the upper layer 55U makes it possible to suppress corrosion of the main layer 55M (for example, Cu layer).

Since the reflective conductive plate 65 forms the wall of the waveguide 301, the reflective conductive plate 65 preferably has a thickness that is three times or more the skin depth, and more preferably five times or more. For the reflective conductive plate 65, for example, it is possible to use an aluminum plate, a copper plate, or the like having a thickness of several millimeters manufactured by being cut out.

In the non-transmission/reception region R2, a terminal portion IT is provided. The terminal portion IT is provided with the slot electrode 55, the fourth insulating layer 58 covering the slot electrode 55, and an upper connection portion 60. The fourth insulating layer 58 has an opening portion reaching the slot electrode 55. The upper connection portion 60 is in contact with the slot electrode 55 in the opening portion. In the present embodiment, the terminal portion IT is arranged in the seal region Rs and connected to the transfer terminal portion on the TFT substrate by a seal resin containing conductive particles (transfer portion).
Transfer Portion FIG. 20B is a schematic cross-sectional view for illustrating a transfer portion which connects the first transfer terminal portion PT1 of the TFT substrate 101A and the terminal portion IT of the slot substrate 201. In FIG. 20B, the same reference numerals are attached to the same constituent elements as in the previous drawings.

In the transfer portion, the upper connection portion 60 of the terminal portion IT is electrically connected to the first upper connection portion 19p1 for the first transfer terminal of the first transfer terminal portion PT1 of the TFT substrate 101A. In the present embodiment, the upper connection portion 60 and the upper connection portion 19p1 are connected via a resin (sealing resin) 73 (also may be referred to as a "sealing portion 73") including conductive beads 71.

Both the upper connection portions 60 and 19p1 are transparent conductive layers such as an ITO film and an IZO film, and an oxide film may be formed on the surface thereof. When an oxide film is formed, there is a possibility that it will not be possible to ensure the electrical connection between the transparent conductive layers and that the contact resistance will become high. On the other hand, in the present embodiment, since these transparent conductive layers are adhered with a resin including the conductive beads (for example, Au beads) 71 interposed therebetween, even when the surface oxide film is formed, the conductive beads break the skin of (penetrate) the surface oxide film, making it possible to suppress an increase in the contact resistance. The conductive beads 71 may penetrate not only the surface oxide film but also the upper connection portions 60 and 19p1 which are the transparent conductive layers, and may directly contact the lower connection portion 3p1 and the slot electrode 55.

The transfer unit may be arranged both at the center portion and at the peripheral portion of the scanning antenna 1000A (that is, inside and outside of the donut-shaped transmission/reception region R1 when viewed in the direction normal to the scanning antenna 1000A), or may be arranged only in one thereof. The transfer portion may be arranged in the seal region Rs in which the liquid crystal is enclosed, or may be arranged outside the seal region Rs (on the opposite side to the liquid crystal layer).
Method of Manufacturing Slot Substrate 201

It is possible to manufacture the slot substrate 201 by the following method, for example.

First, the third insulating layer (thickness: 200 nm, for example) 52 is formed on the dielectric substrate. As the dielectric substrate, it is possible to use a substrate such as a glass substrate, or a resin substrate having high transmittance with respect to electromagnetic waves (the dielectric constant εM and the dielectric loss tan δM are small). The dielectric substrate is preferably thin in order to suppress the attenuation of electromagnetic waves. For example, after forming constituent elements such as the slot electrode 55 on the surface of the glass substrate by a process described below, the glass substrate may be thinned from the rear side. Due to this, it is possible to reduce the thickness of the glass substrate to 500 µm or less, for example.

In a case where a resin substrate is used as the dielectric substrate, the constituent elements such as the TFT may be formed directly on the resin substrate, or may be formed on the resin substrate using a transfer method. According to the transfer method, for example, a resin film (for example, polyimide film) is formed on a glass substrate, constituent elements are formed on the resin film by a process described below, and then the resin film on which the constituent elements are formed and the glass substrate are separated. Generally, the dielectric constant CM and the dielectric loss tan δM of the resin are smaller than that of the glass. The thickness of the resin substrate is, for example, 3 µm to 300 µm. Other than polyimide, for example, it is also possible to use a liquid crystal polymer as the resin material.

The third insulating layer 52 is not particularly limited and it is possible to appropriately use, for example, a silicon oxide (SiOx) film, a silicon nitride (SiNx) film, a silicon oxynitride (SiOxNy; x>y) film, a silicon nitride oxide (SiNxOy; x>y) film, or the like.

Next, a metal film is formed on the third insulating layer 52 and patterned to obtain the slot electrode 55 having the plurality of slots 57. As the metal film, a Cu film (or Al film) having a thickness of 2 µm to 5 µm may be used. Here, a laminated film in which Ti (thickness: 20 nm, for example) and Cu (thickness: 3000 nm) are laminated in this order is used. Alternatively, a laminated film in which a Ti film, a Cu film, and a Ti film are laminated in this order may be formed.

Thereafter, the fourth insulating layer (thickness: 100 nm or 200 nm, for example) 58 is formed on the slot electrode 55 and in the slots 57. The material of the fourth insulating layer 58 may be the same as the material of the third insulating layer. Thereafter, in the non-transmission/reception region R2, an opening portion reaching the slot electrode 55 is formed in the fourth insulating layer 58.

Next, a transparent conductive film is formed on the fourth insulating layer 58 and in the opening portion of the fourth insulating layer 58, and is patterned to form the upper connection portion 60 in contact with the slot electrode 55 in the opening portion. Due to this, a terminal portion IT is obtained.

Material and Structure of TFT 10

In the present embodiment, a TFT with the semiconductor layer 5 as an active layer is used as a switching element arranged in each pixel. The semiconductor layer 5 is not limited to an amorphous silicon layer and may be a polysilicon layer or an oxide semiconductor layer.

In a case where an oxide semiconductor layer is used, the oxide semiconductor included in the oxide semiconductor layer may be an amorphous oxide semiconductor or may be a crystalline oxide semiconductor having a crystalline portion. Examples of the crystalline oxide semiconductor include a polycrystalline oxide semiconductor, a microcrystalline oxide semiconductor, a crystalline oxide semiconductor in which the c-axis is oriented substantially perpendicularly to the layer surface, and the like.

The oxide semiconductor layer may have a laminated structure of two or more layers. In a case where the oxide semiconductor layer has a laminated layer structure, the oxide semiconductor layer may include an amorphous oxide semiconductor layer and a crystalline oxide semiconductor layer. Alternatively, a plurality of crystalline oxide semiconductor layers having different crystal structures may be included. In addition, a plurality of amorphous oxide semiconductor layers may be included. In a case where the oxide semiconductor layer has a two-layer structure including an upper layer and a lower layer, the energy gap of the oxide semiconductor included in the upper layer is preferably larger than the energy gap of the oxide semiconductor included in the lower layer. However, in a case where the difference in energy gap between these layers is relatively small, the energy gap of the lower layer oxide semiconductor may be larger than the energy gap of the upper layer oxide semiconductor.

The material, structure, and film forming method of the amorphous oxide semiconductor and each of the above-described crystalline oxide semiconductors, the configuration of an oxide semiconductor layer having a laminated structure, and the like are described in, for example, Japanese Unexamined Patent Application Publication No. 2014-007399. All the disclosed content of Japanese Unexamined Patent Application Publication No. 2014-007399 is incorporated in the present specification by reference.

The oxide semiconductor layer may include, for example, at least one kind of metal element selected from In, Ga, and Zn. In the present embodiment, the oxide semiconductor layer includes, for example, an In—Ga—Zn—O-based semiconductor (for example, indium gallium zinc oxide). Here, the In—Ga—Zn—O-based semiconductor is a ternary oxide of In (indium), Ga (gallium), and Zn (zinc), and the ratio (composition ratio) of In, Ga, and Zn is not particularly limited and includes, for example, In:Ga:Zn=2:2:1, In:Ga:Zn=1:1:1, In:Ga:Zn=1:1:2, and the like. It is possible to form such an oxide semiconductor layer from an oxide semiconductor film including an In—Ga—Zn—O-based semiconductor.

The In—Ga—Zn—O-based semiconductor may be amorphous or may be crystalline. As a crystalline In—Ga—Zn—O-based semiconductor, a crystalline In—Ga—Zn—O-based semiconductor in which the c-axis is oriented substantially perpendicular to the layer surface is preferable.

Here, the crystal structures of crystalline In—Ga—Zn—O-based semiconductors are disclosed in, for example, Japanese Unexamined Patent Application Publication No. 2014-007399, Japanese Unexamined Patent Application Publication No. 2012-134475, and Japanese Unexamined Patent Application Publication No. 2014-209727, and the like described above. All of the disclosed content of Japanese Unexamined Patent Application Publication No. 2012-134475 and Japanese Unexamined Patent Application Publication No. 2014-209727 are incorporated in the present specification by reference. Since a TFT having an In—Ga—Zn—O-based semiconductor layer has high mobility (more than 20 times compared with an a-Si TFT) and low leak current (less than $\frac{1}{100}$th compared with an a-Si TFT), such a TFT is preferably used as a driving TFT (for example, a TFT included in a driving circuit to be provided in a non-transmission/reception region) and as a TFT to be provided in each antenna unit region.

Instead of the In—Ga—Zn—O-based semiconductor, the oxide semiconductor layer may include another oxide semiconductor. For example, an In—Sn—Zn—O-based semiconductor (for example, $In_2O_3$—$SnO_2$—ZnO; InSnZnO) may be included. The In—Sn—Zn—O-based semiconductor is a ternary oxide of In (indium), Sn (tin), and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, or the like.

Second Embodiment

In the previous embodiment, the TFT has a bottom gate structure. That is, the semiconductor layer is positioned above the gate electrode. The present embodiment is different from the previous embodiment in the point that the TFT has a top gate structure.

TFT Substrate 102R (Antenna Unit Region U) of Reference Example 2

Figure 21A:
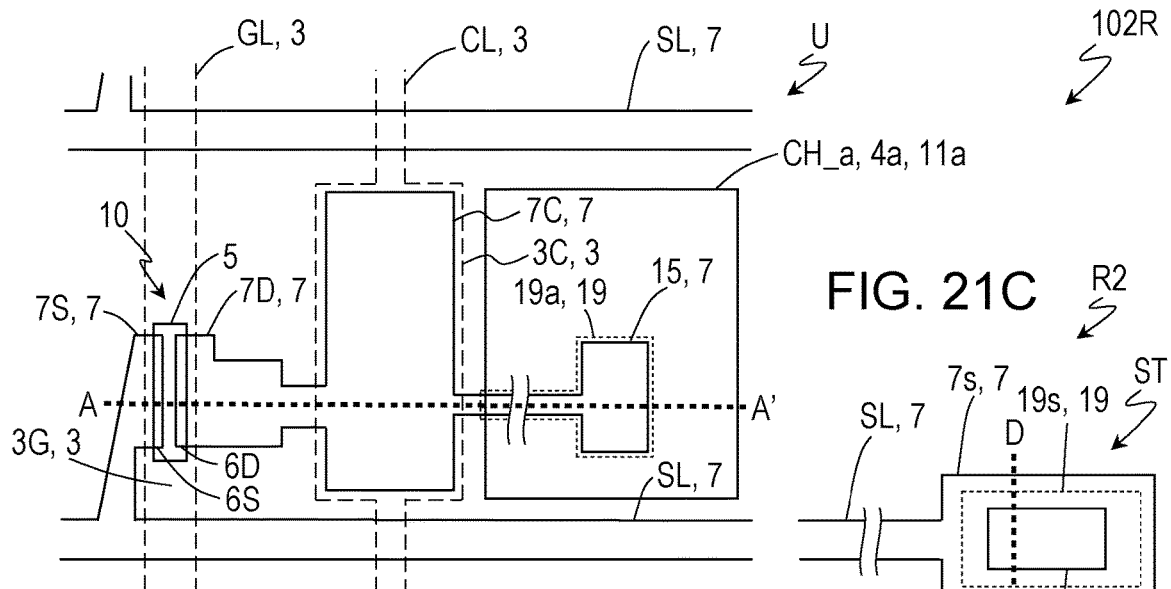
FIG. 21A is a schematic plan view of the antenna unit region of the transmission/reception region of a TFT substrate of Reference Example 2.
Figure 21C:
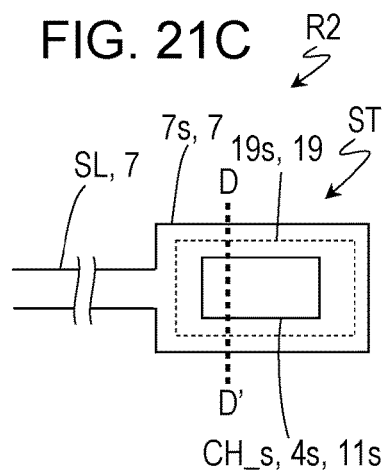
FIG. 21B and FIG. 21C are schematic plan views of the non-transmission/reception region of the TFT substrate of Reference Example 2.
Figure 21B:
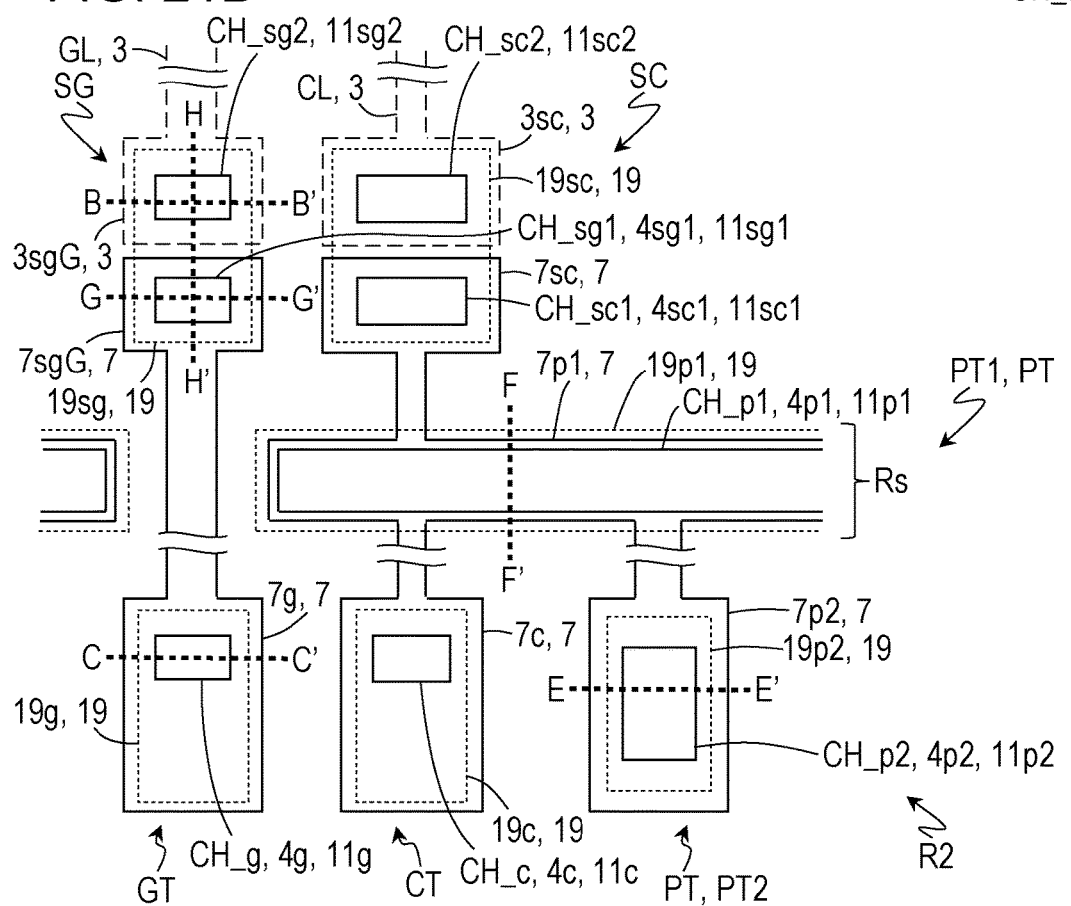

Before describing the detailed structure of the TFT substrate 102A of the present embodiment, first, a description will be given of the TFT substrate 102R of Reference Example 2. When the present inventors manufactured and drove a prototype scanning antenna provided with the TFT substrate 102R of Reference Example 2, the antenna performance sometimes deteriorated. Here, in the following description, the description of the configuration common to the TFT substrate 102A of the present embodiment may be omitted in order to avoid duplication. In addition, common constituent elements to those of the previous embodiments are denoted by common reference numerals, and explanation thereof may be omitted. FIG. 21A to FIG. 21C are schematic plan views of the TFT substrate 102R of Reference Example 2, and FIG. 22A to FIG. 22E and FIG. 23A to FIG. 23C are schematic cross-sectional views of the TFT substrate 102R of Reference Example 2.

Figure 22A:
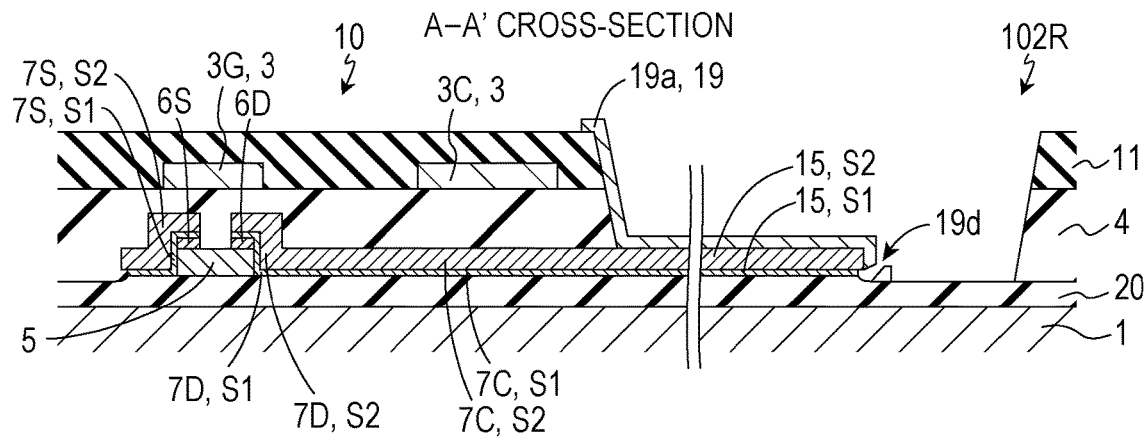
FIG. 22A to FIG. 22E are schematic cross-sectional views of the TFT substrate of Reference Example 2.

With reference to FIG. 21A and FIG. 22A, a description will be given of the TFT substrate 102R of Reference Example 2. FIG. 21A is a schematic plan view of the antenna unit region U of the transmission/reception region R1 of the TFT substrate 102R of Reference Example 2. FIG. 22A is a schematic cross-sectional view of the antenna unit region U of the TFT substrate 102R of Reference Example 2, and shows a cross-section along line A-A' in FIG. 21A.

As shown in FIG. 21A and FIG. 22A, the TFT substrate 102R of Reference Example 2 is different from the TFT substrate 101R of Reference Example 1 shown in FIG. 3A and FIG. 4A in the point of having the TFT 10 with a top gate structure. The gate electrode 3G is positioned above the source electrode 7S and the drain electrode 7D. That is, in the TFT substrate 102R of Reference Example 2, the gate metal layer 3 is positioned above the source metal layer 7. The gate electrode 3G is arranged to overlap the semiconductor layer 5 with the gate insulating layer 4 interposed therebetween. The TFT substrate 102R of Reference Example 2 has the semiconductor layer 5 supported on the dielectric substrate 1, the source metal layer 7 formed on the semiconductor layer 5, the source contact portion 6S and the drain contact portion 6D formed between the semiconductor layer 5 and the source metal layer 7, the gate metal layer 3 formed on the source metal layer 7, and the interlayer insulating layer 11 formed on the gate metal layer 3. The interlayer insulating layer 11 is formed to cover the TFT 10. The TFT substrate 102R of Reference Example 2 also has the upper conductive layer 19 (may be referred to as "first upper conductive layer 19") formed on the interlayer insulating layer 11.

The TFT substrate 102R of Reference Example 2 may further have a base insulating layer 20 between the dielectric substrate 1 and the semiconductor layer 5. The base insulating layer 20 may be formed on the entire surface of the dielectric substrate 1, for example. Here, it is possible to omit the base insulating layer 20.

In the gate insulating layer 4 and the interlayer insulating layer 11, a contact hole CH_a reaching the patch electrode 15 is formed.

The gate insulating layer 4 has an opening portion 4a reaching the patch electrode 15. The interlayer insulating layer 11 has an opening portion 11a overlapping with the opening portion 4a formed in the gate insulating layer 4 when viewed in the direction normal to the dielectric substrate 1. The opening portion 4a formed in the gate insulating layer 4 and the opening portion 11a formed in the interlayer insulating layer 11 form the contact hole CH_a.

The upper conductive layer 19 includes a patch conductive portion 19a connected to the patch electrode 15 in the contact hole CH_a. The patch conductive portion 19a is formed to cover the source metal layer 7 (including the patch electrode 15) exposed in the opening portion 4a.

As shown in FIG. 22A, in the TFT substrate 102R of Reference Example 2, the edge of the lower source metal layer S1 is inside the edge of the upper source metal layer S2 when viewed in the direction normal to the dielectric substrate 1. That is, the source metal layer 7 has a side surface with a reverse taper shape. Since the side surface of the source metal layer 7 has a reverse taper shape, defects are generated in the inorganic layer formed on the source metal layer 7. Here, a defect 19d is generated in the upper conductive layer 19 (the patch conductive portion 19a) formed to cover the patch electrode 15 exposed in the contact hole CH_a. Since the upper conductive layer 19 of the TFT substrate 102R of Reference Example 2 has the defect 19d, metal ions (Cu ions or Al ions) elute from the source metal layer 7 (in particular, the patch electrode 15) to the liquid crystal layer in the scanning antenna provided with the TFT substrate 102R of Reference Example 2, which degrades the liquid crystal material and deteriorates the antenna performance.

In the plan view, for simplicity, the edge of the lower source metal layer S1 and the edge of the upper source metal layer S2 may not be distinguished. In the same manner, for the edges of the source contact portion 6S and the drain contact portion 6D, the edge of the lower source metal layer S1 and/or the edge of the upper source metal layer S2 may not be distinguished.

In this example, metal ions mostly elute from the patch electrode 15 in the electrodes and conductive portions included in the source metal layer 7. The patch electrode 15 is exposed from the gate insulating layer 4 and the interlayer insulating layer 11 by the contact hole CH_a, and is covered with the upper conductive layer 19 (for example, a transparent conductive layer). On the other hand, the gate insulating layer 4 and the interlayer insulating layer 11 are formed on the source metal layer 7 other than on the patch electrode 15. That is, when viewed in the direction normal to the dielectric substrate 1, the source metal layer 7 other than the patch electrode 15 is covered with two inorganic layers (the gate insulating layer 4 and the interlayer insulating layer 11).

In the cross-sectional view, for simplicity, the gate insulating layer 4 and/or the interlayer insulating layer 11 may be expressed as a planarizing layer, but, in general, layers formed by a thin film deposition method (for example, a CVD method, a sputtering method, a vacuum evaporation method) have surfaces reflecting the level difference of the base.

Structure of the TFT Substrate 102R of Reference Example 2 (Non-Transmission/Reception Region R2)

A description will be given of the structure of the non-transmission/reception region R2 of the TFT substrate 102R of Reference Example 2 with reference to FIG. 21A to FIG. 23C. As shown in FIG. 21A to FIG. 23C, also in the non-transmission/reception region R2, the source metal layer 7 has a laminated structure including the lower source metal layer S1 and the upper source metal layer S2, and the edge of the lower source metal layer S1 is inside the edge of the upper source metal layer S2. However, the structure of the non-transmission/reception region R2 of the TFT substrate 102R of Reference Example 2 is not limited to the illustrated example. The problem that the above-described antenna performance deteriorates may occur regardless of the structure outside the seal region Rs in the non-transmission/reception region R2.

Since the TFT substrate 102A (refer to FIG. 28A to FIG. 29) of the present embodiment described below is basically the same as the TFT substrate 102R of Reference Example 2 in the structure of the non-transmission/reception region R2, the description may be combined with that of the TFT substrate 102R of Reference Example 2.

FIG. 21B and FIG. 21C are schematic plan views of the non-transmission/reception region R2 of the TFT substrate 102R of Reference Example 2, and FIG. 22B to FIG. 22E and FIG. 23A to FIG. 23C are schematic cross-sectional views of the non-transmission/reception region R2 of the TFT substrate 102R of Reference Example 2.

Figure 22B:
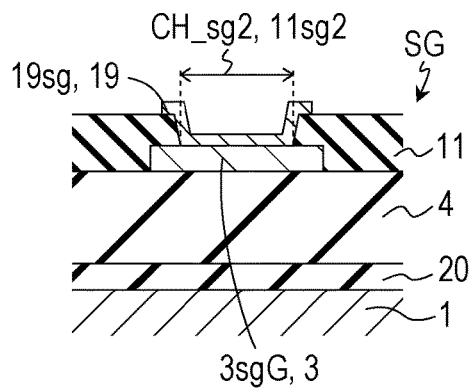
Figure 22C:
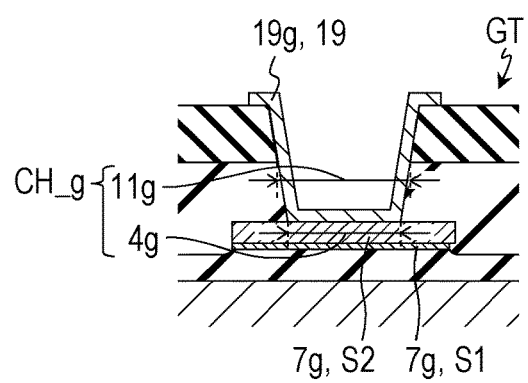
Figure 22D:
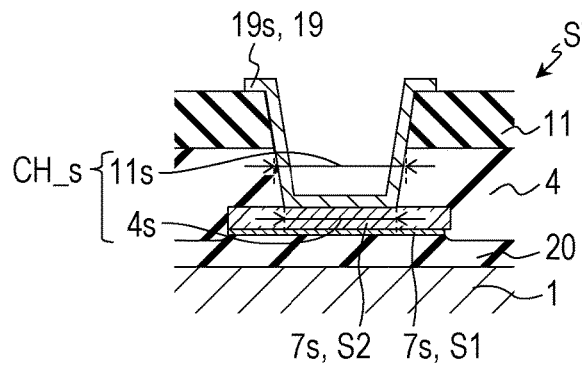
Figure 22E:
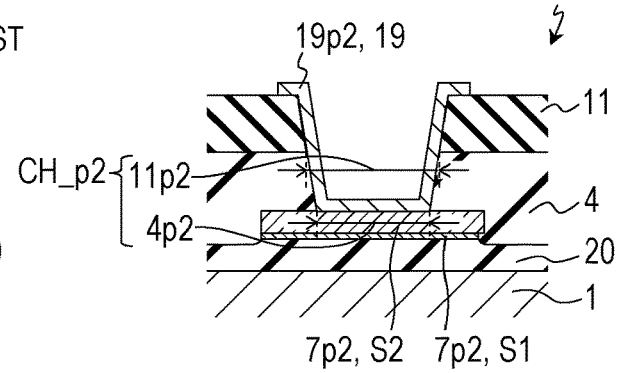
Figure 23A:
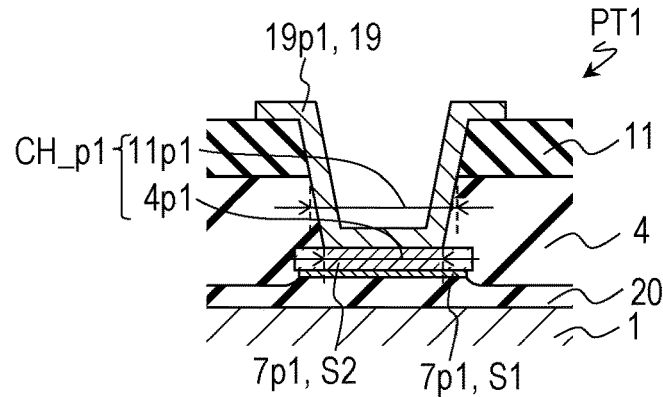
FIG. 23A to FIG. 23C are schematic cross-sectional views of the TFT substrate of Reference Example 2.
Figure 23B:
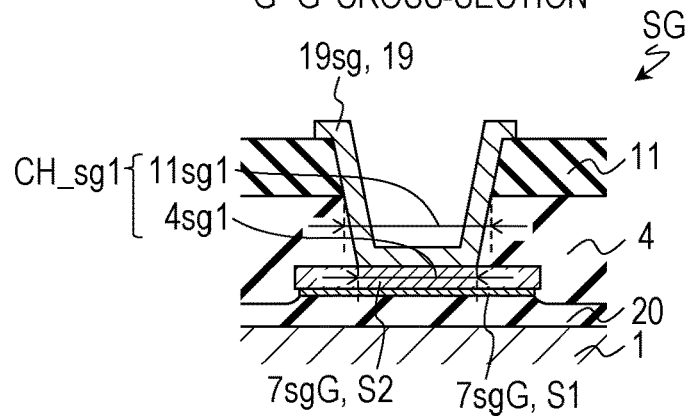
Figure 23C:
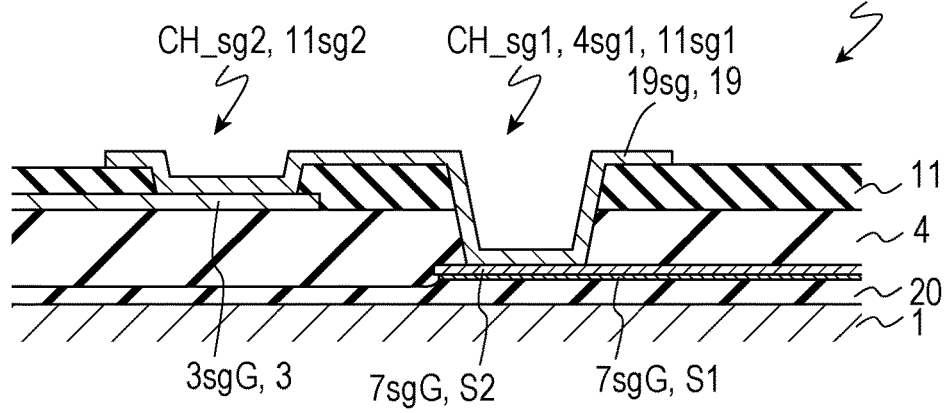

FIG. 21B shows the gate terminal portion GT, the CS terminal portion CT, the transfer terminal portion PT, the source-gate connection portion SG, and the CS-source connection portion SC provided in the non-transmission/reception region R2, and FIG. 21C shows the source terminal portion ST provided in the non-transmission/reception region R2. FIG. 22B shows a cross-section of the source-gate connection portion SG along line B-B' in FIG. 21B, FIG. 22C shows a cross-section of the gate terminal portion GT along line C-C' in FIG. 21B, FIG. 22D shows a cross-section of the source terminal portion ST along line D-D' in FIG. 21C, FIG. 22E shows a cross-section of the second transfer terminal portion PT2 along line E-E' in FIG. 21B, FIG. 23A shows a cross-section of the first transfer terminal portion PT1 along line F-F' in FIG. 21B, FIG. 23B shows a cross-section of the source-gate connection portion SG along line G-G' in FIG. 21B, and FIG. 23C shows a cross-section of the source-gate connection portion SG along line H-H' in FIG. 21B.

Source-Gate Connection Portion SG

The TFT substrate 102R of Reference Example 2 has the source-gate connection portion SG in the non-transmission/reception region R2. The source-gate connection portion SG electrically connects each gate bus line GL to a connection wiring (may be referred to as a "gate lower connection wiring") formed in the source metal layer 7. Providing the source-gate connection portion SG makes it possible to form the lower connection portion of the gate terminal portion GT in the source metal layer 7. The gate terminal portion GT having the lower connection portion formed in the source metal layer 7 is excellent in reliability.

As shown in FIG. 21B, FIG. 22B, FIG. 23B, and FIG. 23C, the source-gate connection portion SG electrically connects the gate bus line GL and a gate lower connection wiring 7sgG via the source bus line upper connection portion 19sg.

Specifically, the source-gate connection portion SG has a gate lower connection wiring 7sgG, the opening portion 4sg1 formed in the gate insulating layer 4, a gate bus line connection portion 3sgG connected to the gate bus line GL, the opening portion 11sg1 and the opening portion 11sg2 formed in the interlayer insulating layer 11, and the upper connection portion 19sg.

The gate lower connection wiring 7sgG is included in the source metal layer 7 and is electrically separated from the source bus line SL.

The opening portion 4sg1 formed in the gate insulating layer 4 reaches the gate lower connection wiring 7sgG.

The gate bus line connection portion 3sgG is included in the gate metal layer 3 and connected to the gate bus line GL. In this example, the gate bus line connection portion 3sgG is extended from the gate bus line GL and formed integrally with the gate bus line GL. The width of the gate bus line connection portion 3sgG may be larger than the width of the gate bus line GL.

The opening portion 11sg1 formed in the interlayer insulating layer 11 overlaps the opening portion 4sg1 formed in the gate insulating layer 4 when viewed in the direction normal to the dielectric substrate 1. The opening portion 4sg1 formed in the gate insulating layer 4 and the opening portion 11sg1 formed in the interlayer insulating layer 11 form the contact hole CH_sg1.

The opening portion 11sg2 formed in the interlayer insulating layer 11 reaches the gate bus line connection portion 3sgG. The opening portion 11sg2 formed in the interlayer insulating layer 11 may be referred to as the contact hole CH_sg2.

The upper connection portion 19sg is included in the upper conductive layer 19. The upper connection portion 19sg is formed on the interlayer insulating layer 11, in the contact hole CH_sg1, and in the contact hole CH_sg2, is connected to the gate lower connection wiring 7sgG in the contact hole CH_sg1, and is connected to the gate bus line connection portion 3sgG in the contact hole CH_sg2. That is, the upper connection portion 19sg is in contact with the gate lower connection wiring 7sgG in the opening portion 4sg1 formed in the gate insulating layer 4, and is in contact with the gate bus line connection portion 3sgG in the opening portion 11sg2 formed in the interlayer insulating layer 11.

In the illustrated example, the contact hole CH_sg2 is formed at a position separated from the contact hole CH_sg1. The present embodiment is not limited thereto, and the contact hole CH_sg1 and the contact hole CH_sg2 may be continuous (that is, may be formed as a single contact hole). The contact hole CH_sg1 and the contact hole CH_sg2 may be formed as a single contact hole in the same step. More specifically, a single contact hole reaching the gate lower connection wiring 7sgG and the gate bus line connection portion 3sgG may be formed in the gate insulating layer 4 and the interlayer insulating layer 11, and the upper connection portion 19sg may be formed in the contact hole and on the interlayer insulating layer 11.

Gate Terminal Portion GT

The TFT substrate 102R of Reference Example 2 has the gate terminal portion GT in the non-transmission/reception region R2. The gate terminal portion GT is generally provided corresponding to the source-gate connection portion SG provided for each gate bus line.

As shown in FIG. 21B and FIG. 22C, the gate terminal portion GT has a gate terminal lower connection portion 7g (may also be referred to simply as a "lower connection portion 7g"), the opening portion 4g formed in the gate insulating layer 4, the opening portion 11g formed in the interlayer insulating layer 11, and the gate terminal upper connection portion 19g (may also be referred to simply as a "upper connection portion 19g").

The lower connection portion 7g is included in the source metal layer 7. The lower connection portion 7g is connected to the gate lower connection wiring 7sgG formed in the source-gate connection portion SG. In this example, the lower connection portion 7g extends from the gate lower connection wiring 7sgG and is formed integrally with the gate lower connection wiring 7sgG.

The opening portion 4g formed in the gate insulating layer 4 reaches the lower connection portion 7g.

The opening portion 11g formed in the interlayer insulating layer 11 overlaps the opening portion 4g formed in the gate insulating layer 4 when viewed in the direction normal to the dielectric substrate 1. The opening portion 4g formed in the gate insulating layer 4 and the opening portion 11g formed in the interlayer insulating layer 11 form the contact hole CH_g.

The upper connection portion 19g is included in the upper conductive layer 19. The upper connection portion 19g is formed on the interlayer insulating layer 11 and in the contact hole CH_g and is connected to the lower connection portion 7g in the contact hole CH_g. That is, the upper connection portion 19g is in contact with the lower connection portion 7g in the opening portion 4g formed in the gate insulating layer 4.

All of the upper connection portions 19g may overlap the lower connection portion 7g when viewed in the direction normal to the dielectric substrate 1.

The gate terminal portion GT does not include the conductive portion included in the gate metal layer 3.

Since the gate terminal portion GT has the lower connection portion 7g included in the source metal layer 7, the gate terminal portion GT has excellent reliability similarly to each terminal portion of the TFT substrate 101A.

Source Terminal Portion ST

The source terminal portion ST may have the same configuration as the gate terminal portion GT, as shown in FIG. 21C and FIG. 22D. The source terminal portion ST is generally provided for each source bus line.

The source terminal portion ST has a source terminal lower connection portion 7s (may also be referred to simply as a "lower connection portion 7*s*"), the opening portion 4*s* formed in the gate insulating layer 4, and the opening portion 11*s* formed in the interlayer insulating layer 11, and a source terminal upper connection portion 19*s* (may be referred to simply as an "upper connection portion 19*s*").

The lower connection portion 7*s* is included in the source metal layer 7 and connected to the source bus line SL. In this example, the lower connection portion 7*s* extends from the source bus line SL and is formed integrally with the source bus line SL.

The opening portion 4*s* formed in the gate insulating layer 4 reaches the lower connection portion 7*s*.

The opening portion 11*s* formed in the interlayer insulating layer 11 overlaps the opening portion 4*s* formed in the gate insulating layer 4 when viewed in the direction normal to the dielectric substrate 1. The opening portion 4*s* formed in the gate insulating layer 4 and the opening portion 11*s* formed in the interlayer insulating layer 11 form the contact hole CH_s.

The upper connection portion 19*s* is included in the upper conductive layer 19. The upper connection portion 19*s* is formed on the interlayer insulating layer 11 and in the contact hole CH_s and is connected to the lower connection portion 7*s* in the contact hole CH_s. That is, the upper connection portion 19*s* is in contact with the lower connection portion 7*s* in the opening portion 4*s* formed in the gate insulating layer 4.

All of the upper connection portions 19*s* may overlap the lower connection portion 7*s* when viewed in the direction normal to the dielectric substrate 1.

The source terminal portion ST does not include the conductive portion included in the gate metal layer 3.

Since the source terminal portion ST has the lower connection portion 7*s* included in the source metal layer 7, the source terminal portion ST has excellent reliability similarly to the gate terminal portion GT.

CS Terminal Portions CT and CS-Source Connection Portion SC

As shown in FIG. 21B, the TFT substrate 102R of Reference Example 2 has the CS terminal portion CT and a CS-source connection portion SC in the non-transmission/reception region R2. The CS-source connection portion SC is provided, for example, for each CS bus line. The CS terminal portion CT is provided corresponding to, for example, a CS-source connection portion SC provided for each CS bus line. Although omitted from the illustration of the cross-section structure, the CS terminal portion CT may have the same configuration as the gate terminal portion GT as shown in FIG. 21B. Although illustration of the cross-sectional structure is also omitted for the CS-source connection portion SC, the CS-source connection portion SC has the same configuration as the source-gate connection portion SG in this example.

Specifically, the CS-source connection portion SC has a CS lower connection wiring 7*sc*, an opening portion 4*sc*1 formed in the gate insulating layer 4, a CS bus line connection portion 3*sc* connected to the CS bus line CL, an opening portion 11*sc*1 and an opening portion 11*sc*2 formed in the interlayer insulating layer 11, and a CS upper connection portion 19*sc* (may be referred to simply as an "upper connection portion 19*sc*").

The CS lower connection wiring 7*sc* is included in the source metal layer 7 and is electrically separated from the source bus line SL.

The opening portion 4*sc*1 formed in the gate insulating layer 4 reaches the CS lower connection wiring 7*sc*.

The CS bus line connection portion 3*sc* is included in the gate metal layer 3 and connected to the CS bus line CL. In this example, the CS bus line connection portion 3*sc* extends from the CS bus line CL and is formed integrally with the CS bus line CL. The width of the CS bus line connection portion 3*sc* may be larger than the width of the CS bus line CL.

The opening portion 11*sc*1 formed in the interlayer insulating layer 11 overlaps the opening portion 4*sc*1 formed in the gate insulating layer 4 when viewed in the direction normal to the dielectric substrate 1. The opening portion 4*sc*1 formed in the gate insulating layer 4 and the opening portion 11*sc*1 formed in the interlayer insulating layer 11 form a contact hole CH_sc1.

The opening portion 11*sc*2 formed in the interlayer insulating layer 11 reaches the CS bus line connection portion 3*sc*. The opening portion 11*sc*2 formed in the interlayer insulating layer 11 may be referred to as a contact hole CH_sc2.

The CS upper connection portion 19*sc* is included in the upper conductive layer 19. The CS upper connection portion 19*sc* is formed on the interlayer insulating layer 11, in the contact hole CH_sc1, and in the contact hole CH_sc2, is connected to the CS lower connection wiring 7*sc* in the contact hole CH_sc1, and is connected to the CS bus line connection portion 3*sc* in the contact hole CH_sc2. That is, the CS upper connection portion 19*sc* is in contact with the CS lower connection wiring 7*sc* in the opening portion 4*sc*1 formed in the gate insulating layer 4, and the CS bus line connection portion 3*sc* in the opening portion 11*sc*2 formed in the interlayer insulating layer 11.

Providing the CS-source connection portion SC makes it possible to form the lower connection portion of the CS terminal portion CT in the source metal layer 7. Due to this, the CS terminal portion CT of the TFT substrate 102R of Reference Example 2 has excellent reliability.

The CS terminal portion CT has a CS terminal lower connection portion 7*c* (may also be referred to simply as the "lower connection portion 7*c*"), the opening portion 4*c* formed in the gate insulating layer 4, the opening portion 11*c* formed in the interlayer insulating layer 11, and the CS terminal upper connection portion 19*c* (may also be referred to simply as the "upper connection portion 19*c*").

The lower connection portion 7*c* is included in the source metal layer 7. The lower connection portion 7*c* is connected to the CS lower connection wiring 7*sc* formed in the CS-source connection portion SC. In this example, the lower connection portion 7*c* extends from the CS lower connection wiring 7*sc*. In this example, the portion extending from the CS lower connection wiring 7*sc* includes a lower connection portion 7*p*1 of the first transfer terminal portion PT1 described below, a lower connection portion 7*p*2 of the second transfer terminal portion PT2, and the lower connection portion 7*c*.

The opening portion 4*c* formed in the gate insulating layer 4 reaches the lower connection portion 7*c*.

The opening portion 11*c* formed in the interlayer insulating layer 11 overlaps the opening portion 4*c* formed in the gate insulating layer 4 when viewed in the direction normal to the dielectric substrate 1. The opening portion 4*c* formed in the gate insulating layer 4 and the opening portion 11*c* formed in the interlayer insulating layer 11 form the contact hole CH_c.

The upper connection portion 19*c* is included in the upper conductive layer 19. The upper connection portion 19*c* is formed on the interlayer insulating layer 11 and in the contact hole CH_c and is connected to the lower connection portion 7c in the contact hole CH_c. That is, the upper connection portion 19c is in contact with the lower connection portion 7c in the opening portion 4c formed in the gate insulating layer 4.

All of the upper connection portions 19c may overlap with the lower connection portion 7c when viewed in the direction normal to the dielectric substrate 1.

The CS terminal portion CT does not include the conductive portion included in the gate metal layer 3.

Since the CS terminal portion CT has the lower connection portion 7c included in the source metal layer 7, the CS terminal portion CT has excellent reliability similarly to the gate terminal portion GT.

In the illustrated example, the source-gate connection portion SG and the CS-source connection portion SC are provided inside (the liquid crystal layer side) of the seal region Rs. The present embodiment is not limited thereto, and the source-gate connection portion SG and/or the CS-source connection portion SC may be provided outside (on the opposite side to the liquid crystal layer) the seal region Rs.

Transfer Terminal Port PT

As shown in FIG. 21B and FIG. 23A, the first transfer terminal portion PT1 has a first transfer terminal lower connection portion 7p1 (may also be referred to simply as the "lower connection portion 7p1"), the opening portion 4p1 formed in the gate insulating layer 4, the opening portion 11p1 formed in the interlayer insulating layer 11, and the first transfer terminal upper connection portion 19p1 (may also be referred to simply as the "upper connection portion 19p1").

The lower connection portion 7p1 is included in the source metal layer 7. The lower connection portion 7p1 is electrically separated from the source bus line SL. The lower connection portion 7p1 is electrically connected to the CS bus line CL. In this example, the lower connection portion 7p1 is integrally formed with the CS lower connection wiring 7sc formed in the CS-source connection portion SC.

The opening portion 4p1 formed in the gate insulating layer 4 reaches the lower connection portion 7p1.

The opening portion 11p1 formed in the interlayer insulating layer 11 overlaps the opening portion 4p1 formed in the gate insulating layer 4 when viewed in the direction normal to the dielectric substrate 1. The opening portion 4p1 formed in the gate insulating layer 4 and the opening portion 11p1 formed in the interlayer insulating layer 11 form the contact hole CH_p1.

The upper connection portion 19p1 is included in the upper conductive layer 19. The upper connection portion 19p1 is formed on the interlayer insulating layer 11 and in the contact hole CH_p1 and is connected to the lower connection portion 7p1 in the contact hole CH_p1. That is, the upper connection portion 19p1 is in contact with the lower connection portion 7p1 in the opening portion 4p1 formed in the gate insulating layer 4. The upper connection portion 19p1 is connected to the transfer terminal connection portion on the slot substrate side, for example, by a sealing material including conductive particles.

In this example, the first transfer terminal portion PT1 does not have a conductive portion included in the gate metal layer 3.

Since the first transfer terminal portion PT1 has the lower connection portion 7p1 included in the source metal layer 7, the first transfer terminal portion PT1 has excellent reliability similarly to the gate terminal portion GT.

In this example, the opening portion 4p1 formed in the gate insulating layer 4 is formed to expose only a portion of the lower connection portion 7p1. The opening portion 4p1 formed in the gate insulating layer 4 is inside the lower connection portion 7p1 when viewed in the direction normal to the dielectric substrate 1. Accordingly, all regions in the opening portion 4p1 have a laminated structure having the lower connection portion 7p1 and the upper connection portion 19p1 on the dielectric substrate 1. In the first transfer terminal portion PT1, all the regions not having the lower connection portion 7p1 have a laminated structure having the gate insulating layer 4 and the interlayer insulating layer 11. Due to this, the first transfer terminal portion PT1 of the TFT substrate 102R of Reference Example 2 has excellent reliability. From the viewpoint of obtaining the effect of having excellent reliability, the thickness of the gate insulating layer 4 and/or the interlayer insulating layer 11 is preferably large.

A portion of the lower connection portion 7p1 in the opening portion 4p1 is covered with the upper connection portion 19p1.

All of the upper connection portions 19p1 may overlap with the lower connection portion 7p1 when viewed in the direction normal to the dielectric substrate 1.

In this example, the lower connection portion 7p1 is arranged between two gate bus lines GL adjacent to each other. The two lower connection portions 7p1 arranged with the gate bus line GL interposed therebetween may be electrically connected via a conductive connection portion (not shown). The conductive connection portion may be formed from the gate metal layer 3.

Here, the lower connection portion 7p1 is connected to the upper connection portion 19p1 by one contact hole CH_p1, but a plurality of contact holes may be provided for one lower connection portion 7p1.

The second transfer terminal portion PT2 is provided outside the seal region Rs (on the opposite side to the transmission/reception region R1). As shown in FIG. 22E, the second transfer terminal portion PT2 has a cross-sectional structure similar to that of the first transfer terminal portion PT1 shown in FIG. 23A. That is, as shown in FIG. 22E, the second transfer terminal portion PT2 has a second transfer terminal lower connection portion 7p2 (may also be referred to simply as a "lower connection portion 7p2"), the opening portion 4p2 formed in the gate insulating layer 4, the opening portion 11p2 formed in the interlayer insulating layer 11, and the second transfer terminal upper connection portion 19p2 (may also be referred to simply as the "upper connection portion 19p2").

The lower connection portion 7p2 is included in the source metal layer 7. The lower connection portion 7p2 is electrically separated from the source bus line SL. The lower connection portion 7p2 is electrically connected to the CS bus line CL. In this example, the lower connection portion 7p2 extends from the first transfer terminal lower connection portion 7p1 extending from the CS lower connection wiring 7sc formed in the CS-source connection portion SC, and is integrally formed with the lower connection portion 7p1.

The opening portion 4p2 formed in the gate insulating layer 4 reaches the lower connection portion 7p2.

The opening portion 11p2 formed in the interlayer insulating layer 11 overlaps the opening portion 4p2 formed in the gate insulating layer 4 when viewed in the direction normal to the dielectric substrate 1. The opening portion 4p2 formed in the gate insulating layer 4 and the opening portion 111p2 formed in the interlayer insulating layer 11 form the contact hole CH_p2.

The upper connection portion 19p2 is included in the upper conductive layer 19. The upper connection portion 19p2 is formed on the interlayer insulating layer 11 and in the contact hole CH_p2 and is connected to the lower connection portion 7p2 in the contact hole CH_p2. That is, the upper connection portion 19p2 is in contact with the lower connection portion 7p2 in the opening portion 4p2 formed in the gate insulating layer 4.

In this example, the second transfer terminal portion PT2 does not have a conductive portion included in the gate metal layer 3.

Since the second transfer terminal portion PT2 has the lower connection portion 7p2 included in the source metal layer 7, the second transfer terminal portion PT2 has excellent reliability similarly to the gate terminal portion GT.

Also in the second transfer terminal portion PT2, the upper connection portion 19p2 may be connected to the transfer terminal connection portion on the slot substrate side, for example, by a sealing material including conductive particles.

First Method of Manufacturing TFT Substrate 102R of Reference Example 2

A description will be given of the first method of manufacturing the TFT substrate 102R of Reference Example 2 with reference to FIG. 24A to FIG. 26C.

FIG. 24A to FIG. 24E, FIG. 25A to FIG. 25D, and FIG. 26A to FIG. 26C are schematic cross-sectional views for illustrating the first method of manufacturing the TFT substrate 102R of Reference Example 2. Each of these diagrams shows a cross-section corresponding to FIG. 22A to FIG. 22C (the A-A' cross-section, the B-B' cross-section, and the C-C' cross-section of the TFT substrate 102R of Reference Example 2).

First, as shown in FIG. 24A, the base insulating layer 20, the intrinsic amorphous silicon film 5', and the n+ type amorphous silicon film 6' are formed in this order on the dielectric substrate 1. Here, for example, a silicon nitride (SixNy) film having a thickness of 200 nm is formed as the base insulating layer 20. Further, for example, the intrinsic amorphous silicon film 5' having a thickness of 120 nm and, for example, the n+ type amorphous silicon film 6' having a thickness of 30 nm are formed. Alternatively, a crystalline silicon film (for example, a polysilicon film) may be formed as the intrinsic amorphous silicon film 5'.

Next, the intrinsic amorphous silicon film 5' and the n+ type amorphous silicon film 6' are patterned to obtain the island-shaped semiconductor layer 5 and the contact portion 6a' as shown in FIG. 24B.

Next, as shown in FIG. 24C, the source lower conductive film S1' is formed on the base insulating layer 20 and the contact portion 6a' by a sputtering method or the like, and a source upper conductive film S2' is formed on the source lower conductive film S1'. Thereafter, the resist layer 80 is formed on the source upper conductive film S2' using a photoresist. It is possible to form the source lower conductive film S1' and the source upper conductive film S2' of, for example, the same materials as exemplified in the above embodiment.

Next, as shown in FIG. 24D, the upper source metal layer S2 is formed by etching the source upper conductive film S2'. As shown in FIG. 24E, the lower source metal layer S1 is formed by etching the source lower conductive film S1', and the contact portion 6a' is etched to form the source contact portion 6S and the drain contact portion 6D. Due to this, the source metal layer 7 having a laminated structure including the lower source metal layer S1 and the upper source metal layer S2 is formed.

Specifically, first, the source upper conductive film S2' is etched by wet etching or dry etching with the resist layer 80 as an etching mask to form the upper source metal layer S2 as shown in FIG. 24D. In this etching step, an etchant having a large etching selection ratio with respect to the etching rate of the source lower conductive film S1' is used. As the etchant, for example, it is possible to use the same etchants as exemplified in the above embodiment.

Next, the source lower conductive film S1' and the contact portion 6a' are etched by dry etching with the resist layer 80 as an etching mask to form the lower source metal layer S1 and the source contact portion 6S and the drain contact portion 6D separated from each other as shown in FIG. 24C. Here, etching of the source lower conductive film S1' and the contact portion 6a' is performed using a chlorine-based gas, for example.

As shown in FIG. 24D, at the point of time before this dry etching step is performed, the region exposed from the resist layer 80 includes a region ra having the contact portion 6a' and a region rb having no contact portion 6a'. Both the region ra and the region rb have the source lower conductive film S1'. In the dry etching step, compared to the region ra, over-etching of the source lower conductive film S1' and/or the base insulating layer 20 is performed in the region rb to the extent that there is no contact portion 6a'. When the etching rate of the source lower conductive film S1' is higher than the etching rate of the source upper conductive film S2' with the etchant used in this dry etching step, the edge of the lower source metal layer S1 comes inside the edge of the upper source metal layer S2 as shown in FIG. 24E. That is, the portion of the source lower conductive film S1' under the resist layer 80 which is the etching mask is also etched (undercut) by the side etching. Due to this, the side surface of the source metal layer 7 has a reverse taper shape. In addition, for example, as shown in FIG. 24E, the base insulating layer 20 is etched in the region GE along the edge of the lower source metal layer S1.

Next, the resist layer 80 is removed, and thereafter, as shown in FIG. 25A, the gate insulating film 4' is formed to cover the source metal layer 7 and the base insulating layer 20. In this example, the gate insulating film 4' is arranged to be in contact with the channel region of the semiconductor layer 5. Here, as the gate insulating film 4', for example, a silicon nitride (SixNy) film having a thickness of 350 nm is formed. At this time, since the source metal layer 7 has a side surface with a reverse taper shape, it may not be possible for the gate insulating film 4' to completely cover the side surface of the source metal layer 7. That is, a defect (not shown) is formed in the gate insulating film 4'. Here, etching the region GE (refer to FIG. 24E) along the edge of the lower source metal layer S1 in the base insulating layer 20 may increase the defects in the gate insulating film 4'.

Next, as shown in FIG. 25B, the gate conductive film 3' is formed on the gate insulating film 4'. Here, as the gate conductive film 3', a laminated film (MoN/Al) in which an Al film (thickness: 150 nm, for example) and a MoN film (thickness: 100 nm, for example) are laminated in this order is formed.

Next, the gate conductive film 3' is patterned to obtain the gate metal layer 3 as shown in FIG. 25C. Specifically, the gate electrode 3G including a portion facing the semiconductor layer 5 with the gate insulating film 4' interposed therebetween, a gate bus line GL connected to the gate electrode 3G, the auxiliary capacitance counter electrode 3C including a portion facing the auxiliary capacitance electrode 7C with the gate insulating film 4' interposed therebetween, the CS bus line CL connected to the auxiliary capacitance counter electrode 3C, a gate bus line connection portion 3sgG in the source-gate connection portion forming region, and a CS bus line connection portion 3*sc* of a CS-source connection portion forming region, are formed. Here, the patterning of the gate conductive film 3' is performed by wet etching. In this manner, the TFT 10 is obtained.

Here, in the source-gate connection portion forming region, at least a portion of the gate lower connection wiring 7*sg*G is formed to not overlap the gate bus line connection portion 3*sg*G. In the CS-source connection portion forming region, at least a portion of the CS lower connection wiring 7*sc* is formed to not overlap the CS bus line connection portion 3*sc*. In the antenna unit forming region, the gate metal layer 3 is formed to not overlap the patch electrode 15. In addition, each terminal portion forming region does not have a conductive portion included in the gate metal layer 3.

Next, as shown in FIG. 25D, the interlayer insulating film 11' is formed to cover the TFT 10 and the gate metal layer 3. Here, as the interlayer insulating film 11', for example, a silicon nitride (SixNy) film having a thickness of 300 nm is formed. When the interlayer insulating film 11' is formed, it is possible for the side surface of the source metal layer 7 exposed from the defect of the gate insulating layer 4 to be covered with the interlayer insulating film 11'.

Next, the interlayer insulating film 11' and the gate insulating film 4' are etched by a known photolithography process to obtain the interlayer insulating layer 11 and the gate insulating layer 4 as shown in FIG. 26A. Specifically, the contact hole CH_a reaching the patch electrode 15 in the antenna unit forming region, the contact hole CH_g reaching the lower connection portion 7*g* in the gate terminal portion forming region, the contact hole CH_s reaching the lower connection portion 7*s* in the source terminal portion forming region, the contact hole CH_c reaching the lower connection portion 7*c* in the CS terminal portion forming region, the contact hole CH_p1 reaching the lower connection portion 7*p*1 in the first transfer terminal portion forming region, the contact hole CH_p2 reaching the lower connection portion 7*p*2 in the second transfer terminal portion forming region, the contact hole CH_sg1 reaching the gate lower connection wiring 7*sg*G and the contact hole CH_sg2 (the opening portion 11*sg*2) reaching the gate bus line connection portion 3*sg*G in the source-gate connection portion forming region, and the contact hole CH_sc1 reaching the CS lower connection wiring 7*sc* and the contact hole CH_sc2 (the opening portion 11*sc*2) reaching the CS bus line connection portion 3*sc* in the CS-source connection portion forming region, are formed.

In the antenna unit forming region, the contact hole CH_a is formed to expose a side surface of the patch electrode 15. That is, the reverse tapered side surface of the patch electrode 15 included in the source metal layer 7 is exposed.

In this etching step, the interlayer insulating film 11' and the gate insulating film 4' are etched with the gate metal layer 3 as an etch stop. For example, in the source-gate connection portion forming region, the interlayer insulating film 11' and the gate insulating film 4' are etched as a batch in the forming region of the contact hole CH_sg1, while only the interlayer insulating film 11' is etched in the forming region of the contact hole CH_sg2 (the opening portion 11*sg*2) due to the gate bus line connection portion 3*sg*G functioning as an etch stop. Due to this, the contact hole CH_sg1 and the contact hole CH_sg2 (the opening portion 11*sg*2) are obtained. The contact hole CH_sg1 is formed in the gate insulating layer 4 and has the opening portion 4*sg*1 reaching the gate lower connection wiring 7*sg*G and the opening portion 11*sg*1 formed in the interlayer insulating layer 11 and overlapping the opening portion 4*sg*1. Here, since at least a portion of the gate lower connection wiring 7*sg*G is formed to not overlap the gate bus line connection portion 3*sg*G, the contact hole CH_sg1 having the opening portion 4*sg*1 and the opening portion 11*sg*1 is formed. The side surface of the opening portion 4*sg*1 may be aligned with the side surface of the opening portion 11*sg*1 on the side surface of the contact hole CH_sg1.

The interlayer insulating film 11' and the gate insulating film 4' are etched as a batch using, for example, the same etchant. Here, the interlayer insulating film 11' and the gate insulating film 4' are etched by dry etching using a fluorine-based gas. The interlayer insulating film 11' and the gate insulating film 4' may be etched using different etchants.

As described above, among the contact holes to be formed, in the contact hole having the opening portion formed in the interlayer insulating layer 11 and the opening portion formed in the gate insulating layer 4, it is possible to align the side surface of the opening portion formed in the interlayer insulating layer 11 and the side surface of the opening portion formed in the gate insulating layer 4.

In the CS-source connection portion forming region, the interlayer insulating film 11' and the gate insulating film 4' are etched as a batch in the forming region of the contact hole CH_sc1, while only the interlayer insulating film 11' is etched in the forming region of the contact hole CH_sc2 (the opening portion 11*sc*2) due to the CS bus line connection portion 3*sc* functioning as an etch stop. Due to this, the contact hole CH_sc1 and the contact hole CH_sc2 (the opening portion 11*sc*2) are obtained. The contact hole CH_sc1 has the opening portion 4*sc*1 formed in the gate insulating layer 4 and reaching the CS lower connection wiring 7*sc* and the opening portion 11*sc*1 formed in the interlayer insulating layer 11 and overlapping the opening portion 4*sc*1. Here, since at least a portion of the CS lower connection wiring 7*sc* is formed to not overlap the CS bus line connection portion 3*sc*, the contact hole CH_sc1 having the opening portion 4*sc*1 and the opening portion 11*sc*1 is formed. The side surface of the opening portion 4*sc*1 may be aligned with the side surface of the opening portion 11*sc*1 on the side surface of the contact hole CH_sc1.

In the antenna unit forming region, the interlayer insulating film 11' and the gate insulating film 4' are etched as a batch to form the contact hole CH_a since the gate metal layer 3 is formed to not overlap the patch electrode 15 when viewed in the direction normal to the dielectric substrate 1. The contact hole CH_a has the opening portion 4*a* formed in the gate insulating layer 4 and reaching the patch electrode 15 and the opening portion 11*a* formed in the interlayer insulating layer 11 and overlapping the opening portion 4*a*. The side surface of the opening portion 4*a* may be aligned with the side surface of the opening portion 11*a* on the side surface of the contact hole CH_a.

In each of the terminal portion forming regions, the interlayer insulating film 11' and the gate insulating film 4' are etched as a batch since the conductive portion included in the gate metal layer 3 is not formed.

In the gate terminal portion forming region, the interlayer insulating film 11' and the gate insulating film 4' are etched as a batch to form the contact hole CH_g since the conductive portion included in the gate metal layer 3 is not formed. The contact hole CH_g has the opening portion 4*g* formed in the gate insulating layer 4 and reaching the lower connection portion 7*g* and the opening portion 11*g* formed in the interlayer insulating layer 11 and overlapping the opening portion 4*g*. The side surface of the opening portion 4*g* may be aligned with the side surface of the opening portion 11*g* on the side surface of the contact hole CH_g.

In the source terminal portion forming region, the interlayer insulating film 11' and the gate insulating film 4' are etched as a batch to form the contact hole CH_s since the conductive portion included in the gate metal layer 3 is not formed. The contact hole CH_s has the opening portion 4s formed in the gate insulating layer 4 and reaching the lower connection portion 7s and the opening portion 11s formed in the interlayer insulating layer 11 and overlapping the opening portion 4s. The side surface of the opening portion 4s may be aligned with the side surface of the opening portion his on the side surface of the contact hole CH_s.

In the CS terminal portion forming region, the interlayer insulating film 11' and the gate insulating film 4' are etched as a batch to form the contact hole CH_c since the conductive portion included in the gate metal layer 3 is not formed. The contact hole CH_c has the opening portion 4c formed in the gate insulating layer 4 and reaching the lower connection portion 7c and the opening portion 11c formed in the interlayer insulating layer 11 and overlapping the opening portion 4c. The side surface of the opening portion 4c may be aligned with the side surface of the opening portion 11c on the side surface of the contact hole CH_c.

In the first transfer terminal portion forming region, the interlayer insulating film 11' and the gate insulating film 4' are etched as a batch to form the contact hole CH_p1 since the conductive portion included in the gate metal layer 3 is not formed. The contact hole CH_p1 has the opening portion 4p1 formed in the gate insulating layer 4 and reaching the lower connection portion 7p1 and the opening portion 11p1 formed in the interlayer insulating layer 11 and overlapping the opening portion 4p1. The side surface of the opening portion 4p1 may be aligned with the side surface of the opening portion 11p1 on the side surface of the contact hole CH_p1.

In the second transfer terminal portion forming region, the interlayer insulating film 11' and the gate insulating film 4' are etched as a batch to form the contact hole CH_p2 since the conductive portion included in the gate metal layer 3 is not formed. The contact hole CH_p2 has the opening portion 4p2 formed in the gate insulating layer 4 and reaching the lower connection portion 7p2 and the opening portion 11p2 formed in the interlayer insulating layer 11 and overlapping the opening portion 4p2. The side surface of the opening portion 4p2 may be aligned with the side surface of the opening portion 11p2 on the side surface of the contact hole CH_p2.

Next, as shown in FIG. 26B, the upper conductive film 19' (may also be referred to as a "first upper conductive film 19'") is formed by, for example, a sputtering method on the interlayer insulating layer 11 in the contact hole CH_a, the contact hole CH_g, the contact hole CH_s, the contact hole CH_c, the contact hole CH_p1, the contact hole CH_p2, the contact hole CH_sg1, the contact hole CH_sg2, the contact hole CH_sc1, and the contact hole CH_sc2. It is possible to form the upper conductive film 19', for example, with the same film as exemplified in the above embodiment.

Next, the upper conductive layer 19 is obtained as shown in FIG. 26C by patterning the upper conductive film 19'. Specifically, the patch conductive portion 19a covering the patch electrode 15 in the contact hole CH_a in the antenna unit region U, the upper connection portion 19g connected to the lower connection portion 7g in the contact hole CH_g in the gate terminal portion GT, the upper connection portion 19s connected to the lower connection portion 7s in the contact hole CH_s in the source terminal portion ST, the upper connection portion 19c connected to the lower connection portion 7c in the contact hole CH_c in the CS terminal portion CT, the upper connection portion 19p1 connected to the lower connection portion 7p1 in the contact hole CH_p1 in the first transfer terminal portion PT1, the upper connection portion 19p2 in contact with the lower connection portion 7p2 in the contact hole CH_p2 in the second transfer terminal portion PT2, the upper connection portion 19sg connected to the gate lower connection wiring 7sgG in the contact hole CH_sg1 in the source-gate connection portion SG and connected to the gate bus line connection portion 3sgG in the contact hole CH_sg2 (the opening portion 11sg2), and a CS upper connection portion 19sc connected to the CS lower connection wiring 7sc in the contact hole CH_sc1 in the CS source connection portion SC and connected to the CS bus line connection portion 3sc in the contact hole CH_sc2 (the opening portion 11sc2) are formed.

Since the side surface of the patch electrode 15 has a reverse taper shape, it may not be possible for the patch conductive portion 19a to completely cover the side surface of the patch electrode 15. That is, the defect 19d is generated in the upper conductive layer 19 (the patch conductive portion 19a). In this manner, in the antenna unit region U of the TFT substrate 102R of Reference Example 2, a place is generated where the source metal layer 7 is exposed without being covered with the inorganic layer.

Due to this, the antenna unit region U, the gate terminal portion GT, the source terminal portion ST, the CS terminal portion CT, the first transfer terminal portion PT1, the second transfer terminal portion PT2, the source-gate connection portion SG, and the CS-source connection portion SC are obtained.

In this manner, the TFT substrate 102R of Reference Example 2 is manufactured.

Second Method of Manufacturing TFT Substrate 102R of Reference Example 2

The TFT substrate 102R of Reference Example 2 is also manufactured by the method described below.

Figure 27A:
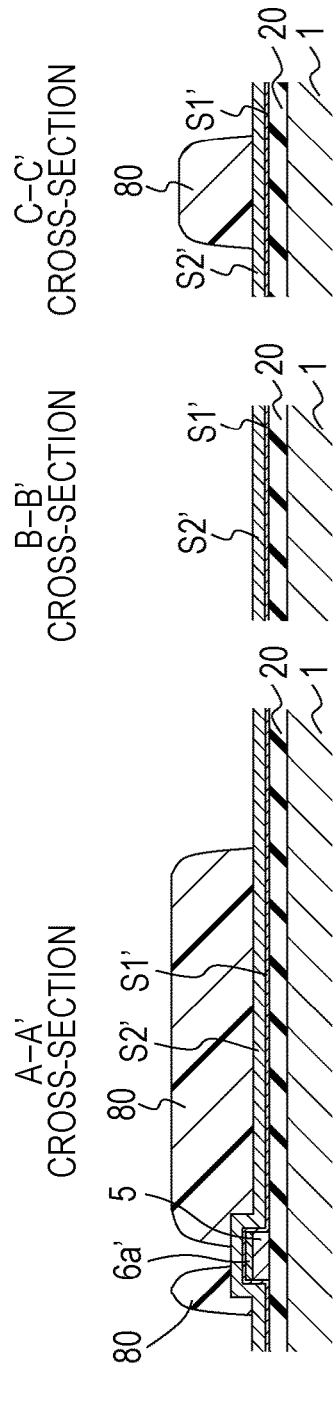
FIG. 27A to FIG. 27C are schematic cross-sectional views for illustrating a second method of manufacturing the TFT substrate of Reference Example 2.
Figure 27B:
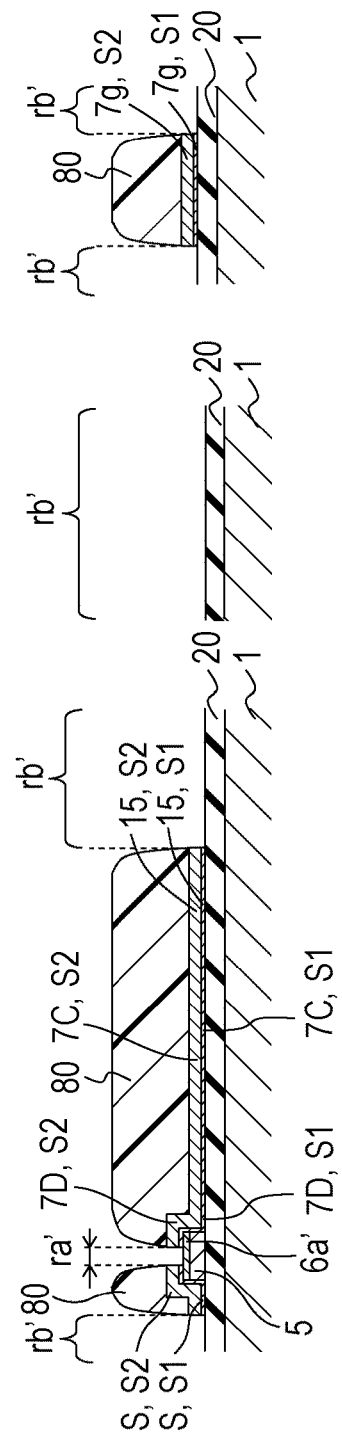
Figure 27C:
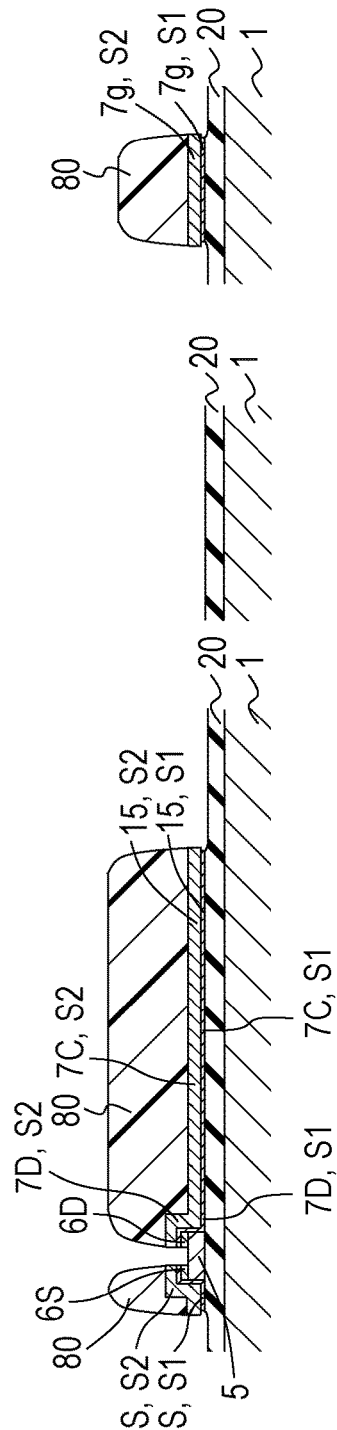

With reference to FIG. 27A to FIG. 27C, a description will be given of the second method of manufacturing the TFT substrate 102R of Reference Example 2.

The second method of manufacturing the TFT substrate 102R of Reference Example 2 is different from the first manufacturing method described with reference to FIG. 24A to FIG. 26C in the method of forming the source contact portion 6S, the drain contact portion 6D, the lower source metal layer S1, and the upper source metal layer S2. In the first manufacturing method, the source upper conductive film S2' is etched (wet etching or dry etching), and then the source lower conductive film S1' and the contact portion 6a' are etched by dry etching. In contrast, in the second manufacturing method, the source upper conductive film S2' and the source lower conductive film S1' are etched (wet etching or dry etching), and then the contact portion 6a' is etched by dry etching.

FIG. 27A to FIG. 27C are schematic cross-sectional views for illustrating the second method of manufacturing the TFT substrate 102R of Reference Example 2. Each of these diagrams shows a cross-section corresponding to FIG. 22A to FIG. 22C (the A-A' cross-section, the B-B' cross-section, and the C-C' cross-section of the TFT substrate 102R of Reference Example 2). A description will be given below mostly of points of difference from the first manufacturing method.

First, as shown in FIG. 24A and FIG. 24B, the base insulating layer 20, the island-shaped semiconductor layer 5, and the contact portion 6a' are formed on the dielectric substrate 1.

Next, as shown in FIG. 27A, the source lower conductive film S1' is formed on the base insulating layer 20 and on the contact portion 6a' by a sputtering method or the like, and a source upper conductive film S2' is formed on the source lower conductive film S1'. Thereafter, the resist layer 80 is formed on the source upper conductive film S2' using a photoresist.

Next, the source upper conductive film S2' and the source lower conductive film S1' are etched by wet etching or dry etching with the resist layer 80 as an etching mask to form the upper source metal layer S2 and the lower source metal layer S1 as shown in FIG. 27B. In this etching step, the etching rate of the source lower conductive film S1' is the etching rate of the source upper conductive film S2' or lower. Therefore, at the point of time when this etching step is completed, the edge of the lower source metal layer S1 does not enter inside of the edge of the upper source metal layer S2.

Next, the contact portion 6a' is etched by dry etching with the resist layer 80 as an etching mask to form the source contact portion 6S and the drain contact portion 6D separated from each other as shown in FIG. 27C. Here, the etching of the contact portion 6a' is performed using, for example, a chlorine-based gas.

As shown in FIG. 27B, at the point of time before this dry etching step is performed, the region exposed from the resist layer 80 has the region ra' having the contact portion 6a' and the region rb' having no contact portion 6a. This method is different from the first manufacturing method in the point that the region ra' and region rb' do not have the source lower conductive film S1'. In the dry etching step, compared to the region ra, side etching of the source lower conductive film S1' and/or over etching of the base insulating layer 20 is performed in the region rb' to the extent that there is no contact portion 6a'. When the etching rate of the lower source metal layer S1 is higher than the etching rate of the upper source metal layer S2 with the etchant used in this dry etching step, the lower source metal layer S1 is further etched in the dry etching step. Accordingly, as shown in FIG. 27C, the edge of the lower source metal layer S1 enters inside the edge of the upper source metal layer S2. That is, the side etching also etches a portion of the lower source metal layer S1 under the resist layer 80 which is an etching mask. Due to this, the side surface of the source metal layer 7 has a reverse taper shape. In addition, for example, as shown in FIG. 27C, the base insulating layer 20 is etched in the region GE along the edge of the lower source metal layer S1.

Thereafter, the TFT substrate 102R of Reference Example 2 is manufactured by performing the same steps as those described with reference to FIG. 25A to FIG. 25D and FIG. 26A to FIG. 26C. As described with reference to FIG. 26D, since the side surface of the patch electrode 15 included in the source metal layer 7 has a reverse taper shape, the defect 19d is generated in the upper conductive layer 19 (the patch conductive portion 19a). Due to this, in the antenna unit region U of the TFT substrate 102R of Reference Example 2, a place is generated where the source metal layer 7 is exposed without being covered with the inorganic layer.

TFT Substrate 102A

A description will be given of the structure of the antenna unit region U of the TFT substrate 102A of the scanning antenna of the present embodiment with reference to FIG. 28A and FIG. 29.

Figure 28A:
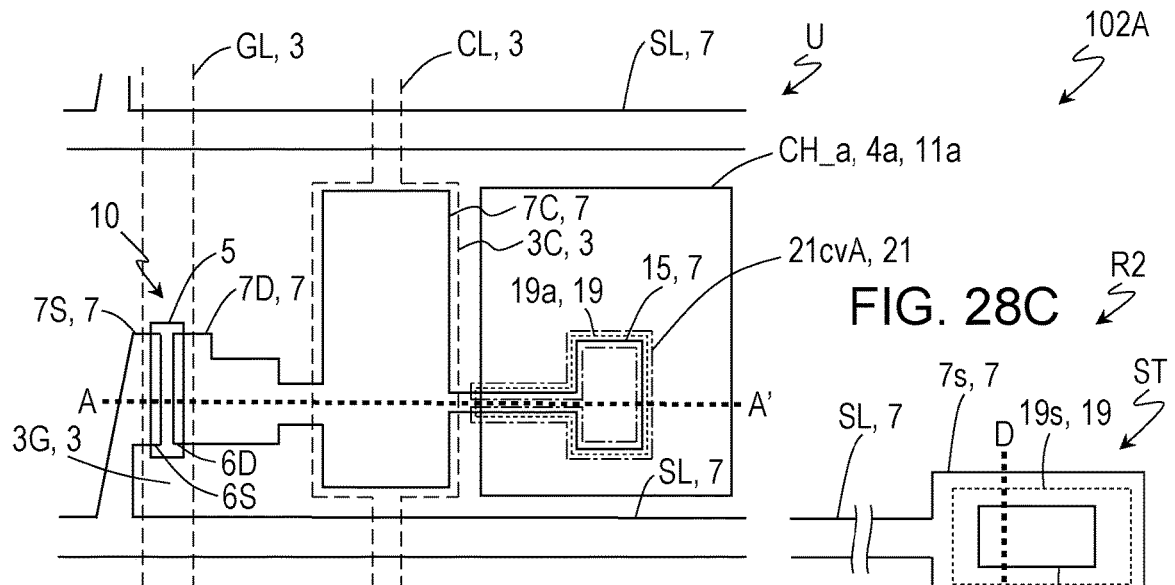
FIG. 28A is a schematic plan view of the antenna unit region of the transmission/reception region of a TFT substrate according to a second embodiment of the present disclosure.

FIG. 28A is a schematic plan view of the antenna unit region U of the transmission/reception region R1 of the TFT substrate 102A. FIG. 29 is a schematic cross-sectional view of the TFT substrate 102A and shows a cross-section along line A-A' in FIG. 28A.

As shown in FIG. 28A and FIG. 29, the TFT substrate 102A is different from the TFT substrate 101A in the point of having the TFT 10 with a top gate structure. The gate electrode 3G is positioned above the source electrode 7S and the drain electrode 7D. That is, the gate metal layer 3 is positioned above the source metal layer 7. The TFT substrate 102A is different from the TFT substrate 102R of Reference Example 2 in the point of also having a second upper conductive layer formed on the first upper conductive layer 19.

As shown in FIG. 28A and FIG. 29, the TFT substrate 102A has the dielectric substrate 1, and a plurality of antenna unit regions U arranged on the dielectric substrate 1 and each having the TFT 10 and the patch electrode 15 electrically connected to the drain electrode 7D of the TFT 10. The TFT substrate 102A has the semiconductor layer 5 of the TFT 10, the gate metal layer 3 including the gate electrode 3G of the TFT 10, the gate insulating layer 4 formed between the gate metal layer 3 and the semiconductor layer 5, the source metal layer 7 formed on the semiconductor layer 5 and including the source electrode 7S and the drain electrode 7D electrically connected to the semiconductor layer 5, the source contact portion 6S formed between the semiconductor layer 5 and the source electrode 7S, and the contact layer 6 including the drain contact portion 6D formed between the semiconductor layer 5 and the drain electrode 7D. The TFT substrate 102A also has the interlayer insulating layer 11 covering the TFT 10, a first upper conductive layer 19 formed on the interlayer insulating layer 11, and a second upper conductive layer 21 formed on the first upper conductive layer 19. The source metal layer 7 has a laminated structure including the lower source metal layer S1 including at least one element selected from the group consisting of Ti, Ta, and W, the upper source metal layer S2 formed on the lower source metal layer S1 and including Cu or Al. The edge of the lower source metal layer S1 is inside the edge of the upper source metal layer S2 when viewed in the direction normal to the dielectric substrate 1. The edge of the lower source metal layer S1 and the edge of the upper source metal layer S2 of the plurality of antenna unit regions U are covered with at least two inorganic layers when viewed in the direction normal to the dielectric substrate 1. The at least two inorganic layers include any one of the gate insulating layer 4, the interlayer insulating layer 11, the first upper conductive layer 19, and the second upper conductive layer 21.

Due to this, in the scanning antenna provided with the TFT substrate 102A, it is possible to suppress the metal ions (Cu ions or Al ions) from eluting from the source metal layer 7 to the liquid crystal layer LC. It is possible to suppress the deterioration of the antenna performance for the scanning antenna provided with the TFT substrate 102A.

In this example, the source metal layer 7 includes the patch electrode 15, and the contact hole CH_a reaching the patch electrode 15 is formed in the gate insulating layer 4 and the interlayer insulating layer 11. The gate insulating layer 4 and the interlayer insulating layer 11 are formed to cover almost the entire surface of the antenna unit region U except for the contact hole CH_a. The first upper conductive layer 19 (the patch conductive portion 19a) in the antenna unit region U is formed to cover the lower source metal layer S1 and the upper source metal layer S2 (including the patch electrode 15) exposed in the contact hole CH_a when viewed in the direction normal to the dielectric substrate 1.

The second upper conductive layer 21cvA of the antenna unit region U is formed to cover the edge of the lower source metal layer S1 and the edge of the upper source metal layer S2 of the source metal layer 7 (including the patch electrode 15) exposed in the contact hole CH_a when viewed in the direction normal to the dielectric substrate 1. Accordingly, in the edge of the lower source metal layer S1 and the edge of the upper source metal layer S2 in the plurality of antenna unit regions U, the edge of the lower source metal layer S1 and the edge of the upper source metal layer S2 exposed in the contact hole CH_a are covered with the first upper conductive layer 19 and the second upper conductive layer 21 when viewed in the direction normal to the dielectric substrate 1, and, outside the above, the edge of the lower source metal layer S1 and the edge of the upper source metal layer S2 are covered with at least the gate insulating layer 4 and the interlayer insulating layer 11 when viewed in the direction normal to the dielectric substrate 1.

In the present embodiment, since the source electrode 7S and the drain electrode 7D are covered with the gate insulating layer 4 and the interlayer insulating layer 11 (that is, two inorganic layers), a further conductive layer is not formed. Accordingly, the possibility of the occurrence of a short circuit between the source electrode 7S and the drain electrode 7D is not considered.

The shapes of the first upper conductive layer 19 and the second upper conductive layer 21 are not limited to the illustrated examples. The first upper conductive layer 19 and/or the second upper conductive layer 21 are preferably formed to cover the patch electrode 15 exposed in the contact hole CH_a when viewed in the direction normal to the dielectric substrate 1. The first upper conductive layer 19 and/or the second upper conductive layer 21 are preferably formed to cover a portion of the source metal layer 7 exposed in the contact hole CH_a when viewed in the direction normal to the dielectric substrate 1.

Each of the first upper conductive layer 19 and the second upper conductive layer 21 includes, for example, a transparent conductive layer (for example, an ITO layer). The first upper conductive layer 19 and the second upper conductive layer 21 may be each independently formed of, for example, only a transparent conductive layer, or may have a laminated structure including a first layer including a transparent conductive layer, and a second layer formed under the first layer. The second layer is formed, for example, of one layer or a laminate of two or more layers selected from the group consisting of a Ti layer, a MoNbNi layer, a MoNb layer, a MoW layer, a W layer, and a Ta layer. The sum of the thicknesses of the first upper conductive layer 19 and the second upper conductive layer 21 is preferably 40 nm or more in order to more reliably cover the reverse tapered side surface of the source metal layer 7.

Figure 28C:
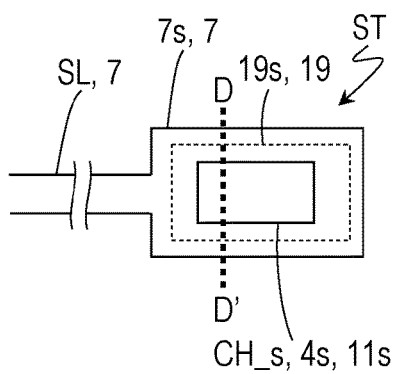
FIG. 28B and FIG. 28C are schematic plan views of the non-transmission/reception region of the TFT substrate.
Figure 28B:
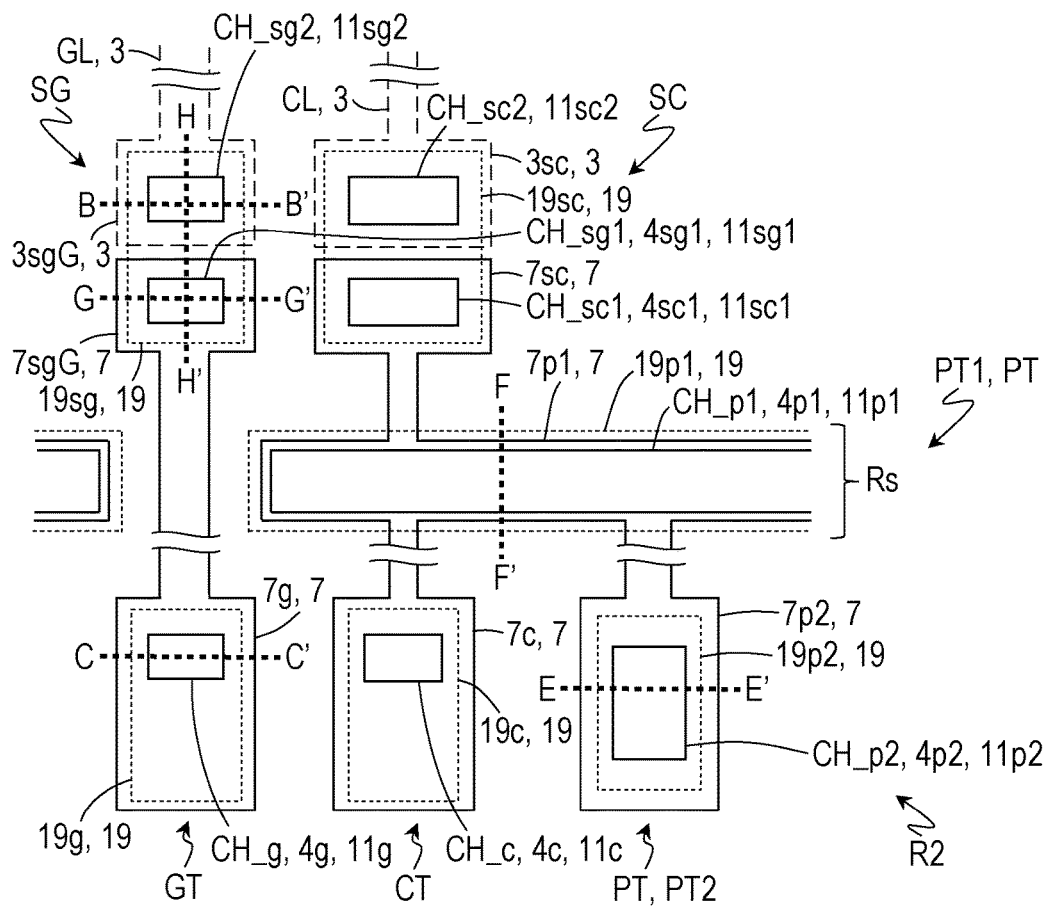

FIG. 28B and FIG. 28C are schematic plan views of the non-transmission/reception region R2 of the TFT substrate 102A. The structure of the non-transmission/reception region R2 of the TFT substrate 102A shown in FIG. 28B and FIG. 28C is the same as that of the TFT substrate 102R of Reference Example 2, thus, a description thereof will be omitted. The non-transmission/reception region R2 of the TFT substrate 102A is not limited to the examples shown in FIG. 28B and FIG. 28C, and may be an arbitrary region.

Method of Manufacturing TFT Substrate 102A

With reference to FIG. 30A and FIG. 30B, a description will be given of a method of manufacturing the TFT substrate 102A.

FIG. 30A and FIG. 30B are schematic cross-sectional views for illustrating the method of manufacturing the TFT substrate 102A. Each of these diagrams shows the A-A' cross-section (cross-section corresponding to FIG. 29), the B-B' cross-section, and the C-C' cross-section of the TFT substrate 102A. A description will be given below mostly of points of difference from the first method of manufacturing the TFT substrate 102R of Reference Example 2 with reference to FIG. 24A to FIG. 26C.

First, as described with reference to FIG. 24A to FIG. 24E, FIG. 25A to FIG. 25D, and FIG. 26A to FIG. 26C, the base insulating layer 20, the island-shaped semiconductor layer 5, the contact layer 6, the source metal layer 7, the gate insulating layer 4, the gate metal layer 3, the interlayer insulating layer 11, and the first upper conductive layer 19 are formed on the dielectric substrate 1.

Next, as shown in FIG. 30A, the second upper conductive film 21' is formed by, for example, a sputtering method on the first upper conductive layer 19, on the interlayer insulating layer 11, and in the contact hole CH_a. The second upper conductive film 21' includes, for example, a transparent conductive film. It is possible to form the second upper conductive film 21', for example, of the same film as the first upper conductive film 19'. Here, a laminated film (ITO/Ti) in which Ti (thickness: 50 nm, for example) and ITO (thickness: 70 nm, for example) are laminated in this order is used as the second upper conductive film 21'.

Next, the second upper conductive film 21' is patterned to obtain the second upper conductive layer 21 (21cvA) as shown in FIG. 30B. The second upper conductive layer 21 (21 cv A) is formed to cover the edge of the lower source metal layer S1 and the edge of the upper source metal layer S2 of the source metal layer 7 (including the patch electrode 15) exposed in the contact hole CH_a when viewed in the direction normal to the dielectric substrate 1. It is possible to perform the patterning of the second upper conductive film 21' using, for example, an etchant similar to that of the first upper conductive film 19'.

Due to this, it is possible to obtain the antenna unit region U, the gate terminal portion GT, the source terminal portion ST, the CS terminal portion CT, the first transfer terminal portion PT1, the second transfer terminal portion PT2, the source-gate connection portion SG, and the CS-source connection portion SC.

In this manner, the TFT substrate 102A is manufactured.

Here, a description has mostly been given of the points of difference from the first method of manufacturing the TFT substrate 102R of Reference Example 2, but the TFT substrate 102A of the present embodiment may be manufactured by applying the second method of manufacturing the TFT substrate 102R of Reference Example 2 described with reference to FIG. 27A to FIG. 27C.

Modification Example

With reference to FIG. 31A to FIG. 33C, a description will be given of the TFT substrate 102B according to a modification example of the present embodiment. The configuration common to the TFT substrate 102A is denoted by the same reference numerals, and a description thereof may be omitted.

Figure 32A:
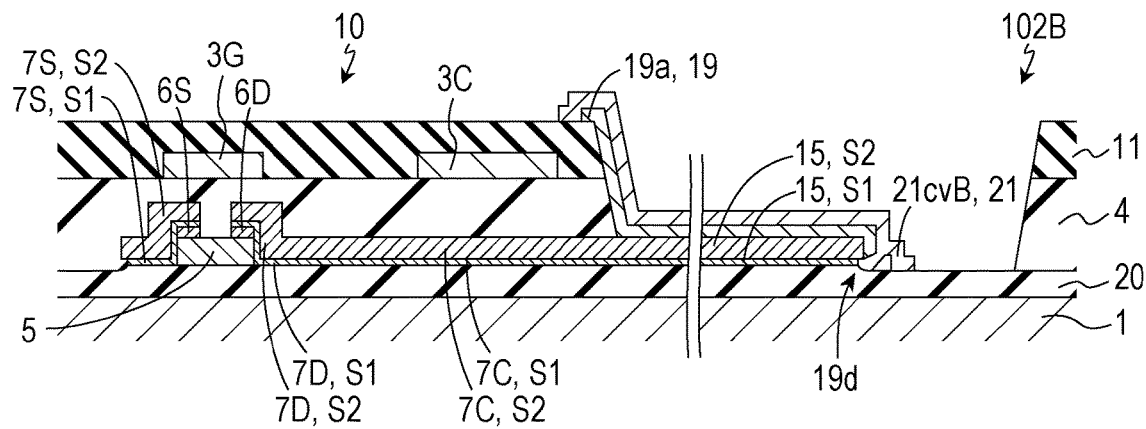
FIG. 32A to FIG. 32E are schematic cross-sectional views of the TFT substrate.
Figure 32B:
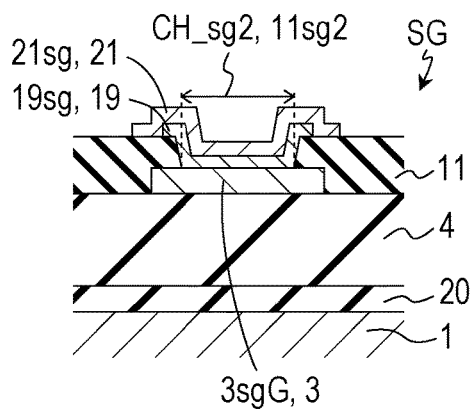
Figure 32C:
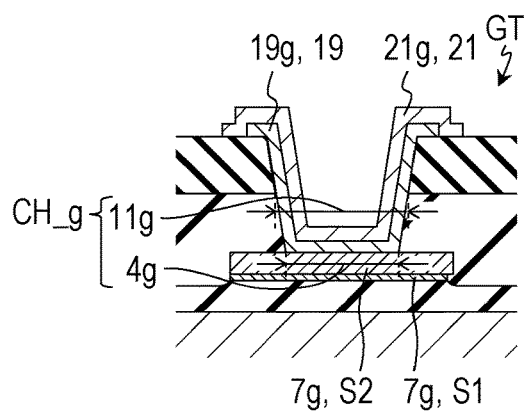
Figure 32D:
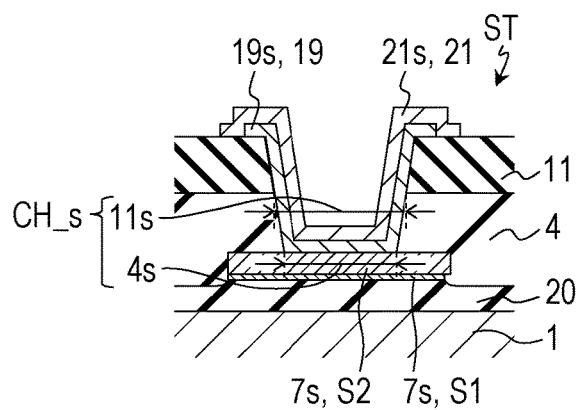
Figure 32E:
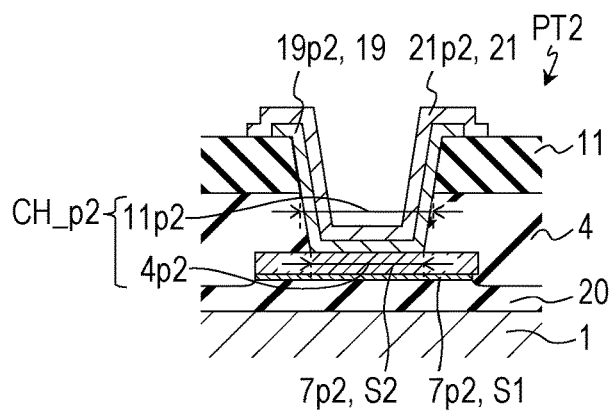
Figure 33A:
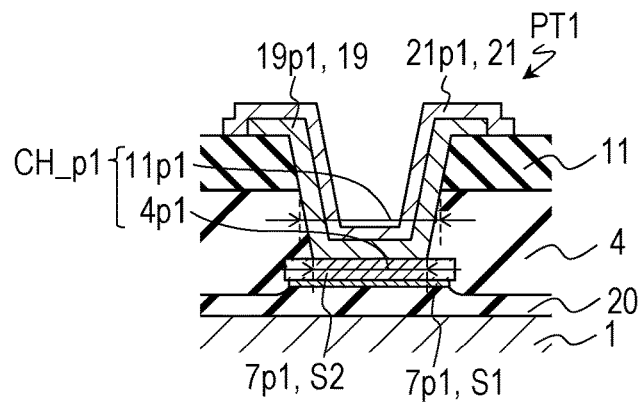
FIG. 33A to FIG. 33C are schematic cross-sectional views of the TFT substrate.
Figure 33B:
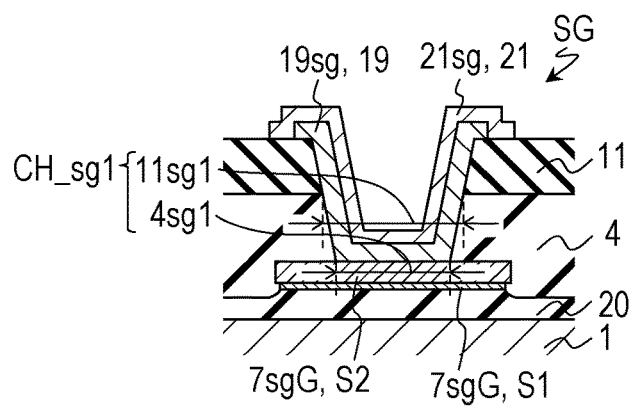
Figure 33C:
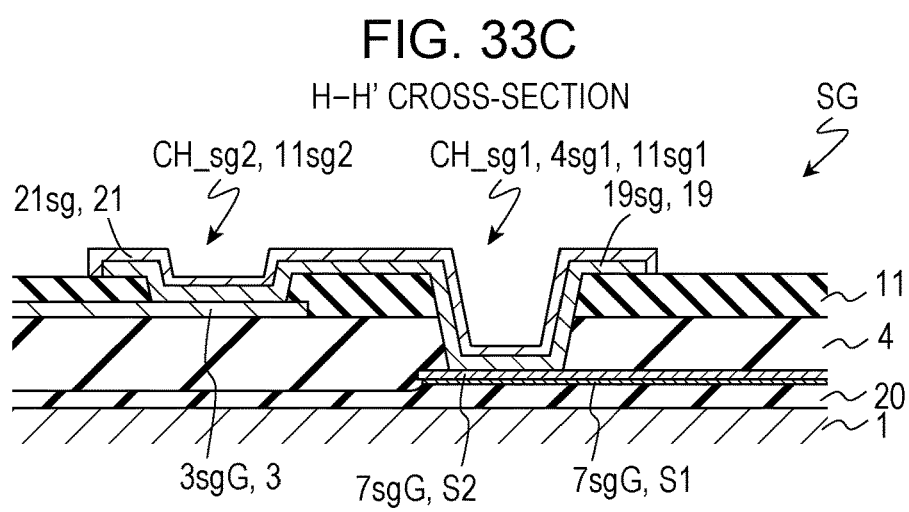

FIG. 31A is a schematic plan view of the antenna unit region U of the transmission/reception region R1 of the TFT substrate 102B, and FIG. 31B and FIG. 31C are schematic plan views of the non-transmission/reception region R2 of the TFT substrate 102B. FIG. 32A is a schematic cross-sectional view of the antenna unit region U of the TFT substrate 102B, and shows a cross-section along line A-A' in FIG. 31A. FIG. 32B shows a cross-section of the source-gate connection portion SG along line B-B' in FIG. 31B, FIG. 32C shows a cross-section of the gate terminal portion GT along line C-C' in FIG. 31B, FIG. 32D shows a cross-section of the source terminal portion ST along line D-D' in FIG. 31C, FIG. 32E shows a cross-section of the second transfer terminal portion PT2 along line E-E' in FIG. 31B, FIG. 33A shows a cross-section of the first transfer terminal portion PT1 along line F-F' in FIG. 31B, FIG. 33B shows a cross-section of the source-gate connection portion SG along line G-G' in FIG. 31B, and FIG. 33C shows a cross-section of the source-gate connection portion SG along line H-H' in FIG. 31B.

As shown in FIG. 31A and FIG. 32A, the second upper conductive layer 21cvB of the antenna unit region U of the TFT substrate 102B is formed to cover the lower source metal layer S1 and the upper source metal layer S2 of the source metal layer 7 (including the patch electrode 15) exposed in the contact hole CH_a when viewed in the direction normal to the dielectric substrate 1.

The scanning antenna having the TFT substrate 102B having such a structure is also able to obtain the same effect as that of the scanning antenna having the TFT substrate 102A.

In addition, as described below, each terminal portion of the TFT substrate 102B, the source-gate connection portion SG, and the CS-source connection portion SC also have an upper connection portion included in the second upper conductive layer 21 formed on the upper connection portion included in the first upper conductive layer 19. When each of the terminal portions also has an upper connection portion included in the second upper conductive layer 21, it is possible to effectively suppress corrosion from occurring in the lower connection portion. From the viewpoint of suppressing corrosion of the lower connection portion, it is more effective when the second upper conductive layer 21 is formed to cover the upper connection portion included in the first upper conductive layer 19 of each terminal portion of the TFT substrate 102B.

However, the non-transmission/reception region R2 of the TFT substrate 102B is not limited to the illustrated example, and may be, for example, the same as the TFT substrate 102A, may be appropriately combined with the TFT substrate 102A, or may be an arbitrary region. Each terminal portion of the TFT substrate 102A, and the upper connection portions of the source-gate connection portion SG and the CS-source connection portion SC are included in the first upper conductive layer 19, but there may be an upper connection portion included in the second upper conductive layer 21 instead.

Source-Gate Connection Portion SG

As shown in FIG. 31B, FIG. 32B, FIG. 33B, and FIG. 33C, the source-gate connection portion SG of the TFT substrate 102B is different from the source-gate connection portion SG of the TFT substrate 102A in the point of also having an upper connection portion 21sg included in the second upper conductive layer 21. The upper connection portion 21sg may be formed to cover the upper connection portion 19sg when viewed in the direction normal to the dielectric substrate 1.

Gate Terminal Portion GT

As shown in FIG. 31B and FIG. 32C, the gate terminal portion GT of the TFT substrate 102B is different from the gate terminal portion GT of the TFT substrate 102A in the point of further having an upper connection portion 21g included in the second upper conductive layer 21. The upper connection portion 21g may be formed to cover the upper connection portion 19g when viewed in the direction normal to the dielectric substrate 1.

Source Terminal Portion ST

As shown in FIG. 31C and FIG. 32D, the source terminal portion ST of the TFT substrate 102B is different from the source terminal portion ST of the TFT substrate 102A in the point of further having an upper connection portion 21s included in the second upper conductive layer 21. The upper connection portion 21s may be formed to cover the upper connection portion 19s when viewed in the direction normal to the dielectric substrate 1.

CS Terminal Portion CT and CS-Source Connection Portion SC

As shown in FIG. 31B, the CS terminal portion CT of the TFT substrate 102B is different from the CS terminal portion CT of the TFT substrate 102A in the point of further having an upper connection portion 21c included in the second upper conductive layer 21. The upper connection portion 21c may be formed to cover the upper connection portion 19c when viewed in the direction normal to the dielectric substrate 1.

In addition, as shown in FIG. 31B, the CS-source connection portion SC of the TFT substrate 102B is different from the CS-source connection portion SC of the TFT substrate 102A in the point of further having an upper connection portion 21sc included in the second upper conductive layer 21. The upper connection portion 21sc may be formed to cover the upper connection portion 19sc when viewed in the direction normal to the dielectric substrate 1.

Transfer Terminal Portion PT

As shown in FIG. 31B and FIG. 33A, the first transfer terminal portion PT1 of the TFT substrate 102B is different from the first transfer terminal portion PT1 of the TFT substrate 102A in the point of further having an upper connection portion 21p1 included in the second upper conductive layer 21. The upper connection portion 21p1 may be formed to cover the upper connection portion 19p1 when viewed in the direction normal to the dielectric substrate 1. In such a case, the upper connection portion 21p1 is connected to the transfer terminal connection portion on the slot substrate side, for example, by a sealing material including conductive particles.

As shown in FIG. 32E, the second transfer terminal portion PT2 of the TFT substrate 102B is different from the second transfer terminal portion PT2 of the TFT substrate 102A in the point of also having an upper connection portion 21p2 included in the second upper conductive layer 21. The upper connection portion 21p2 may be formed to cover the upper connection portion 19p2 when viewed in the direction normal to the dielectric substrate 1.

It is possible to manufacture the TFT substrate 102B by changing the patterning shape of the first upper conductive film 19' and the second upper conductive film 21' from that of the method of manufacturing the TFT substrate 102A. That is, when the first upper conductive layer 19 is viewed in the direction normal to the dielectric substrate 1, it is sufficient if the first upper conductive layer 19 is formed to cover the lower source metal layer S1 and the upper source metal layer S2 of the source metal layer 7 (including the patch electrode 15) exposed in the contact hole CH_a, and when the second upper conductive layer 21 is viewed in the direction normal to the dielectric substrate 1, it is sufficient if the second upper conductive layer 21 is formed to cover the edge of the lower source metal layer S1 and the edge of the upper source metal layer S2 of the source metal layer 7 (including the patch electrode 15) exposed in the contact hole CH_a. In addition, it is sufficient if the second upper conductive layer 21 is formed such that the second upper conductive layer 21 covers the upper connection portion included in the first upper conductive layer 19 of each terminal portion and the source-gate connection portion SG of the non-transmission/reception region R2.

The method of manufacturing the TFT substrate of the present embodiment is not limited to the examples described above. For example, the first upper conductive layer 19 and the second upper conductive layer 21 are preferably formed such that the first upper conductive layer 19 and/or the second upper conductive layer 21 cover the lower source metal layer S1 and the upper source metal layer S2 (including the patch electrode 15) exposed in the contact hole CH_a.

Examples of Antenna Unit Arrangement and Gate Bus Line and Source Bus Line Connection In the scanning antenna according to the embodiment of the present disclosure, the antenna units are arranged, for example, in a concentric circle shape.

For example, in a case of being arranged in m concentric circles, one gate bus line is provided for each circle, for example, and a total of m gate bus lines are provided. For example, when the outer diameter of the transmission/reception region R1 is set as 800 mm, m is 200, for example. When the innermost gate bus line is the first line, n (for example, 30) antenna units are connected to the first gate bus line and nx (for example, 620) antenna units are connected to the m-th gate bus line.

In such an arrangement, the number of antenna units connected to each gate bus line is different. In addition, among the nx source bus lines connected to the nx antenna units forming the outermost circle, m antenna units are connected to the n source bus lines also connected to the antenna unit forming the innermost circle, but the number of antenna units connected to the other source bus lines is smaller than m.

As described above, the arrangement of antenna units in the scanning antenna is different from the arrangement of pixels (dots) in the LCD panel, and the number of connected antenna units is different according to the gate bus lines and/or the source bus lines. Accordingly, when the capacitances (liquid crystal capacities+auxiliary capacitances) of all the antenna units are set to be the same, the connected electrical loads are different depending on the gate bus lines and/or the source bus lines. In this manner, there is a problem that variations occur in the writing of the voltage to the antenna units.

Therefore, in order to avoid the above, for example, the electrical loads connected to each gate bus line and each source bus line are preferably made substantially equal by adjusting the capacitance value of the auxiliary capacitance or by adjusting the number of antenna units connected to the gate bus lines and/or the source bus lines.

The scanning antenna according to the embodiment of the present disclosure is accommodated in a housing made of plastic, for example, as appropriate. It is preferable to use a housing material having a small dielectric constant $\varepsilon M$ which does not influence microwave transmission/reception. In addition, a through hole may be provided in a portion corresponding to the transmission/reception region R1 of the housing. Furthermore, a light shielding structure may be provided so that the liquid crystal material is not exposed to light. The light shielding structure, for example, is provided to block light which propagates from the side surface of the dielectric substrate 1 of the TFT substrate 101A and/or the dielectric substrate 51 of the slot substrate 201 to the inside of the dielectric substrate 1 and/or the dielectric substrate 51 to be incident on the liquid crystal layer. Some liquid crystal materials having a large dielectric anisotropy $\delta \varepsilon M$ are easily affected by photodegradation and it is preferable to block not only ultraviolet rays but also short-wavelength blue light in visible light. For example, using a light-shielding tape such as a black adhesive tape makes it possible to easily form the light shielding structure in an arbitrary portion.

Embodiments according to the present disclosure are used for, for example, a scanning antenna for satellite communication or satellite broadcasting to be mounted on a moving body (for example, a ship, an airplane, or an automobile) and the manufacturing thereof.

The present disclosure contains subject matter related to that disclosed in Japanese Priority Patent Application JP 2018-013951 filed in the Japan Patent Office on Jan. 30, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A TFT substrate including a dielectric substrate and a plurality of antenna unit regions arranged on the dielectric substrate and each having a TFT and a patch electrode electrically connected to a drain electrode of the TFT, the TFT substrate comprising:
    a semiconductor layer of the TFT;
    a gate metal layer including a gate electrode of the TFT;
    a gate insulating layer formed between the gate metal layer and the semiconductor layer;
    a source metal layer formed on the semiconductor layer and including a source electrode and the drain electrode electrically connected to the semiconductor layer; and
    a contact layer including a source contact portion formed between the semiconductor layer and the source electrode and a drain contact portion formed between the semiconductor layer and the drain electrode,
    wherein the source metal layer has a laminated structure including a lower source metal layer including at least one element selected from a group consisting of Ti, Ta, and W, and an upper source metal layer formed on the lower source metal layer and including Cu or Al,
    an edge of the lower source metal layer is positioned inside an edge of the upper source metal layer when viewed in a direction normal to the dielectric substrate,
    at least a portion of the edge of the lower source metal layer in the plurality of antenna unit regions, which does not overlap the source contact portion or the drain contact portion, and a portion of the edge of the upper source metal layer in the plurality of antenna unit regions, which does not overlap the source contact portion or the drain contact portion, are covered with at least two inorganic layers, when viewed in the direction normal to the dielectric substrate, and
    a side surface of the lower source metal layer is exposed from the upper source metal layer.

2. The TFT substrate according to claim 1,
    wherein the entire edge of the lower source metal layer and the entire edge of the upper source metal layer in the plurality of antenna unit regions are covered with the at least two inorganic layers when viewed in the direction normal to the dielectric substrate.

3. The TFT substrate according to claim 1,
wherein the semiconductor layer is positioned above the gate electrode,
the TFT substrate further includes an interlayer insulating layer covering the TFT and an upper conductive layer formed on the interlayer insulating layer, and
the at least two inorganic layers include the interlayer insulating layer and the upper conductive layer.

4. The TFT substrate according to claim 3,
wherein the source metal layer further includes the patch electrode.

5. The TFT substrate according to claim 3,
wherein the upper conductive layer includes a transparent conductive layer.

6. The TFT substrate according to claim 3,
wherein the upper conductive layer includes a first layer including a transparent conductive layer and a second layer formed under the first layer and which is formed from at least one layer selected from a group consisting of a Ti layer, a MoNb layer, a MoNbNi layer, a MoW layer, a W layer, and a Ta layer.

7. The TFT substrate according to claim 3, further comprising:
a terminal portion arranged in a region other than the plurality of antenna unit regions,
wherein the terminal portion has a lower connection portion included in the gate metal layer, a contact hole formed in the gate insulating layer and the interlayer insulating layer and reaching the lower connection portion, and an upper connection portion included in the upper conductive layer and connected to the lower connection portion in the contact hole.

8. The TFT substrate according to claim 3,
wherein the upper conductive layer is formed to cover at least a portion which does not overlap the source contact portion or the drain contact portion in the edge of the lower source metal layer and the edge of the upper source metal layer in the plurality of antenna unit regions when viewed in the direction normal to the dielectric substrate.

9. The TFT substrate according to claim 3,
wherein the upper conductive layer is formed to cover the entire edge of the lower source metal layer and the entire edge of the upper source metal layer in the plurality of antenna unit regions when viewed in the direction normal to the dielectric substrate.

10. The TFT substrate according to claim 3,
wherein the upper conductive layer is formed to cover the entire lower source metal layer and the entire upper source metal layer in the plurality of antenna unit regions when viewed in the direction normal to the dielectric substrate.

11. The TFT substrate according to claim 1,
wherein the gate electrode is positioned above the source electrode and the drain electrode,
the TFT substrate further includes an interlayer insulating layer covering the TFT, a first upper conductive layer formed on the interlayer insulating layer, and a second upper conductive layer formed on the first upper conductive layer, and
the at least two inorganic layers include any one of the gate insulating layer, the interlayer insulating layer, the first upper conductive layer, and the second upper conductive layer.

12. The TFT substrate according to claim 11,
wherein the source metal layer further includes the patch electrode.

13. The TFT substrate according to claim 12,
wherein the edge of the lower source metal layer of the patch electrode and the edge of the upper source metal layer of the patch electrode are covered with the first upper conductive layer and the second upper conductive layer when viewed in the direction normal to the dielectric substrate.

14. The TFT substrate according to claim 12,
wherein a first contact hole reaching the patch electrode is formed in the gate insulating layer and the interlayer insulating layer, and
the first upper conductive layer and/or the second upper conductive layer cover the patch electrode exposed in the first contact hole.

15. The TFT substrate according to claim 11,
wherein the first upper conductive layer and the second upper conductive layer each include a transparent conductive layer.

16. The TFT substrate according to claim 11,
wherein the second upper conductive layer includes a first layer including a transparent conductive layer and a second layer formed under the first layer and which is formed from at least one layer selected from a group consisting of a Ti layer, a MoNb layer, a MoNbNi layer, a MoW layer, a W layer, and a Ta layer.

17. The TFT substrate according to claim 11, further comprising:
a terminal portion arranged in a region other than the plurality of antenna unit regions,
wherein the terminal portion has a lower connection portion included in the source metal layer, a second contact hole formed in the gate insulating layer and the interlayer insulating layer and reaching the lower connection portion, and an upper connection portion included in the first upper conductive layer and/or the second upper conductive layer and connected to the lower connection portion in the second contact hole.

18. A scanning antenna comprising:
the TFT substrate according to claim 1;
a slot substrate arranged to face the TFT substrate;
a liquid crystal layer provided between the TFT substrate and the slot substrate; and
a reflective conductive plate arranged to face a surface of the slot substrate on an opposite side to the liquid crystal layer with a dielectric layer interposed therebetween,
wherein the slot substrate has another dielectric substrate, and a slot electrode formed on a surface of the other dielectric substrate on a side of the liquid crystal layer, and
the slot electrode has a plurality of slots, and each of the plurality of slots is arranged to correspond to the patch electrode in each of the plurality of antenna unit regions of the TFT substrate.

19. A method of manufacturing a TFT substrate including a dielectric substrate and a plurality of antenna unit regions arranged on the dielectric substrate and each having a TFT and a patch electrode electrically connected to a drain electrode of the TFT, in which a source electrode and the drain electrode of the TFT and the patch electrode each include a lower source metal layer including at least one element selected from a group consisting of Ti, Ta, and W, and an upper source metal layer formed on the lower source metal layer and including Cu or Al, the method comprising:
(A) forming a semiconductor layer of the TFT and a contact portion in contact with an upper surface of the semiconductor layer on the dielectric substrate;

(B) forming a lower conductive film including at least one element selected from a group consisting of Ti, Ta, and W on the contact portion;

(C) forming an upper conductive film including Cu or Al on the lower conductive film;

(D) forming a resist layer on the upper conductive film;

(E) forming the upper source metal layer by etching the upper conductive film with the resist layer as an etching mask;

(F) forming the lower source metal layer by etching the lower conductive film with the resist layer as an etching mask;

(G) forming a source contact portion connecting the semiconductor layer and the source electrode and a drain contact portion connecting the semiconductor layer and the drain electrode, by dry etching the contact portion with the resist layer as an etching mask;

(H) forming a gate insulating film on the source electrode and the drain electrode;

(I) forming, on the gate insulating film, a gate electrode of the TFT overlapping the semiconductor layer with the gate insulating film interposed therebetween;

(J) forming an interlayer insulating film covering the TFT on the gate electrode;

(K) forming a gate insulating layer and an interlayer insulating layer by forming a contact hole reaching the patch electrode in the gate insulating film and the interlayer insulating film;

(L) forming a first upper conductive film on the interlayer insulating layer;

(M) forming a first upper conductive layer on the interlayer insulating layer by patterning the first upper conductive film;

(N) forming a second upper conductive film on the first upper conductive layer; and (O) forming a second upper conductive layer on the first upper conductive layer by patterning the second upper conductive film, wherein (M) includes forming the first upper conductive layer such that the first upper conductive layer covers an edge of the lower source metal layer and an edge of the upper source metal layer of the patch electrode when viewed in a direction normal to the dielectric substrate, and (O) includes forming the second upper conductive layer such that the second upper conductive layer covers an edge of the lower source metal layer and an edge of the upper source metal layer of the patch electrode when viewed in the direction normal to the dielectric substrate.

* * * * *